US010852637B2

(12) United States Patent
Inoue et al.

(10) Patent No.: US 10,852,637 B2
(45) Date of Patent: Dec. 1, 2020

(54) PATTERN FORMING METHOD, RESIST PATTERN, METHOD FOR MANUFACTURING ELECTRONIC DEVICE, AND COMPOSITION FOR FORMING UPPER LAYER FILM

(71) Applicant: FUJIFILM Corporation, Tokyo (JP)

(72) Inventors: Naoki Inoue, Shizuoka (JP); Naohiro Tango, Shizuoka (JP); Kei Yamamoto, Shizuoka (JP); Michihiro Shirakawa, Shizuoka (JP); Akiyoshi Goto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 255 days.

(21) Appl. No.: 15/823,593

(22) Filed: Nov. 28, 2017

(65) Prior Publication Data
US 2018/0081277 A1   Mar. 22, 2018

Related U.S. Application Data

(63) Continuation of application No. PCT/JP2016/064742, filed on May 18, 2016.

(30) Foreign Application Priority Data

May 29, 2015   (JP) ................. 2015-110362

(51) Int. Cl.
G03F 7/32   (2006.01)
G03F 7/11   (2006.01)
G03F 7/09   (2006.01)

(52) U.S. Cl.
CPC .......... *G03F 7/32* (2013.01); *G03F 7/11* (2013.01); *G03F 7/325* (2013.01); *G03F 7/091* (2013.01)

(58) Field of Classification Search
CPC ... G03F 7/32; G03F 7/11; G03F 7/325; G03F 7/091
See application file for complete search history.

(56) References Cited

U.S. PATENT DOCUMENTS

| | | | |
|---|---|---|---|
| 9,250,532 B2 | 2/2016 | Kato et al. | |
| 2007/0212646 A1 | 9/2007 | Gallagher et al. | |
| 2008/0090179 A1* | 4/2008 | Takeda et al. | G03F 7/0397 430/286.1 |
| 2009/0042147 A1 | 2/2009 | Tsubaki | |
| 2009/0233224 A1 | 9/2009 | Gallagher et al. | |
| 2011/0020755 A1 | 1/2011 | Tsubaki | |
| 2012/0088194 A1 | 4/2012 | Tsubaki | |
| 2012/0183751 A1 | 7/2012 | Katayama et al. | |
| 2012/0301197 A1* | 11/2012 | Ziegelmuller et al. | G03G 15/75 399/350 |
| 2013/0244180 A1 | 9/2013 | Bae et al. | |
| 2013/0244438 A1 | 9/2013 | Bae et al. | |
| 2014/0080068 A1 | 3/2014 | Tsubaki | |
| 2014/0113223 A1 | 4/2014 | Kato et al. | |
| 2014/0212816 A1 | 7/2014 | Bae et al. | |
| 2014/0234761 A1 | 8/2014 | Shirakawa et al. | |
| 2014/0308605 A1 | 10/2014 | Ito et al. | |
| 2014/0349225 A1 | 11/2014 | Yamamoto et al. | |
| 2015/0044616 A1 | 2/2015 | Tsubaki | |
| 2015/0159038 A1 | 6/2015 | Bae et al. | |
| 2015/0185615 A1 | 7/2015 | Park et al. | |
| 2015/0248054 A1 | 9/2015 | Matsuda | |
| 2015/0248056 A1 | 9/2015 | Shirakawa et al. | |
| 2016/0009936 A1 | 1/2016 | Tsubaki | |
| 2016/0041467 A1 | 2/2016 | Bae et al. | |
| 2016/0137874 A1 | 5/2016 | Bae et al. | |
| 2016/0216607 A1 | 7/2016 | Sato | |
| 2017/0184970 A1 | 6/2017 | Goto et al. | |

FOREIGN PATENT DOCUMENTS

| | | |
|---|---|---|
| JP | 2007-272220 | 10/2007 |
| JP | 2008-309878 | 12/2008 |
| JP | 4590431 | 12/2010 |
| JP | 4763511 | 8/2011 |
| JP | 2013-033227 | 2/2013 |
| JP | 2013-061647 | 4/2013 |
| JP | 2013-061648 | 4/2013 |
| JP | 2013-097002 | 5/2013 |
| JP | 2013-152450 | 8/2013 |
| JP | 2013-190784 | 9/2013 |

(Continued)

OTHER PUBLICATIONS

"Office Action of Korea Counterpart Application", dated Nov. 16, 2018, with English translation thereof, p. 1-p. 8. Two pages of English translation only and 6 pages of Korean and the application was KR 10-2017-7034391 (considered as translated.
"Office Action of Taiwan Counterpart Application," with English translation thereof, dated May 29, 2019, p. 1-p. 18.
"Office Action of Japan Counterpart Application," dated Aug. 14, 2018, with English translation thereof, p. 1-p. 10.
"International Search Report (Form PCT/ISA/210) of PCT/JP2016/064742," dated Aug. 9, 2016, with English translation thereof, pp. 1-12.

(Continued)

*Primary Examiner* — Cynthia Hamilton
(74) *Attorney, Agent, or Firm* — JCIPRNET

(57) ABSTRACT

Provided are a pattern forming method including a step of applying a composition for forming an upper layer film, containing a resin having a C log P(Poly) of 3.0 or more and at least one compound selected from the group consisting of (A1) to (A4) described in the specification onto a resist film to form an upper layer film, a step of exposing the resist film, and a step of developing the exposed resist film with a developer including an organic solvent; a resist pattern formed by the pattern forming method; a method for manufacturing an electronic device, including the pattern forming method; and the composition for forming an upper layer film.

12 Claims, No Drawings

(56) References Cited

FOREIGN PATENT DOCUMENTS

| JP | 2015-129939 | 7/2015 | | |
|---|---|---|---|---|
| TW | 201303507 | 1/2013 | | |
| TW | 201426186 | 7/2014 | | |
| WO | 2011040462 | 4/2011 | | |
| WO | WO-2013002417 A1 * | 1/2013 | ........... | G03F 7/0007 |
| WO | WO-2013062066 A1 * | 5/2013 | | |
| WO | WO-2013122264 A1 * | 8/2013 | | |
| WO | WO-2014069415 A1 * | 5/2014 | | |
| WO | 2015030198 | 3/2015 | | |
| WO | 2016-052384 | 4/2016 | | |

OTHER PUBLICATIONS

"Written Opinion of the International Searching Authority (Form PCT/ISA/237) of PCT/JP2016/064742," dated Aug. 9, 2016, with English translation thereof, pp. 1-15.

"Office Action of Taiwan Counterpart Application," with English translation thereof, dated Nov. 14, 2019, p. 1-p. 21.

* cited by examiner

PATTERN FORMING METHOD, RESIST PATTERN, METHOD FOR MANUFACTURING ELECTRONIC DEVICE, AND COMPOSITION FOR FORMING UPPER LAYER FILM

CROSS REFERENCE TO TO RELATED APPLICATIONS

This is a continuation of International Application No. PCT/JP2016/064742 filed on May 18, 2016, and claims priority from Japanese Patent Application No. 2015-110362 filed on May 29, 2015, the entire disclosures of which are incorporated herein by reference.

BACKGROUND OF THE INVENTION

1. Field of the Invention

The present invention relates to a pattern forming method, a resist pattern formed by the pattern forming method, a method for manufacturing an electronic device, including the pattern forming method, an electronic device manufactured by the method for manufacturing an electronic device, and a composition for forming an upper layer film.

More specifically, the present invention relates to a pattern forming method used in a process for manufacturing a semiconductor such as an integrated circuit (IC), a process for manufacturing a circuit board for a liquid crystal, a thermal head, or the like, and other lithographic processes of photofabrication, a resist pattern formed by the pattern forming method, a method for manufacturing an electronic device, including the pattern forming method, an electronic device manufactured by the method for manufacturing an electronic device, and a composition for forming an upper layer film, which can be used for the pattern forming method.

2. Description of the Related Art

In processes for manufacturing semiconductor devices such as an IC in the related art, microfabrication by lithography using various resist compositions has been carried out.

For example, JP2013-061648A describes a method for manufacturing an electronic device, including steps of applying a photoresist topcoat composition onto a photoresist layer, performing exposure, and developing the exposed film with an organic solvent developer, and also describes that the topcoat composition includes a basic quencher, a specific polymer, and an organic solvent.

Furthermore, JP4590431B describes a pattern forming method, in which a resist composition for negative tone development is applied to form a resist film, a protecting film is formed on the resist film, using a protecting film composition, and exposure and development are performed.

In addition, JP4763511B describes a pattern forming method, in which a photoresist film is formed on a substrate, a resist-protecting film containing a specific polymer compound is formed on the photoresist film, and exposure and development are performed.

SUMMARY OF THE INVENTION

However, in the pattern forming method described in the above literature, there has been a room for further modifications to accomplish all performance of a depth of focus (DOF), an exposure latitude (EL), and critical dimension (CDU) uniformity to an additional higher level.

That is, in order to realize good exposure, it is preferable to increase a depth of focus, and even with an exposure dose smaller than an appropriate one for a photosensitive material or an exposure dose larger than an appropriate one for the photosensitive material, a change in performance is small, and thus, a wide exposure latitude is preferable in order to obtain easy handling. However, both the depth of focus and the exposure latitude can be improved in the trade-off relationship of the both, and thus, there has been a room for additional development of a method for forming a pattern having excellent CDU uniformity.

The present invention has been made taking consideration of the above aspects, and thus, it has objects to provide a pattern forming method excellent in all performance of CDU uniformity, DOF, and EL, particularly in the formation of an ultrafine pattern (for example, a pattern with a hole diameter of 50 nm or less), a resist pattern formed by the pattern forming method, a method for manufacturing an electronic device, including the pattern forming method, an electronic device manufactured by the method for manufacturing an electronic device, and a composition for forming an upper layer film, which can be used for the pattern forming method.

The present inventors have found that the objects are accomplished by adopting the following means.

[1] A pattern forming method comprising:

(a) a step of forming a resist film on a substrate;

(b) a step of applying a composition for forming an upper layer film onto the resist film to form an upper layer film;

(c) a step of exposing the resist film; and (d) a step of developing the exposed resist film with a developer including an organic solvent, in which the composition for forming an upper layer film contains a resin having a C log P(Poly) of 3.0 or more and at least one compound selected from the group consisting of (A1) to (A4) below:

(A1) a basic compound or a base generator, (A2) a compound containing a bond or group selected from the group consisting of an ether bond, a thioether bond, a hydroxyl group, a thiol group, a carbonyl bond, and an ester bond, (A3) an ionic compound, and (A4) a compound having a radical trapping group.

[2] The pattern forming method as described in [1], in which the C log P(Poly) of the resin contained in the composition for forming an upper layer film is 3.8 or more.

[3] The pattern forming method as described in [1] or [2], in which the C log P(Poly) of the resin contained in the composition for forming an upper layer film is 4.0 or more.

[4] The pattern forming method as described in any one of [1] to [3], in which the step (b) includes heating the composition for forming an upper layer film applied onto the resist film at 100° C. or higher.

[5] The pattern forming method as described in any one of [1] to [4], in which the resin having a C log P(Poly) of 3.0 or more contains a repeating unit obtained by the polymerization of monomers represented by General Formula (2).

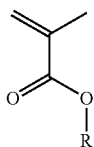

General Formula (2)

In General Formula (2), R represents an alkyl group having 5 to 20 carbon atoms, a cycloalkyl group having 5 to 20 carbon atoms, or an aryl group.

[6] The pattern forming method as described in any one of [1] to [5], in which the resin having a C log P(Poly) of 3.0 or more contains at least one repeating unit having 4 methyl groups.

[7] The pattern forming method as described in any one of [1] to [6], in which the molecular weight of at least one compound selected from the group consisting of (A1) to (A4) above is 100 to 3,000.

[8] A resist pattern formed by the pattern forming method as described in any one of [1] to [7].

[9] A method for manufacturing an electronic device, comprising the pattern forming method as described in any one of [1] to [7].

[10] An electronic device manufactured by the method for manufacturing an electronic device as described in [9].

[11] A composition for forming an upper layer film, used for forming an upper layer film on a resist film, in which the composition for forming an upper layer film contains a resin having a C log P(Poly) of 3.0 or more and at least one compound selected from the group consisting of (A1) to (A4) below:

(A1) a basic compound or a base generator, (A2) a compound containing a bond or group selected from the group consisting of an ether bond, a thioether bond, a hydroxyl group, a thiol group, a carbonyl bond, and an ester bond, (A3) an ionic compound, and (A4) a compound having a radical trapping group.

According to the present invention, it is possible to provide a pattern forming method excellent in all performance of CDU uniformity, DOF, and EL, particularly in the formation of an ultrafine pattern (for example, a pattern with a hole diameter of 50 nm or less), a resist pattern formed by the pattern forming method, a method for manufacturing an electronic device, including the pattern forming method, an electronic device manufactured by the method for manufacturing an electronic device, and a composition for forming an upper layer film, which can be used for the pattern forming method.

DESCRIPTION OF THE PREFERRED EMBODIMENTS

Hereinafter, aspects for carrying out the present invention will be described.

Moreover, in citations for a group (atomic group) in the present specification, in a case where the group is denoted without specifying whether it is substituted or unsubstituted, the group includes both a group not having a substituent and a group having a substituent. For example, an "alkyl group" includes not only an alkyl group not having a substituent (unsubstituted alkyl group), but also an alkyl group having a substituent (substituted alkyl group).

"Actinic rays" or "radiation" in the present specification means, for example, a bright line spectrum of a mercury lamp, far ultraviolet rays represented by an excimer laser, extreme ultraviolet rays (EUV light), X-rays, electron beams, or the like. In addition, in the present invention, light means actinic rays or radiation. Furthermore, unless otherwise specified, "exposure" in the present specification includes not only exposure by a bright line spectrum of a mercury lamp, far ultraviolet rays represented by an excimer laser, X-rays, EUV light, or the like, but also writing by particle rays such as electron beams and ion beams.

[Pattern Forming Method]

The pattern forming method of the present invention is a pattern forming method including:

(a) a step of forming a resist film on a substrate, (b) a step of applying a composition for forming an upper layer film onto the resist film to form an upper layer film, (c) a step of exposing the resist film, and (d) a step of developing the exposed resist film with a developer including an organic solvent, in which the composition for forming an upper layer film contains a resin having a C log P(Poly) of 3.0 or more and at least one compound selected from the group consisting of (A1) to (A4) below:

(A1) a basic compound or a base generator, (A2) a compound containing a bond or group selected from the group consisting of an ether bond, a thioether bond, a hydroxyl group, a thiol group, a carbonyl bond, and an ester bond, (A3) an ionic compound, and (A4) a compound having a radical trapping group.

The reason why EL can be improved by the pattern forming method of the present invention is not clear, but is presumed as follows.

By exposing the resist film and performing post exposure bake (PEB), a deprotection reaction proceeds with the polymer in the resist film, thereby generating deprotected products. Usually, the deprotected products immediately volatilize, but it is considered that in a case where a hydrophobic polymer is used in the upper layer film, the volatilization of the deprotected products is suppressed by hydrophobic interaction with hydrophobic deprotected products. As a result, it is considered that the deprotected products remaining in the resist film increase the solubility of the resist film in a developer, and thus, the pseudo-optical contrast becomes high, leading to an enhancement in EL.

Furthermore, a reason why the pattern forming method of the present invention can improve DOF is not completely clear, but is presumed as follows.

It is considered that since the (A1) to (A4) compounds have a strong interaction with a quencher such as a low molecular compound (for example, a basic compound) which is typically contained in the resist film, an upper layer film containing at least one compound of (A1) to (A4) is formed on the resist film, and thus, the quencher is likely to move to the upper layer film. It is considered that since the amount of the components that neutralize an acid decreases as the amount of the quencher decreases, particularly in the boundary area between exposed areas and unexposed areas, the acid is likely to move, and as a result, DOF can be enhanced.

Hereinafter, the pattern forming method of the present invention will be first described, and then a resist film and an upper layer film (hereinafter also referred to as a "topcoat") formed in the pattern forming method of the present invention will be described.

<Step (a)>

In the step (a), a composition (hereinafter also referred to as a "resist composition") for forming a resist film (actinic ray-sensitive or radiation-sensitive film) is preferably applied onto a substrate to form a resist film. The application method is not particularly limited, and a spin coating method, a spray method, a roll coating method, a dip method, or the like, which is known in the related art, can be used, with the spin coating method being preferable.

After applying the resist composition, the substrate may be heated (prebaked), as desired. Thus, a film from which insoluble residual solvents have been removed can be uniformly formed. The temperature for prebaking is not particularly limited, but is preferably 50° C. to 160° C., and more preferably 60° C. to 140° C.

The substrate on which the resist film is formed is not particularly limited, and it is possible to use a substrate generally used in a process for manufacturing a semiconductor such as an IC, a process for manufacturing a circuit board for a liquid crystal, a thermal head, or the like, and other lithographic processes of photofabrication, and examples thereof include inorganic substrates such as silicon, $SiO_2$, and SiN, and coating type inorganic substrates such as SOG.

Prior to forming the resist film, an antireflection film may be applied onto the substrate in advance.

As the antireflection film, any type of an inorganic film type such as titanium, titanium dioxide, titanium nitride, chromium oxide, carbon, and amorphous silicon, and an organic film type formed of a light absorber and a polymer material can be used. In addition, as the organic antireflection film, a commercially available organic antireflection film such as DUV-30 series and DUV-40 series manufactured by Brewer Science, Inc., AR-2, AR-3, or AR-5 manufactured by Shipley Company, L.L.C., or ARC series such as ARC29A manufactured by Nissan Chemical Industries, Ltd. can also be used.

<Step (b)>

In the step (b), a composition for forming an upper layer film (also referred to as a "topcoat composition") is applied onto the resist film formed in the step (a), and then heated (prebaked (PB)), as desired, thereby forming an upper layer film (also referred to as a "topcoat") on the resist film.

For the reason that the effect of the present invention is more excellent, the temperature for prebaking in the step (b) (hereinafter also referred to as a "PB temperature") is preferably 90° C. or higher, more preferably 100° C. or higher, still more preferably 110° C. or higher, and most preferably 120° C. or higher.

The upper limit value of the PB temperature is not particularly limited, but may be, for example, 150° C. or lower, and preferably 140° C. or lower.

In a case where the exposure of the step (c) which will be described later is liquid immersion exposure, the topcoat is arranged between the resist film and the immersion liquid, and the resist film functions as a layer which is not brought into direct contact with the immersion liquid. In this case, preferred characteristics required for the topcoat (topcoat composition) are coating suitability onto the resist film, radiation, transparency, particularly to light at 193 nm, and poor solubility in an immersion liquid (preferably water). Further, it is preferable that the topcoat is not mixed with the resist film, and can be uniformly applied onto the surface of the resist film.

Moreover, in order to uniformly apply the topcoat composition onto the surface of the resist film while not dissolving the resist film, it is preferable that the topcoat composition contains a solvent in which the resist film is not dissolved. It is more preferable that as the solvent in which the resist film is not dissolved, a solvent of components other than an organic developer which will be described later. A method for applying the topcoat composition is not particularly limited, and a spin coating method, a spray method, a roll coating method, a dip method, or the like known in the related art can be used.

The components included in the topcoat composition will be described later.

The film thickness of the topcoat is not particularly limited, but from the viewpoint of transparency to an exposure light source, the topcoat with a thickness of usually 5 nm to 300 nm, preferably 10 nm to 300 nm, more preferably 20 nm to 200 nm, and still more preferably 30 nm to 100 nm is formed.

After forming the topcoat, the substrate is heated (PB), as desired.

From the viewpoint of resolution, it is preferable that the refractive index of the topcoat is near to that of the resist film.

The topcoat is preferably insoluble in an immersion liquid, and more preferably insoluble in water.

With regard to the receding contact angle of the topcoat, the receding contact angle (23° C.) of the immersion liquid on the topcoat is preferably 50° to 100°, and more preferably 80° to 100°, from the viewpoints of immersion liquid tracking properties.

In the liquid immersion exposure, in a view that the immersion liquid needs to move on a wafer following the movement of an exposure head that is scanning the wafer at a high speed and forming an exposure pattern, the contact angle of the immersion liquid with respect to the resist film in a dynamic state is important, and in order to obtain better resist performance, the immersion liquid preferably has a receding contact angle in the above range.

In a case where the topcoat is peeled, an organic developer which will be described later may be used, and another release agent may also be used. As the release agent, a solvent hardly permeating the resist film is preferable. In a view that the peeling of the topcoat can be carried out simultaneously with the development of the resist film, the topcoat is preferably peelable with an organic developer. The organic developer used for the peeling is not particularly limited as long as it makes it possible to dissolve and remove a less exposed area of the resist film. The organic developer can be selected from developers including a polar solvent such as a ketone-based solvent, an ester-based solvent, an alcohol-based solvent, an amide-based solvent, and an ether-based solvent, and a hydrocarbon-based solvent, which will be described later. A developer including a ketone-based solvent, an ester-based solvent, an alcohol-based solvent, or an ether-based solvent is preferable, a developer including an ester-based solvent is more preferable, and a developer including butyl acetate is still more preferable.

From the viewpoint of peeling with an organic developer, the dissolution rate of the topcoat in the organic developer is preferably 1 to 300 nm/sec, and more preferably 10 to 100 nm/sec.

Here, the dissolution rate of a topcoat in the organic developer refers to a film thickness decreasing rate in a case where the topcoat is exposed to a developer after film formation, and is a rate in a case where the topcoat is immersed in a butyl acetate solution at 23° C. in the present invention.

An effect of reducing occurrence of development defects after developing a resist film is accomplished by setting the dissolution rate of a topcoat in the organic developer to 1 nm/sec or more, and preferably 10 nm/sec or more. Further, an effect that the line edge roughness of a pattern after the development of the resist film is improved is attained as an effect that the exposure unevenness during liquid immersion exposure is reduced by setting the dissolution rate to 300 nm/sec or less, and preferably 100 nm/sec.

The topcoat may also be removed using other known developers, for example, an aqueous alkali solution. Specific examples of the usable aqueous alkali solution include an aqueous tetramethylammonium hydroxide solution.

A step of applying a pre-wetting solvent onto the resist film may be included between the step (a) and the step (b). Thus, the coatability of the topcoat composition is improved, and thus, it can be accomplished to save the liquid.

The pre-wetting solvent is not particularly limited as long as it is less soluble in a resist film, but a pre-wetting solvent for a topcoat, containing at least one kind of the compound selected from an alcohol-based solvent, a fluorine-based solvent, an ether-based solvent, a hydrocarbon-based solvent, and an ester-based solvent.

From the viewpoint of coatability, the alcohol-based solvent is preferably a monohydric alcohol, and more preferably a monohydric alcohol having 4 to 8 carbon atoms. As the monohydric alcohol having 4 to 8 carbon atoms, a linear, branched, or cyclic alcohol can be used, but a linear or branched alcohol is preferable. As such an alcohol-based solvent, for example, alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; glycol ethers such as ethylene glycol monomethyl ether, propylene glycol monomethyl ether, diethylene glycol monomethyl ether, triethylene glycol monoethyl ether, and methoxymethylbutanol; or the like can be used. Among those, alcohol and glycol ether are preferable, and 1-butanol, 1-hexanol, 1-pentanol, 3-methyl-1-butanol, 4-methyl-1-pentanol, 4-methyl-2-pentanol, and propylene glycol monomethyl ether are more preferable.

Examples of the ether-based solvent include dipropyl ether, diisopropyl ether, butylmethyl ether, butylethyl ether, butylpropyl ether, dibutyl ether, diisobutyl ether, tert-butylmethyl ether, tert-butylethyl ether, tert-butylpropyl ether, di-tert-butyl ether, dipentyl ether, diisoamyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, and cyclohexyl-tert-butyl ether.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among these, a fluorinated alcohol and a fluorinated hydrocarbon-based solvent can be suitably used.

Examples of the hydrocarbon-based solvent include aromatic hydrocarbon-based solvents such as toluene, xylene, and anisole; and aliphatic hydrocarbon-based solvents such as n-heptane, n-nonane, n-octane, n-decane, 2-methylheptane, 3-methylheptane, 3,3-dimethylhexane, and 2,3,4-trimethylpentane.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate.

These solvents are used alone or as a mixture of a plurality of kinds thereof. By mixing a solvent other than the above-mentioned solvents, the solubility for the resist film, the solubility of the resin in the topcoat composition, the elution characteristics from the resist film, or the like can be appropriately adjusted.

<Step (c)>

The exposure in the step (c) can be carried out by a generally known method, and for example, a resist film having a topcoat formed thereon is irradiated with actinic rays or radiation through a predetermined mask. Here, the resist film is preferably irradiated with actinic rays or radiation through an immersion liquid, but are not limited thereto. The exposure dose can be appropriately set, but is usually 1 to 100 mJ/cm$^2$.

The wavelength of the light source used in the exposure device in the present invention is not particularly limited, but light at a wavelength of 250 nm or less is preferably used, and examples of include KrF excimer laser light (248 nm), ArF excimer laser light (193 nm), $F_2$ excimer laser light (157 nm), EUV light (13.5 nm), and electron beams. Among these, ArF excimer laser light (193 nm) is preferably used.

In a case of carrying out liquid immersion exposure, before the exposure and/or after the exposure, the surface of the film may be washed with a water-based chemical before carrying out the heating which will be described later.

The immersion liquid is preferably a liquid which is transparent to exposure wavelength and has a minimum temperature coefficient of a refractive index so as to minimize the distortion of an optical image projected on the film. In particular, in a case where the exposure light source is an ArF excimer laser light (wavelength; 193 nm), water is preferably used in terms of easy availability and easy handling, in addition to the above-mentioned viewpoints.

In a case of using water, an additive (liquid) that decreases the surface tension of water while increasing the interfacial activity may be added at a slight proportion. It is preferable that this additive does not dissolve the resist film on a substrate, and has a negligible effect on the optical coat at the undersurface of a lens element. Water to be used is preferably distilled water. Further, pure water which has been subjected to filtration through an ion exchange filter or the like may also be used. Thus, it is possible to suppress the distortion of an optical image projected on the resist film by the incorporation of impurities.

In addition, in a view of further improving the refractive index, a medium having a refractive index of 1.5 or more can also be used. This medium may be an aqueous solution or an organic solvent.

The pattern forming method of the present invention may also have the step (c) (exposing step) carried out in plural times. In a case, exposure to be carried out in plural times may use the same light source or different light sources, but for the first exposure, ArF excimer laser light (wavelength; 193 nm) is preferably used.

After the exposure, it is preferable to perform heating (also referred to as baked, PEB; Post Exposure Bake) and development (preferably further rinsing). Thus, a good pattern can be obtained. The temperature for PEB is not particularly limited as long as a good resist pattern is obtained, and is usually 40° C. to 160° C. PEB may be carried out once or plural times.

<Step (d)>

The developer used in the step (d) is a developer including an organic solvent. Here, a developing step using a developer including an organic solvent and a developing step using an alkali developer may be combined with each other, as will be described later.

Examples of the developer containing an organic solvent (also referred to as an organic developer) include developers containing a polar solvent such as a ketone-based solvent, an ester-based solvent, an alcohol-based solvent, an amide-based solvent, and an ether-based solvent, and a hydrocarbon-based solvent.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, propylene glycol, diethylene glycol, and triethylene glycol; and glycol ether-based solvents such as ethylene glycol monomethyl ether, propylene glycol monomethyl ether, diethylene glycol monomethyl ether, triethylene glycol monoethyl ether, and methoxymethylbutanol.

Examples of the ether-based solvent include, in addition to the glycol ether-based solvents above, dioxane, and tetrahydrofuran.

As the amide-based solvent, for example, N-methyl-2-pyrrolidone, N,N-dimethylacetamide, N,N-dimethylformamide, hexamethylphosphoric triamide, and 1,3-dimethyl-2-imidazolidinone can be used.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be mixed with a solvent other than those described above or with water, and used. However, in order to sufficiently bring out the effect of the present invention, the moisture content in the entire developer is preferably less than 10% by mass, and it is more preferable that the developer contains substantially no moisture.

That is, the amount of the organic solvent to be used with respect to the organic developer is preferably from 90% by mass to 100% by mass, and more preferably from 95% by mass to 100% by mass, with respect to the total amount of the developer.

Among these, as the organic developer, a developer containing at least one organic solvent selected from the group consisting of a ketone-based solvent, an ester-based solvent, an alcohol-based solvent, an amide-based solvent, and an ether-based solvent is preferable, a developer including a ketone-based solvent or an ester-based solvent is more preferable, and a developer including butyl acetate, butyl propionate, or 2-heptanone is still more preferable.

The vapor pressure of the organic developer is preferably 5 kPa or less, more preferably 3 kPa or less, and still more preferably 2 kPa or less, at 20° C. By setting the vapor pressure of the organic developer to 5 kPa or less, evaporation of the developer on a substrate or in a development cup is suppressed, and temperature evenness within a wafer plane is improved, whereby dimensional evenness within a wafer plane is enhanced.

Specific examples of the solvent having a vapor pressure of 5 kPa or less (2 kPa or less) include the solvents described in paragraph [0165] of JP2014-71304A.

An appropriate amount of a surfactant may be added to the organic developer, as desired.

The surfactant is not particularly limited, and for example, an ionic or nonionic, fluorine- and/or silicon-based surfactant can be used. Examples of such a fluorine- and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), and U.S. Pat. Nos. 5,405,720A, 5,360,692A, 5,529,881A, 5,296,330A, 5,436,098A, 5,576,143A, 5,294,511A, and 5,824,451A, with the nonionic surfactant being preferable. The nonionic surfactant is not particularly limited, but the fluorine-based surfactant or the silicon-based surfactant is more preferably used.

The amount of the surfactant to be used is usually 0.001% to 5% by mass, preferably 0.005% to 2% by mass, and more preferably 0.01% to 0.5% by mass, with respect to the total amount of the developer.

The organic developer may also include a basic compound. Specific and preferred examples of the basic compound which can be included in the organic developer used in the present invention include those which will be described later as the basic compounds which can be included in the resist composition.

Examples of the developing method include a method in which a substrate is immersed in a tank filled with a developer for a certain period of time (a dip method), a method in which a developer is heaped up to the surface of a substrate by surface tension and developed by stopping for a certain period of time (a paddle method), a method in which developer is sprayed on the surface of a substrate (a spray method), and a method in which a developer is continuously discharged on a substrate rotated at a constant rate while scanning a developer discharging nozzle at a constant rate (a dynamic dispense method).

In addition, after the step of carrying out development using a developer including an organic solvent, a step of stopping the development while replacing the solvent with another solvent may also be included.

A washing step using a rinsing liquid may be included after the step of carrying out development using a developer including an organic solvent.

The rinsing liquid is not particularly limited as long as it does not dissolve the resist pattern, and a solution including a general organic solvent can be used. As the rinsing liquid, for example, a rinsing liquid containing at least one organic solvent selected from a hydrocarbon-based solvent, a ketone-based solvent, an ester-based solvent, an alcohol-based solvent, an amide-based solvent, and an ether-based solvent, described above as the organic solvent included in the organic developer is preferably used. More preferably, a step of carrying out washing using a rinsing liquid containing at least one organic solvent selected from a hydrocarbon-based solvent, a ketone-based solvent, an ester-based solvent, an alcohol-based solvent, and an amide-based solvent is carried out. Still more preferably, a step of carrying out washing using a rinsing liquid containing a hydrocarbon-based solvent, an alcohol-based solvent, or an ester-based solvent is carried out. Particularly preferably, a step of carrying out washing using a rinsing liquid containing a monohydric alcohol is carried out.

As the rinsing liquid containing a hydrocarbon-based solvent, a hydrocarbon compound having 6 to 30 carbon atoms is preferable, a hydrocarbon compound having 7 to 30 carbon atoms is more preferable, a hydrocarbon compound having 8 to 30 carbon atoms is still more preferable, and a hydrocarbon compound having 10 to 30 carbon atoms is particularly preferable. By using a rinsing liquid including decane and/or undecane among those, pattern collapse is suppressed.

In a case where an ester-based solvent is used as the rinsing liquid, a glycol ether-based solvent may be used, in addition to the ester-based solvent (one kind, or two or more kinds thereof). As a specific example thereof in this case, an ester-based solvent (preferably butyl acetate) may be used as a main component and a glycol ether-based solvent (preferably propylene glycol monomethyl ether (PGME)) may be used as a side component. Thus, residue defects are suppressed.

Here, examples of the monohydric alcohol used in the rinsing step include linear, branched, or cyclic monohydric alcohols, and specifically, 1-butanol, 2-butanol, 3-methyl-1-butanol, 3-methyl-2-butanol, tert-butyl alcohol, 1-pentanol, 2-pentanol, 3-methyl-2-pentanol, 4-methyl-2-pentanol, 1-hexanol, 2-hexanol, 3-hexanol, 4-methyl-2-hexanol, 5-methyl-2-hexanol, 1-heptanol, 2-heptanol, 3-heptanol, 4-methyl-2-heptanol, 5-methyl-2-heptanol, 1-octanol, 2-octanol, 3-octanol, 4-octanol, 4-methyl-2-octanol, 5-methyl-2-octanol, 6-methyl-2-octanol, 2-nonanol, 4-methyl-2-nonanol, 5-methyl-2-nonanol, 6-methyl-2-nonanol, 7-methyl-2-nonanol, 2-decanol, or the like can be used, with 1-hexanol, 2-hexanol, 1-pentanol, 3-methyl-1-butanol, or 4-methyl-2-heptanol being preferable.

Furthermore, examples of the hydrocarbon-based solvent used in the rinsing step include aromatic hydrocarbon-based solvents such as toluene and xylene; and aliphatic hydrocarbon-based solvents such as pentane, hexane, octane, decane (n-decane), and undecane.

In a case where an ester-based solvent is used as the rinsing liquid, a glycol ether-based solvent may be used, in addition to the ester-based solvent (one kind, or two or more kinds). As a specific example thereof in this case, an ester-based solvent (preferably butyl acetate) may be used as a main component, and a glycol ether-based solvent (preferably propylene glycol monomethyl ether (PGME)) may be used as a side component. Thus, residue defects are suppressed.

A plurality of the respective components may be mixed, or the components may be mixed with an organic solvent other than the above solvents, and used.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure of the rinsing liquid is preferably 0.05 to 5 kPa, more preferably 0.1 to 5 kPa, and still more preferably 0.12 to 3 kPa, at 20° C. By setting the vapor pressure of the rinsing liquid to a range from 0.05 to 5 kPa, the temperature evenness within a wafer plane is improved, and further, the dimensional evenness within a wafer plane is enhanced by inhibition of swelling due to the permeation of the rinsing liquid.

The rinsing liquid can also be used after adding an appropriate amount of a surfactant thereto.

In the rinsing step, the wafer which has been subjected to development using a developer including an organic solvent is subjected to a washing treatment using the rinsing liquid including the organic solvent. A method for the washing treatment is not particularly limited, and for example, a method in which a rinsing liquid is continuously discharged on a substrate rotated at a constant rate (a spin coating method), a method in which a substrate is immersed in a tank filled with a rinsing liquid for a certain period of time (a dip method), a method in which a rinsing liquid is sprayed onto a substrate surface (a spray method), or the like, can be applied. Among these, a method in which a washing treatment is carried out using the spin coating method, and a substrate is rotated at a rotation speed of 2,000 rpm to 4,000 rpm after washing, and then the rinsing liquid is removed from the substrate, is preferable. Further, it is preferable that a heating step (PostBake) is included after the rinsing step. The residual developer and the rinsing liquid between and inside the patterns are removed by the baking. The heating step after the rinsing step is carried out at typically 40° C. to 160° C., and preferably at 70° C. to 95° C., and typically for 10 seconds to 3 minutes, and preferably for 30 seconds to 90 seconds.

Moreover, in the pattern forming method of the present invention, development using an alkali developer may also be carried out after the development using an organic developer. A portion having weak exposure intensity is removed by development using an organic solvent, and a portion having strong exposure intensity is also removed by carrying out development using an alkali developer. Since pattern formation is carried out without dissolving only a region having intermediate exposure intensity by a multiple development process in which such development is carried out plural times in this manner, a finer pattern than usual can be formed (the same mechanism as that in paragraph [0077] of JP2008-292975A).

As the alkali developer, quaternary ammonium salts, typically such as tetramethylammonium hydroxide, is used, and in addition to this, aqueous alkali solutions of inorganic alkalis, primary to tertiary amines, alcohol amines, cyclic amines, or the like can also be used. In addition, an appropriate amount of alcohols or a surfactant may also be added to the alkali developer. The alkali concentration of the alkali developer is usually 0.1% to 20% by mass. The pH of the alkali developer is usually 10.0 to 15.0.

The time for carrying out development using an alkali developer is usually 10 to 300 seconds.

The alkali concentration (and the pH) of the alkali developer and the developing time can be appropriately adjusted depending on the patterns formed.

Washing may be carried out using a rinsing liquid after the development using an alkali developer, and as the rinsing liquid, pure water is used, or an appropriate amount of a surfactant may be added thereto before the use.

Furthermore, after the developing treatment or the rinsing treatment, a treatment for removing the developer or rinsing liquid adhering on the pattern by a supercritical fluid may be carried out.

In addition, a heating treatment can be carried out in order to remove the moisture remaining in the pattern after the rinsing treatment or the treatment using a supercritical fluid.

It is preferable that various materials (for example, a resist composition, a resist solvent, a developer, a rinsing liquid, a composition for forming an antireflection film, and a composition for forming a topcoat) used in the pattern forming method of the present invention include no impurities such as a metal. The content of the impurities included in these materials is preferably 1 ppm or less, more preferably 10 ppb or less, still more preferably 100 ppt or less, and particularly preferably 10 ppt or less, and most preferably, impurities are substantially not contained (no higher than the detection limit of a measurement apparatus).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. The filter which has been washed with an organic solvent in advance may be used. In the step of filtration using a filter, a plurality of kinds of filters may be connected in series or in parallel, and used. In a case of using a plurality of kinds of filters, a combination of filters having different pore diameters and/or materials may also be used. In addition, various materials may be filtered plural times, and a step of filtering plural times may be a circulatory filtration step.

Moreover, examples of the method for reducing the impurities such as metals included in the various materials include a method of selecting raw materials having a small content of metals as raw materials constituting various materials, a method of subjecting raw materials constituting various materials to filtration using a filter, and a method of performing distillation under the condition for suppressing the contamination as much as possible by, for example, lining the inside of a device with TEFLON. The preferred conditions for filtration using a filter, which is carried out for raw materials constituting various materials, are the same as described above.

In addition to the filtration using a filter, removal of impurities by an adsorbing material may also be carried out, or a combination of filtration using a filter and an adsorbing material may also be used. As the adsorbing material, known adsorbing materials may be used, and for example, inorganic adsorbing materials such as silica gel and zeolite, and organic adsorbing materials such as activated carbon can be used.

Furthermore, a mold for imprints may be manufactured using the resist composition, and with regard to the details thereof, refer to JP4109085B and JP2008-162101A, for example.

The pattern forming method of the present invention can also be used in formation of a guide pattern (see, for example, ACS Nano Vol. 4, No. 8, Pages 4815 to 4823) in a directed self-assembly (DSA).

In addition, the resist pattern formed by the method can be used as a core material (core) in the spacer process disclosed in, for example, JP1991-270227A (JP-H03-270227A) and JP2013-164509A.

A method for improving the surface roughness of the pattern may also be applied to the pattern formed by the method of the present invention. Examples of the method for improving the surface roughness of the pattern include a method for treating a resist pattern by plasma of a hydrogen-containing gas disclosed in WO2014/002808A1. In addition, known methods as described in JP2004-235468A, US2010/0020297A, JP2009-19969A, Proc. of SPIE Vol. 8328 83280N-1 "EUV Resist Curing Technique for LWR Reduction and Etch Selectivity Enhancement" can also be applied.

[Resist Composition]

Next, the resist composition for use in the pattern forming method of the present invention will be described.

The resist composition in the present invention is preferably for ArF exposure, and more preferably for ArF liquid immersion exposure.

The resist composition in the present invention may be either a negative tone resist composition for organic solvent development or a positive tone resist composition for alkali development, but is preferably a negative tone resist composition for organic solvent development. Further, the resist composition in the present invention is typically a chemical amplification type resist composition.

(A) Resin

The resist composition typically contains a resin whose solubility in a developer including an organic solvent decreases due to an increase in the polarity by the action of an acid.

The resin (hereinafter also referred to as a "resin (A)") whose solubility in a developer including an organic solvent decreases due to an increase in the polarity by the action of an acid is preferably a resin (hereinafter also referred to as an "acid-decomposable resin" or an "acid-decomposable resin (A)") having a group (hereinafter also referred to as an "acid-decomposable group") capable of decomposing by the action of an acid to generate an alkali-soluble group at either the main chain or the side chain of the resin, or at both the main chain and the side chain.

In addition, the resin (A) is more preferably a resin having an alicyclic hydrocarbon structure which is monocyclic or polycyclic (hereinafter also referred to as an "alicyclic hydrocarbon-based acid-decomposable resin"). It is thought that the resin having an alicyclic hydrocarbon structure which is monocyclic or polycyclic has high hydrophobicity and has improved developability in a case of developing an area of the resist film having a weak light irradiation intensity by an organic developer.

The resist composition containing the resin (A) can be suitably used in a case of irradiation with ArF excimer laser light.

Examples of the alkali-soluble group include a group having a phenolic hydroxyl group, a carboxylic acid group, a fluorinated alcohol group, a sulfonic acid group, a sulfonamido group, a sulfonylimido group, an (alkylsulfonyl)

(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the alkali-soluble group include a carboxylic acid group, a fluorinated alcohol group (preferably hexafluoroisopropanol), and a sulfonic acid group.

A preferred group capable of decomposing by an acid (acid-decomposable group) is a group obtained by substituting a hydrogen atom of these alkali-soluble groups with a group capable of leaving with an acid.

Examples of the group that leaves by an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the acid-decomposable group, a cumyl ester group, an enol ester group, an acetal ester group, a tertiary alkyl ester group, and the like are preferable, and a tertiary alkyl ester group is more preferable.

The resin (A) is preferably a resin containing at least one selected from the group consisting of repeating units having partial structures represented by General Formulae (pI) to (pV), and a repeating unit represented by General Formula (II-AB).

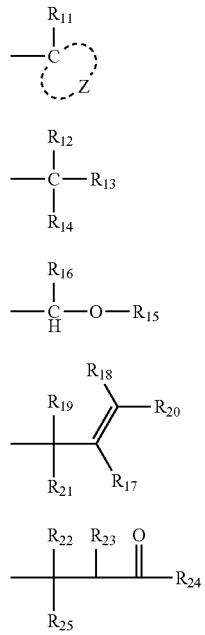

(pI)

(pII)

(pIII)

(pIV)

(pV)

In General Formulae (pI) to (pV), $R_{11}$ represents a methyl group, an ethyl group, an n-propyl group, an isopropyl group, an n-butyl group, an isobutyl group, or a sec-butyl group, and Z represents an atomic group which is necessary for forming a cycloalkyl group together with carbon atoms.

$R_{12}$ to $R_{16}$ each independently represent a linear or branched alkyl group or cycloalkyl group having 1 to 4 carbon atoms, provided that at least one of $R_{12}$, ..., or $R_{14}$, or any one of $R_{15}$ and $R_{16}$ is a cycloalkyl group.

$R_{17}$ to $R_{21}$ each independently represent a hydrogen atom, or a linear or branched alkyl group or cycloalkyl group having 1 to 4 carbon atoms, provided that at least one of $R_{17}$, ..., or $R_{21}$ is a cycloalkyl group. Further, any one of $R_{19}$ and $R_{21}$ is a linear or branched alkyl group or cycloalkyl group, having 1 to 4 carbon atoms.

$R_{22}$ to $R_{25}$ each independently represent a hydrogen atom, or a linear or branched alkyl group or cycloalkyl group having 1 to 4 carbon atoms, provided that at least one of $R_{22}$, ..., or $R_{25}$ represents a cycloalkyl group. Further, $R_{23}$ and $R_{24}$ may be bonded to each other to form a ring.

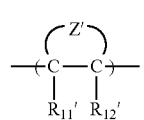

(II-AB)

In General Formula (II-AB), $R_{11}'$ and $R_{12}'$ each independently represent a hydrogen atom, a cyano group, a halogen atom, or an alkyl group.

Z' represents an atomic group for forming an alicyclic structure, which contains two carbon atoms bonded to each other (C—C).

Furthermore, it is more preferable that General Formula (II-AB) is General Formula (II-AB1) or (II-AB2).

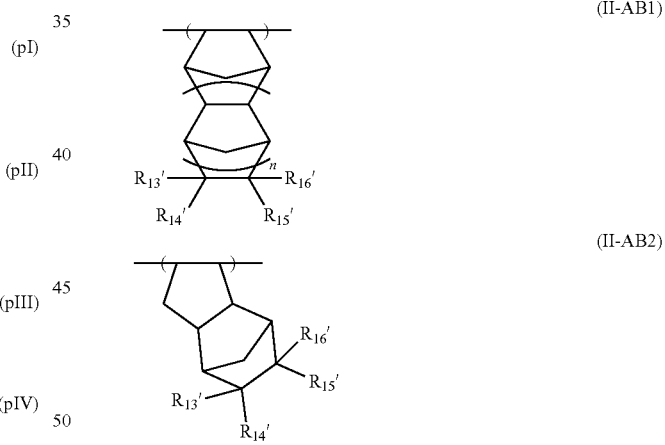

(II-AB1)

(II-AB2)

In Formulae (II-AB1) and (II-AB2), $R_{13}'$ to $R_{16}'$ each independently represent a hydrogen atom, a halogen atom, a cyano group, —COOH, —COO$R_5$, a group capable of decomposing by the action of an acid, —C(=O)—X-A'-$R_{17}'$, an alkyl group, or a cycloalkyl group, provided that at least two of $R_{13}'$, ..., or $R_{16}'$ may be bonded to each other to form a ring.

Here, $R_5$ represents an alkyl group, a cycloalkyl group, or a group having a lactone structure.

X represents an oxygen atom, a sulfur atom, —NH—, —NHSO$_2$—, or —NHSO$_2$NH—.

A' represents a single bond or a divalent linking group.

$R_{17}'$ represents —COOH, —COO$R_5$, —CN, a hydroxyl group, an alkoxy group, —CO—NH—$R_6$, —CO—NH—SO$_2$—$R_6$, or a group having a lactone structure.

$R_6$ represents an alkyl group or a cycloalkyl group.

n represents 0 or 1.

In General Formulae (pI) to (pV), the alkyl group in each of $R_{12}$ to $R_{25}$ is a linear or branched alkyl group having 1 to 4 carbon atoms.

The cycloalkyl group in each of $R_{11}$ to $R_{25}$ or the cycloalkyl group formed by Z together with carbon atoms may be monocyclic or polycyclic. Specific examples thereof include a group having 5 or more carbon atoms and having a monocyclo, bicyclo, tricyclo, or tetracyclo structure. These cycloalkyl groups preferably have 6 to 30 carbon atoms, and particularly preferably 7 to 25 carbon atoms. These cycloalkyl groups may have a substituent.

Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group. More preferred examples thereof include an adamantyl group, a norbornyl group, a cyclohexyl group, a cyclopentyl group, a tetracyclododecanyl group, and a tricyclodecanyl group.

Examples of a substituent which may further be included in these alkyl groups and cycloalkyl groups include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). Examples of the substituent which may further be included in the alkyl group, the alkoxy group, the alkoxycarbonyl group, or the like include a hydroxyl group, a halogen atom, and an alkoxy group.

The structures represented by General Formulae (pI) to (pV) in the resin can be used in the protection of the alkali-soluble group. Examples of the alkali-soluble group include various groups that have been known in the technical field.

Specific examples of the structure include a structure in which a hydrogen atom in a carboxylic acid group, a sulfonic acid group, a phenol group, or a thiol group is substituted with a structure represented by any one of General Formulae (pI) to (pV), with a structure in which a hydrogen atom in a carboxylic acid group or a sulfonic acid group is substituted with a structure represented by any one of General Formulae (pI) to (pV) being preferable.

As the repeating unit having an alkali-soluble group protected by the structure represented by one of General Formulae (pI) to (pV), a repeating unit represented by General Formula (pA) is preferable.

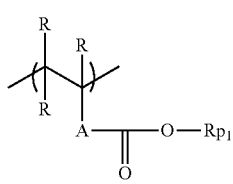
(pA)

Here, R represents a hydrogen atom, a halogen atom, or a linear or branched alkyl group having 1 to 4 carbon atoms, and a plurality of R's may be the same as or different from each other.

A is a single bond, or one group or a combination of two or more groups selected from the group consisting of an alkylene group, an ether group, a thioether group, a carbonyl group, an ester group, an amido group, a sulfonamido group, a urethane group, or a urea group, with a single bond being preferable.

$Rp_1$ is a group of any one of Formulae (pI) to (pV).

The repeating unit represented by General Formula (pA) is particularly preferably a repeating unit derived from 2-alkyl-2-adamantyl (meth)acrylate or dialkyl (1-adamantyl)methyl (meth)acrylate.

Specific examples of the repeating unit represented by General Formula (pA) are shown below, but are not limited thereto.

(in the following formulate, Rx represents H, $CH_3$, or $CH_2OH$, and Rxa and Rxb each represent an alkyl group having 1 to 4 carbon atoms)

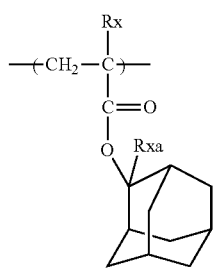

1

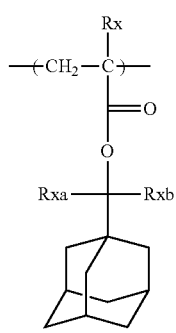

2

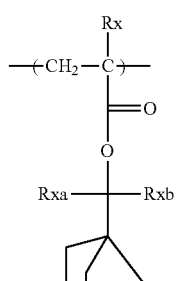

3

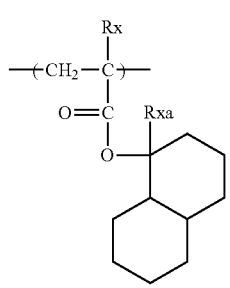

4

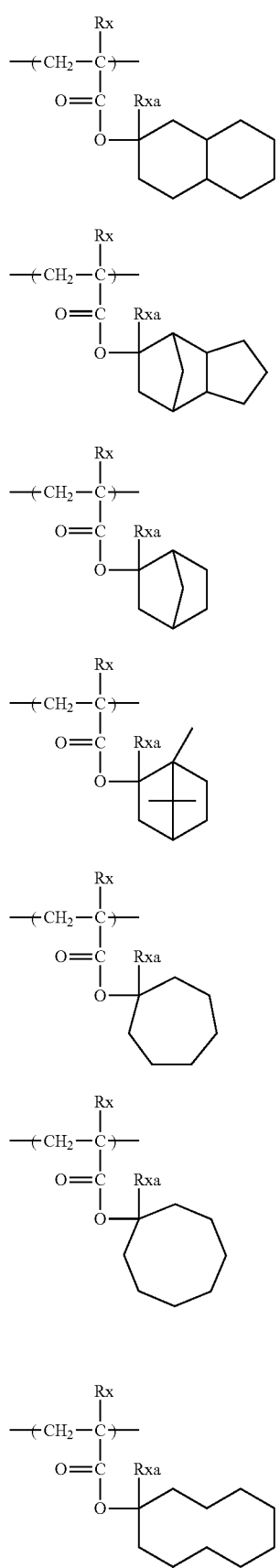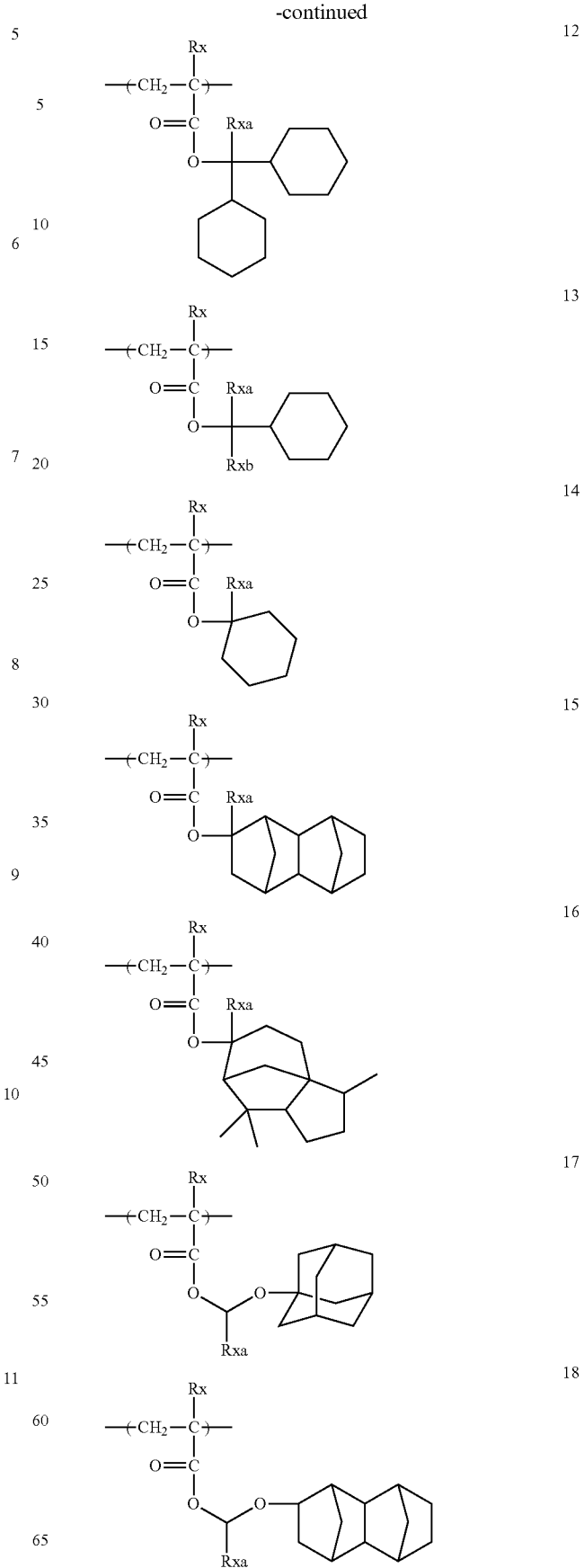

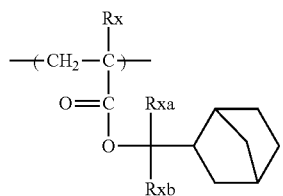

19

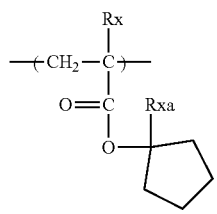

20

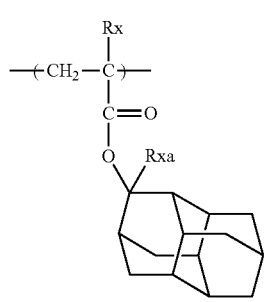

21

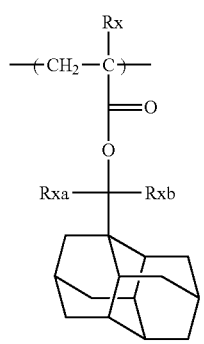

22

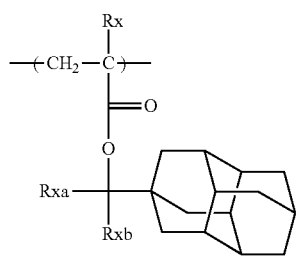

23

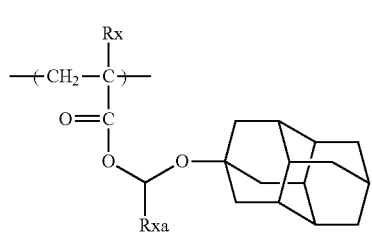

24

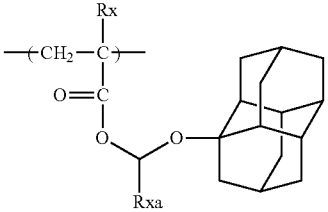

25

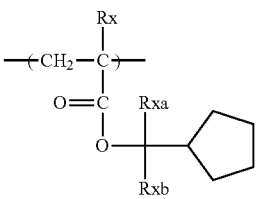

26

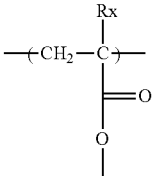

27

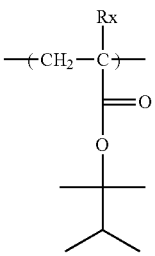

28

In General Formula (II-AB), examples of the halogen atoms in $R_{11}'$ and $R_{12}'$ include a chlorine atom, a bromine atom, a fluorine atom, and an iodine atom.

Examples of the alkyl group in each of $R_{11}'$ and $R_{12}'$ include a linear or branched alkyl group having 1 to 10 carbon atoms.

The atomic group for forming the alicyclic structure of Z' is an atomic group that forms a repeating unit of an alicyclic hydrocarbon, which may have a substituent, in the resin. Above all, an atomic group for forming a crosslinked alicyclic structure that forms a crosslinked alicyclic hydrocarbon repeating unit is preferable.

Examples of the skeleton of the alicyclic hydrocarbon thus formed include the same ones as the alicyclic hydrocarbon groups represented by each of $R_{12}$ to $R_{25}$ in General Formulae (pI) to (pV).

The skeleton of the alicyclic hydrocarbon may have a substituent. Examples of the substituent include $R_{13}'$ to $R_{16}'$ in General Formula (II-AB1) or (II-AB2).

In the resin (A), the group capable of decomposing by the action of an acid is included in at least one repeating unit of a repeating unit having a partial structure represented by any one of General Formulae (pI) to (pV), a repeating unit represented by General Formula (II-AB), or a repeating unit of a copolymerizable component which will be described later. It is preferable that the group capable of decomposing by the action of an acid is included in a repeating unit having a partial structure represented by one of General Formulae (pI) to (pV).

Various substituents of $R_{13}'$ to $R_{16}'$ in General Formula (II-AB1) or (II-AB2) may each be a substituent of the atomic group for forming an alicyclic structure or the atomic group Z for forming a crosslinked alicyclic structure in General Formula (II-AB).

Examples of the repeating unit represented by General Formula (II-AB1) or General Formula (II-AB2) include the following specific examples, but the present invention is not limited to these specific examples.

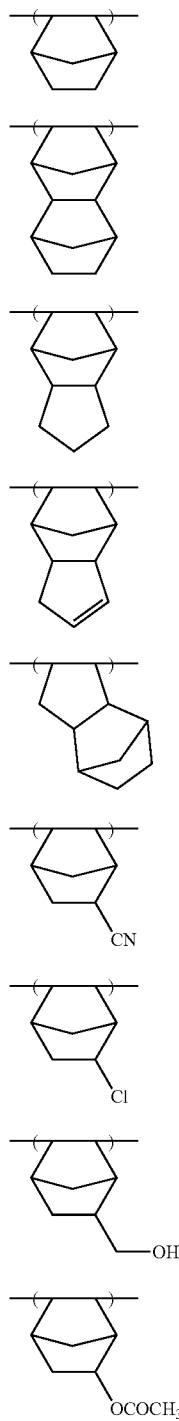

[II-1]
[II-2]
[II-3]
[II-4]
[II-5]
[II-6]
[II-7]
[II-8]
[II-9]

-continued

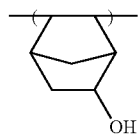
[II-10]

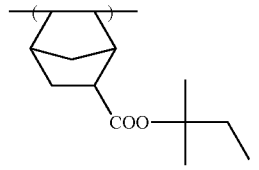
[II-11]

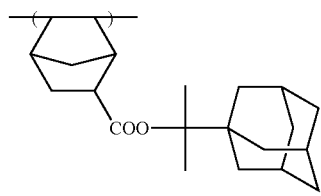
[II-12]

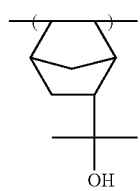
[II-13]

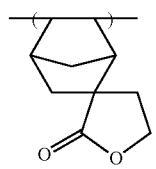
[II-14]

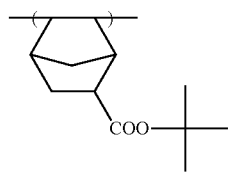
[II-15]

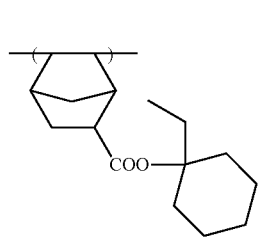
[II-16]

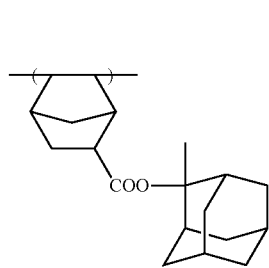
[II-17]

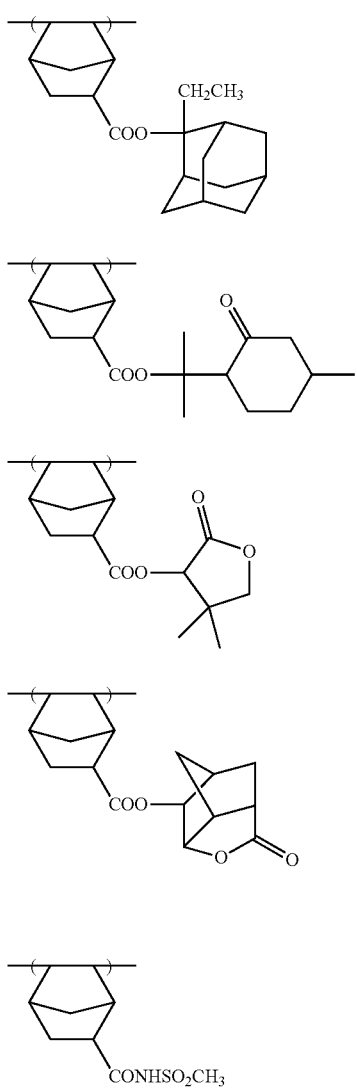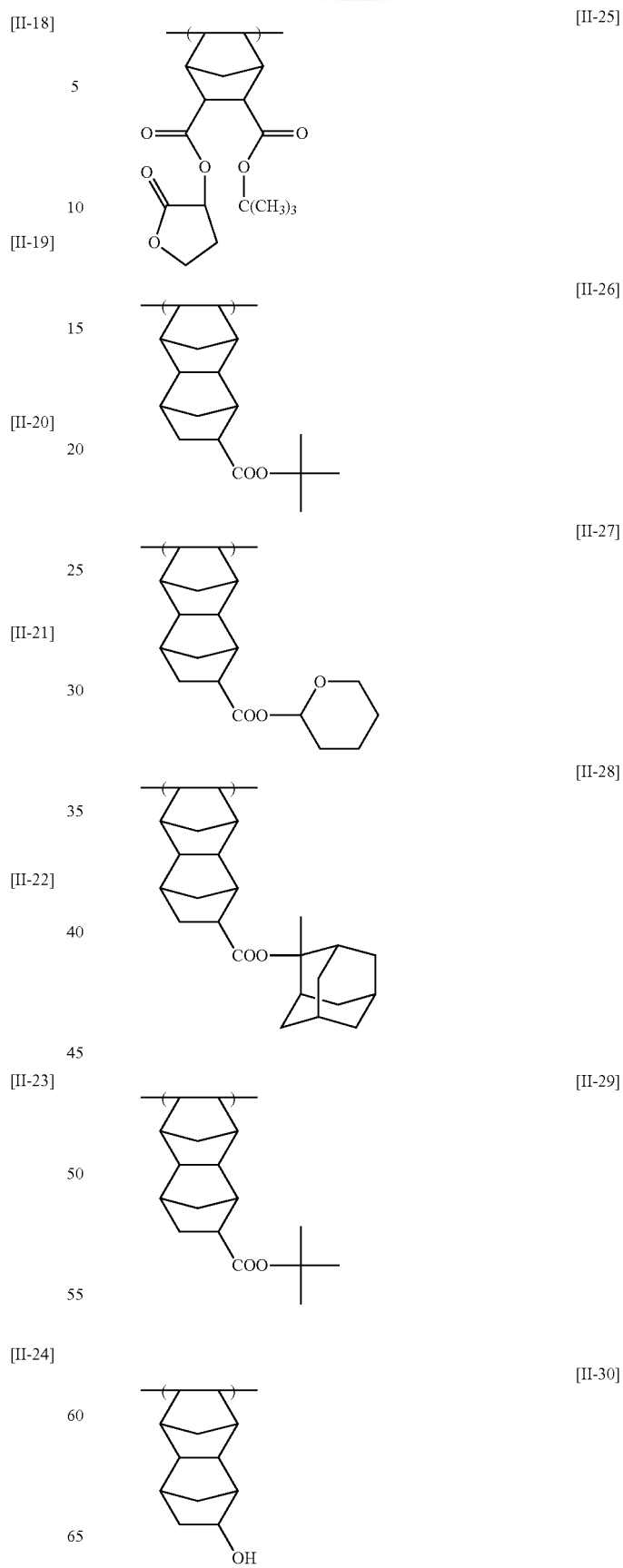

-continued

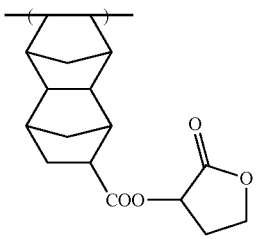
[II-31]

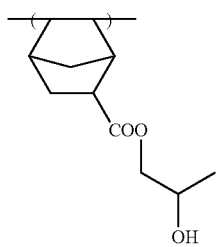
[II-32]

The resin (A) preferably contains, for example, a repeating unit represented by General Formula (3).

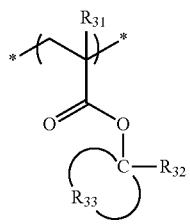
(3)

In General Formula (3), $R_{31}$ represents a hydrogen atom or an alkyl group.

$R_{32}$ represents an alkyl group or a cycloalkyl group, and specific examples thereof include a methyl group, an ethyl group, an n-propyl group, an isopropyl group, an n-butyl group, an isobutyl group, a sec-butyl group, a tert-butyl group, and a cyclohexyl group.

$R_{33}$ represents an atomic group required for forming a monocyclic alicyclic hydrocarbon structure together with carbon atoms to which $R_{32}$ is bonded. In the alicyclic hydrocarbon structure, a part of carbon atoms constituting a ring may be substituted with a heteroatom, or a group having a heteroatom.

The alkyl group of $R_{31}$ may have a substituent and examples of the substituent include a fluorine atom and a hydroxyl group. $R_{31}$ preferably represents a hydrogen atom, a methyl group, a trifluoromethyl group, or a hydroxymethyl group.

$R_{32}$ is preferably a methyl group, an ethyl group, an n-propyl group, an isopropyl group, a tert-butyl group, or a cyclohexyl group, and more preferably a methyl group, an ethyl group, an isopropyl group, or a tert-butyl group.

The monocyclic alicyclic hydrocarbon structure formed by $R_{33}$ together with carbon atoms is preferably a 3- to 8-membered ring, and more preferably a 5- or 6-membered ring.

In the monocyclic alicyclic hydrocarbon structure formed by $R_{33}$ together with carbon atoms, examples of the heteroatom which can constitute a ring include an oxygen atom and a sulfur atom, and examples of the group having a heteroatom include a carbonyl group. However, it is preferable that the group having a heteroatom is not an ester group (ester bond).

The monocyclic alicyclic hydrocarbon structure formed by $R_{33}$ together with carbon atoms is preferably formed with only carbon atoms and hydrogen atoms.

The repeating unit represented by General Formula (3) is preferably a repeating unit represented by General Formula (3').

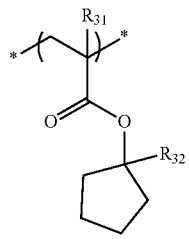
(3')

In General Formula (3'), $R_{31}$ and $R_{32}$ have the same definitions as those in General Formula (3), respectively.

Specific examples of the repeating unit having the structure represented by General Formula (3) are shown below, but are not limited thereto.

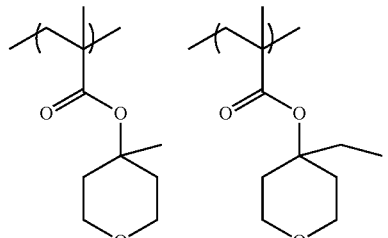

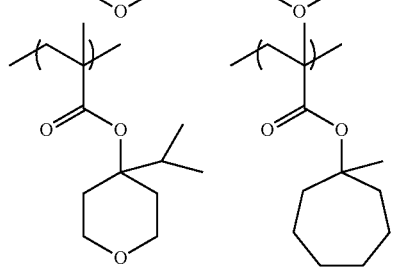

-continued
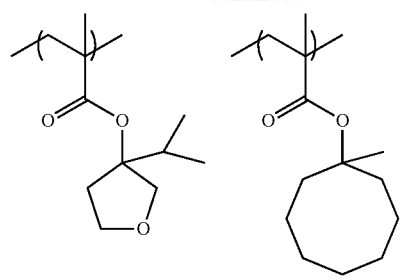
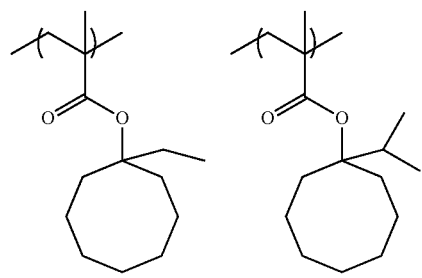
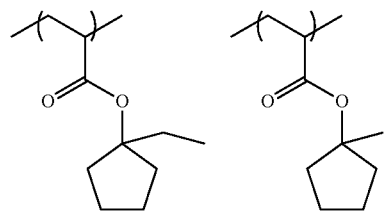
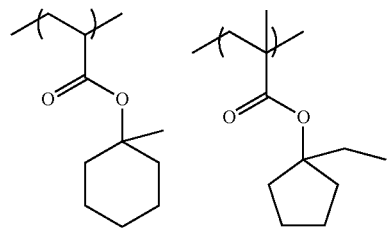
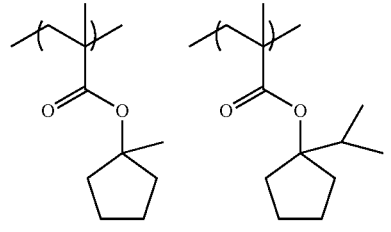
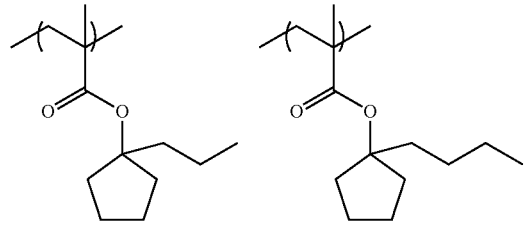
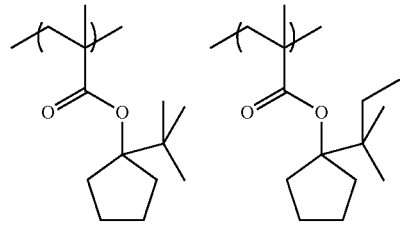
-continued
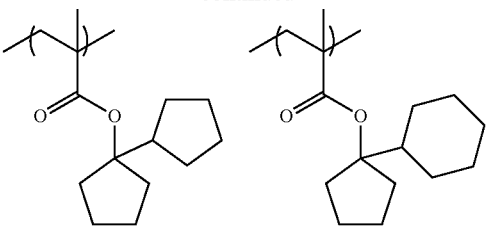
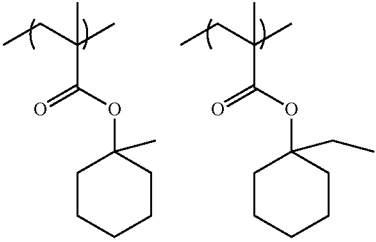
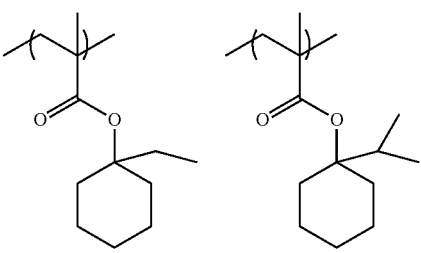
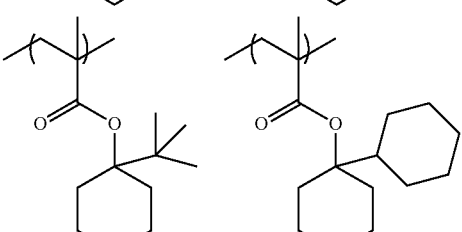
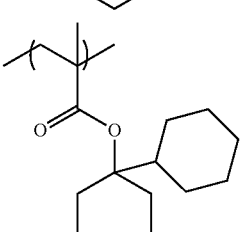
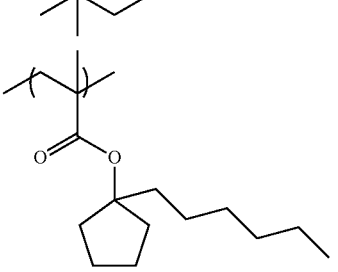
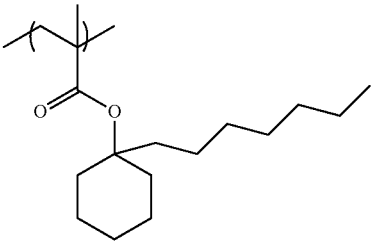

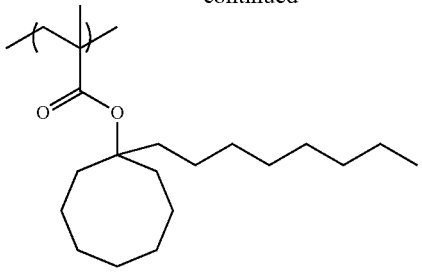

The content of the repeating unit having a structure represented by General Formula (3) is preferably 20% to 80% by mole, more preferably 25% to 75% by mole, and still more preferably 30% to 70% by mole, with respect to all the repeating units of the resin (A).

The resin (A) is more preferably a resin having at least one of the repeating unit represented by General Formula (I) or the repeating unit represented by General Formula (II) as the repeating unit represented by General Formula (AI).

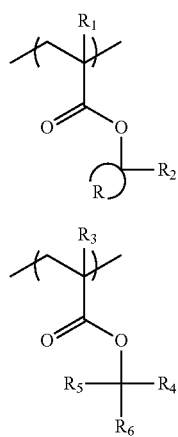

In Formulae (I) and (II), $R_1$ and $R_3$ each independently represent a hydrogen atom, a methyl group which may have a substituent, or a group represented by —$CH_2$—$R_{11}$. $R_{11}$ represents a monovalent organic group.

$R_2$, $R_4$, $R_5$, and $R_6$ each independently represent an alkyl group or a cycloalkyl group.

R represents an atomic group required for forming an alicyclic structure together with a carbon atom to which $R_2$ is bonded.

$R_1$ and $R_3$ each preferably represent a hydrogen atom, a methyl group, a trifluoromethyl group, or a hydroxymethyl group. Specific examples and preferred examples of the monovalent organic group in $R_{11}$ are the same as described for $R_{11}$ in General Formula (AI).

The alkyl group in $R_2$ may be linear or branched, and may have a substituent.

The cycloalkyl group in $R_2$ monocyclic or polycyclic, and may have a substituent.

$R_2$ is preferably an alkyl group, more preferably an alkyl group having 1 to 10 carbon atoms, and still more preferably an alkyl group having 1 to 5 carbon atoms, and examples thereof include a methyl group, an ethyl group, an n-propyl group, an i-propyl group, and a t-butyl group. As the alkyl group in $R_2$, a methyl group, an ethyl group, an i-propyl group, and a t-butyl group are preferable.

R represents an atomic group required to form an alicyclic structure together with a carbon atom. The alicyclic structure formed by R together with the carbon atom is preferably a monocyclic alicyclic structure, and the number of carbon atoms is preferably 3 to 7, and more preferably 5 or 6.

$R_3$ is preferably a hydrogen atom or a methyl group, and more preferably a methyl group.

The alkyl group in $R_4$, $R_5$, or $R_6$ may be linear or branched, and may have a substituent. Preferred examples of the alkyl group include alkyl groups having 1 to 4 carbon atoms, such as a methyl group, an ethyl group, an n-propyl group, an isopropyl group, an n-butyl group, an isobutyl group, and a t-butyl group.

The cycloalkyl group in $R_4$, $R_5$, or $R_6$ may be monocyclic or polycyclic, and may have a substituent. Preferred examples of the cycloalkyl group include monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group.

Examples of the substituent which may be contained in each of the groups include the same groups as those mentioned above as the substituent which may be contained in each of the groups in General Formula (AI).

In General Formula (II), $R_4$, $R_5$, and $R_6$ are preferably an alkyl group, and the sum of the numbers of carbon atoms of $R_4$, $R_5$, and $R_6$ is preferably 5 or more, more preferably 6 or more, and still more preferably 7 or more.

The resin (A) is more preferably a resin having the repeating unit represented by General Formula (I) or the repeating unit represented by General Formula (II) as the repeating unit represented by General Formula (AI).

Moreover, in another aspect, a resin including at least two kinds of the repeating unit represented by General Formula (I) as the repeating unit represented by General Formula (AI) is more preferable. In a case where the resin contains at least two kinds of the repeating unit represented by General Formula (I), it is preferable that the resin contains both of a repeating unit in which an alicyclic structure formed by R together with a carbon atom is a monocyclic alicyclic structure and a repeating unit in which an alicyclic structure formed by R together with a carbon atom is a polycyclic alicyclic structure. The monocyclic alicyclic structure preferably has 5 to 8 carbon atoms, more preferably 5 or 6 carbon atoms, and particularly preferably 5 carbon atoms. As the polycyclic alicyclic structure, a norbornyl group, a tetracyclodecanyl group, a tetracyclododecanyl group, and an adamantyl group are preferable.

The repeating unit having an acid-decomposable group which the resin (A) contains may be used alone or in combination of two or more kinds thereof.

The resin (A) preferably contains a repeating unit having a lactone structure or a sultone (cyclic sulfonic acid ester) structure.

As the lactone group or the sultone group, any group may be used as long as it has a lactone structure or a sultone structure, but the structure is preferably a 5- to 7-membered ring lactone structure or sultone structure, and more preferably a 5- to 7-membered ring lactone structure or sultone structure to which another ring structure is fused in the form of forming a bicyclo structure or a Spiro structure. The resin (A) still more preferably has a repeating unit having a lactone structure or a sultone structure represented by any one of General Formulae (LC1-1) to (LC1-17), (SL1-1), and (SL1-2). Further, the lactone structure or the sultone structure may be bonded directly to the main chain. The lactone structures or the sultone structures are preferably (LC1-1), (LC1-4), (LC1-5), and (LC1-8), and more preferably (LC1-4). By using such a specific lactone structure or sultone structure, LWR and development defects are relieved.
LC1-1
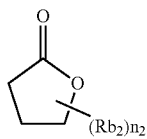
LC1-2
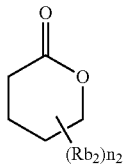
LC1-3
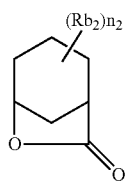
LC1-4
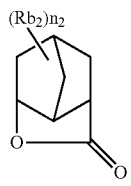
LC1-5
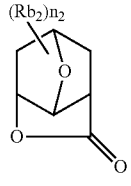
LC1-6
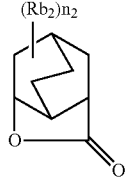
LC1-7
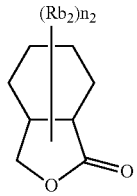
LC1-8
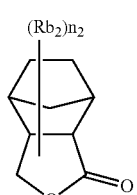
LC1-9
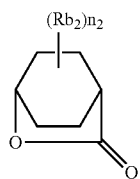
LC1-10
LC1-11
LC1-12
LC1-13
LC1-14
LC1-15
LC1-16

-continued

LC1-17

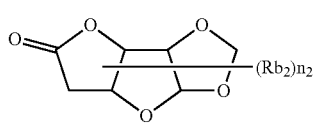

SL1-1

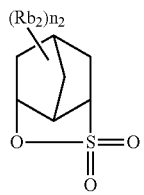

SL1-2

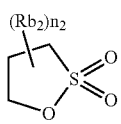

The lactone structure moiety or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. $n_2$ represents an integer of 0 to 4. In a case where $n_2$ is 2 or more, the substituents ($Rb_2$) which are present in plural numbers may be the same as or different from each other, and further, the substituents ($Rb_2$) which are present in plural numbers may be bonded to each other to form a ring.

It is preferable that the resin (A) contains a repeating unit having a lactone structure or a sultone structure, represented by General Formula (III).

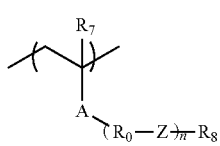

(III)

In Formula (III),

A represents an ester bond (a group represented by —COO—) or an amide bond (a group represented by —CONH—).

In a case where $R_0$'s are present in plural numbers, they each independently represent an alkylene group, a cycloalkylene group, or a combination thereof.

In a case where Z's are present in plural numbers, they each independently represent a single bond, an ether bond, an ester bond, an amide bond, a urethane bond

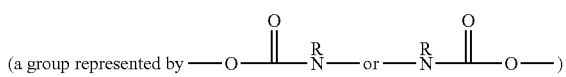

or a urea bond (a group represented by $-\underset{R}{N}-\overset{O}{\underset{\|}{C}}-\underset{R}{N}-$).

Here, R's each independently represent a hydrogen atom, an alkyl group, a cycloalkyl group, or an aryl group.

$R_8$ represents a monovalent organic group having a lactone structure or a sultone structure.

n is the repetition number of the structure represented by —$R_0$—Z—, and represents an integer of 0 to 2.

$R_7$ represents a hydrogen atom, a halogen atom, or an alkyl group.

The alkylene group and the cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group. The alkylene group and the cycloalkylene group of $R_0$, and the alkyl group in $R_7$ may be each substituted, and examples of the substituent include a halogen atom such as a fluorine atom, a chlorine atom, and a bromine atom, a mercapto group, a hydroxy group, an alkoxy group such as a methoxy group, an ethoxy group, an isopropoxy group, a t-butoxy group, and a benzyloxy group, and an acetoxy group such as an acetyloxy group and a propionyloxy group. $R_7$ is preferably a hydrogen atom, a methyl group, a trifluoromethyl group, or a hydroxymethyl group.

The preferred chained alkylene group in $R_0$ is chained alkylene, preferably having 1 to 10 carbon atoms, and more preferably having 1 to 5 carbon atoms, and examples thereof include a methylene group, an ethylene group, and a propylene group. Preferred examples of the cycloalkylene group include a cycloalkylene group having 3 to 20 carbon atoms, and examples thereof include a cyclohexylene group, a cyclopentylene group, a norbornylene group, and an adamantylene group. In the present invention, a chained alkylene group is more preferable, and a methylene group is particularly preferable.

The monovalent organic group having a lactone structure or sultone structure represented by $R_8$ is not limited as long as it has the lactone structure or sultone structure, specific examples thereof include the above-mentioned lactone structures or sultone structures represented by General Formula (LC1-1) to (LC1-17), (SL1-1), and (SL1-2), and among these, the structure represented by (LC1-4) is particularly preferable. Further, $n_2$ in (LC1-1) to (LC1-17), (SL1-1), and (SL1-2) is more preferably 2 or less.

Furthermore, $R_8$ is preferably a monovalent organic group having an unsubstituted lactone structure or sultone structure, or a monovalent organic group having a lactone structure or a sultone structure having a methyl group, a cyano group, or an alkoxycarbonyl group as a substituent, and more preferably a monovalent organic group having a lactone structure having a cyano group as a substituent (cyanolactone) or a sultone structure having a cyano group as a substituent (cyanosultone).

In General Formula (III), n is preferably 0 or 1.

As the repeating unit having a lactone structure or sultone structure, a repeating unit represented by General Formula (III-1) or (III-1') is more preferable.

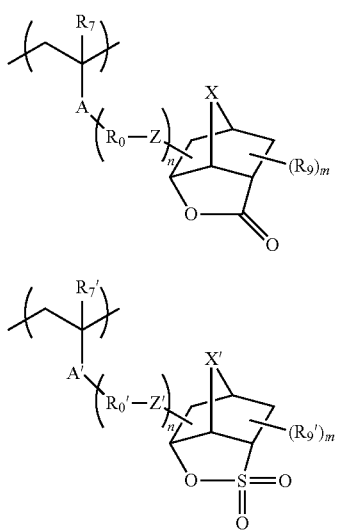

(III-1)

(III-1')

In General Formulae (III-1) and (III-1'), $R_7$, A, $R_0$, Z, and n have the same definitions as in General Formula (III), respectively.

$R_7'$, A', $R_0'$, Z' and n' have the same definitions as $R_7$, A, $R_0$, Z, and n, respectively, in General Formula (III).

In a case where $R_9$'s are present in plural numbers, they each independently represent an alkyl group, a cycloalkyl group, an alkoxycarbonyl group, a cyano group, a hydroxyl group, or an alkoxy group, or in a case where a plurality thereof are present, two $R_9$'s may be bonded to each other to form a ring.

In a case where $R_9''$s are present in plural numbers, they each independently represent an alkyl group, a cycloalkyl group, an alkoxycarbonyl group, a cyano group, a hydroxyl group, or an alkoxy group, or in a case where a plurality thereof are present, two $R_9''$s may be bonded to each other to form a ring.

X and X' each independently represent an alkylene group, an oxygen atom, or a sulfur atom.

m and m' are each the number of substituents, and each independently represent an integer of 0 to 5. m and m' are each independently preferably 0 or 1.

As the alkyl group of each of $R_9$ and $R_9'$, an alkyl group having 1 to 4 carbon atoms is preferable, a methyl group or an ethyl group is more preferable, and a methyl group is the most preferable. Examples of the cycloalkyl group include cyclopropyl, cyclobutyl, cyclopentyl, and cyclohexyl groups. Examples of the alkoxycarbonyl group include a methoxycarbonyl group, an ethoxycarbonyl group, an n-butoxycarbonyl group, and a t-butoxycarbonyl group. Examples of the alkoxy group include a methoxy group, an ethoxy group, a propoxy group, an isopropoxy group, and a butoxy group. These groups may have a substituent, and examples of the substituent include an alkoxy group such as a hydroxy group, a methoxy group, and an ethoxy group, a cyano group, and a halogen atom such as a fluorine atom. $R_9$ and $R_9'$ are each more preferably a methyl group, a cyano group, or an alkoxycarbonyl group, and still more preferably a cyano group.

Examples of the alkylene group of each of X and X' include a methylene group and an ethylene group. X and X' are each preferably an oxygen atom or a methylene group, and more preferably a methylene group.

In a case where m and m' are each 1 or more, at least one of $R_9$ or $R_9'$ is preferably substituted at the α- or β-position of the carbonyl group of lactone, and particularly preferably substituted at the α-position.

Specific examples of the group having a lactone structure or the repeating unit having a sultone structure, represented by General Formula (III-1) or (III-1'), include the structures described in paragraphs [0150] and [0151] of JP2013-178370A.

In a case where the repeating units are present in a plurality of kinds, the content of the repeating units represented by General Formula (III) is preferably 15% to 60% by mole, more preferably 20% to 60% by mole, and still more preferably 30% to 50% by mole, with respect to all the repeating units in the resin (A).

The resin (A) may further contain the aforementioned repeating unit having a lactone structure or a sultone structure, in addition to the unit represented by General Formula (III).

The repeating unit having a lactone group or a sultone group usually has an optical isomer, and any optical isomer may be used. Further, one kind of optical isomer may be used alone or a plurality of optical isomers may be mixed and used. In a case of mainly using one kind of optical isomer, the optical purity (ee) thereof is preferably 90% or more, and more preferably 95% or more.

The content of the repeating unit having a lactone structure or a sultone structure, other than the repeating unit represented by General Formula (III), is preferably 15% to 60% by mole, more preferably 20% to 50% by mole, and still more preferably 30% to 50% by mole, with respect to all the repeating units in the resin in a case where the repeating units are contained in a plurality of kinds.

It is also possible to use two or more kinds of the repeating units having a lactone structure or a sultone structure selected from General Formula (III) in combination. In a case of using them in combination, it is preferable to use two or more selected from the lactone or sultone repeating units of General Formula (III) in which n is 0 in combination.

The resin (A) preferably has a repeating unit containing an organic group having a polar group, in particular, a repeating unit having an alicyclic hydrocarbon structure substituted with a polar group. Thus, the substrate adhesiveness and the developer affinity are improved. As the alicyclic hydrocarbon structure of the alicyclic hydrocarbon structure substituted with a polar group, an adamantyl group, a diamantyl group, or a norbornane group is preferable. As the polar group, a hydroxyl group or a cyano group is preferable.

Preferred examples of the alicyclic hydrocarbon structure substituted with a polar group include partial structures represented by General Formulae (VIIa) to (VIId).

(VIIa)

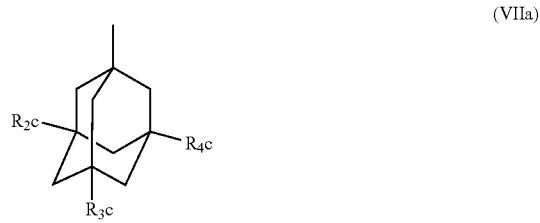

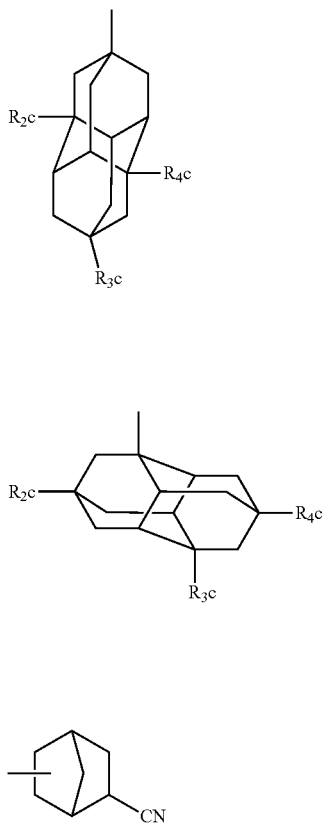

In General Formulae (VIIa) to (VIIc), $R_2c$ to $R_4c$ each independently represent a hydrogen atom, a hydroxyl group, or a cyano group, provided that at least one of $R_2c$, . . . , or $R_{4c}$ represents a hydroxyl group or a cyano group. It is preferable that one or two of $R_{2c}$ to $R_{4c}$ are hydroxyl groups and the remainders are hydrogen atoms.

In General Formula (VIIa), it is more preferable that two of $R_2c$ to $R_4c$ are hydroxyl groups and the remainders are hydrogen atoms.

Examples of the repeating unit having a group represented by any one of General Formulae (VIIa) to (VIId) include those in which at least one of $R_{13}'$, . . . , or $R_{16}'$ in General Formula (II-AB1) or (II-AB2) has a group represented by General Formula (VIIa) to (VIId) (for example, in —COOR$_5$, R$_5$ represents a group represented by one of General Formulae (VIIa) to (VIId)), and repeating units represented by General Formulae (AIIa) to (AIId).

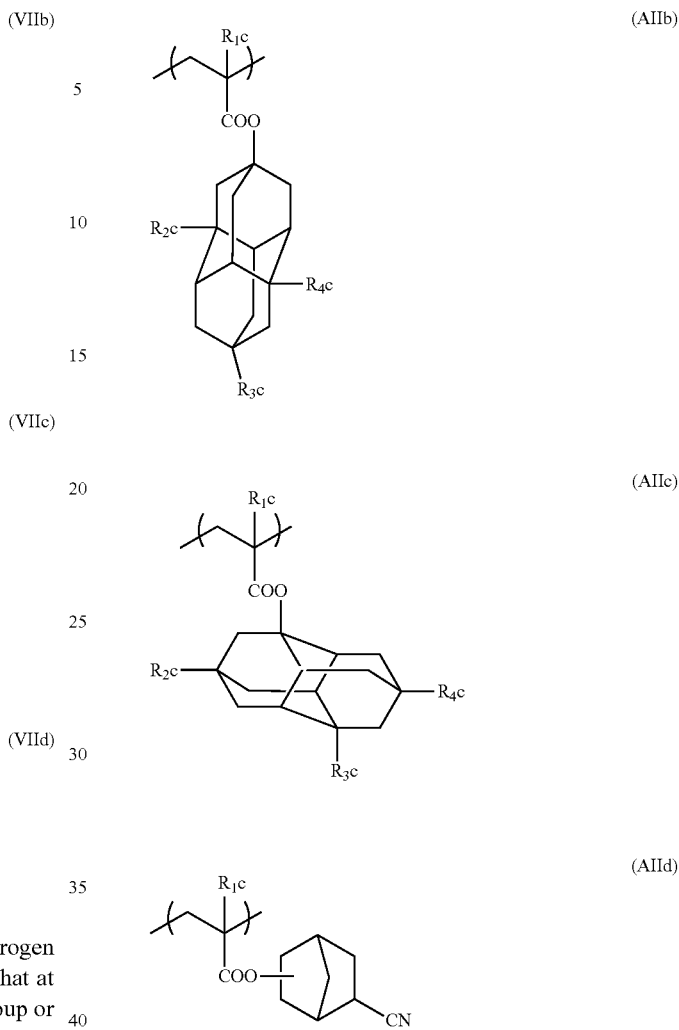

In General Formulae (AIIa) to (AIId), $R_1c$ represents a hydrogen atom, a methyl group, a trifluoromethyl group, or a hydroxymethyl group.

$R_2c$ to $R_4c$ have the same definitions as $R_2c$ to $R_4c$, respectively, in General Formulae (VIIa) to (VIIc).

Specific examples of the repeating unit having a structure represented by any one of General Formulae (AIIa) to (AIId) are shown below, but the present invention is not limited thereto.

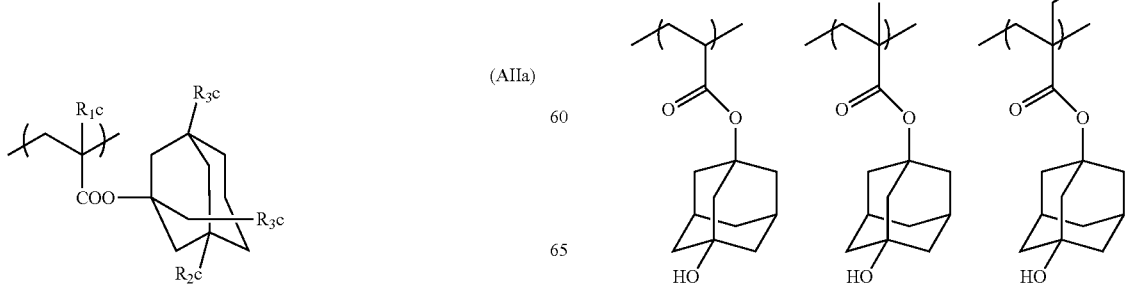

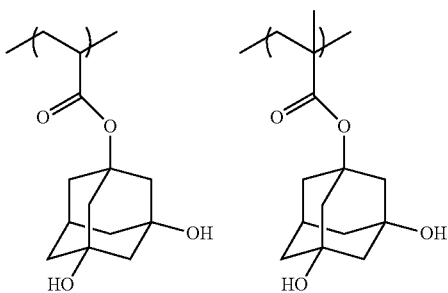
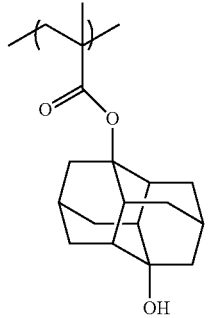

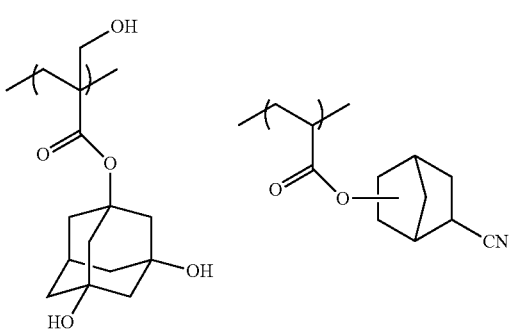

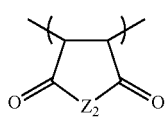

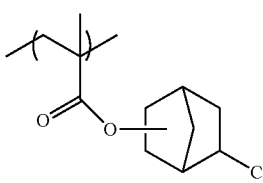

The resin (A) may further have a repeating unit represented by General Formula (VIII).

(VIII)

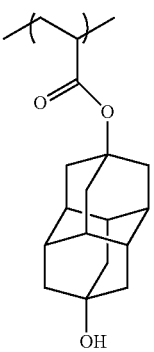

In General Formula (VIII), $Z_2$ represents —O— or —N($R_{41}$)—. $R_{41}$ represents a hydrogen atom, a hydroxyl group, an alkyl group, or —OSO$_2$—$R_{42}$. $R_{42}$ represents an alkyl group, a cycloalkyl group, or a camphor residue. The alkyl group of each of $R_{41}$ and $R_{42}$ may be substituted with a halogen atom (preferably a fluorine atom) or the like.

Examples of the repeating unit represented by General Formula (VIII) include the following specific examples, but the present invention is not limited thereto.

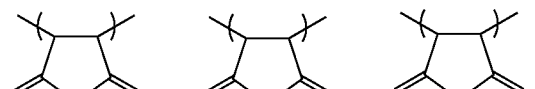
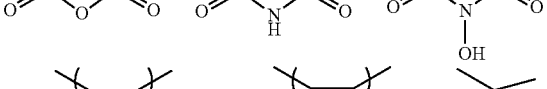
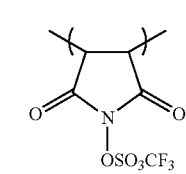

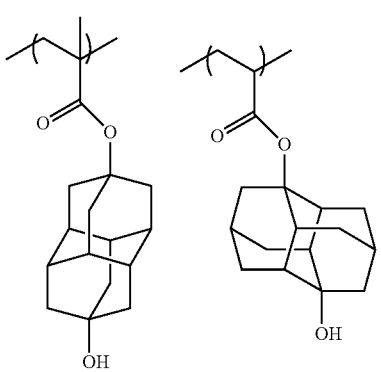

The resin (A) preferably has a repeating unit having an alkali-soluble group, and more preferably has a repeating unit having a carboxyl group. By incorporation of the group, the resolution in contact hole applications increases. As the repeating unit containing a carboxyl group, all of a repeating unit in which a carboxyl group is directly bonded to the main chain of a resin, such as a repeating unit with an acrylic acid or a methacrylic acid, a repeating unit in which a carboxyl group is bonded to the main chain of a resin via a linking group, and a repeating unit in which a polymerization initiator having an alkali-soluble group or a chain transfer agent is introduced into a terminal of a polymer chain during the polymerization are preferable, and the linking group may have a monocyclic or polycyclic cyclic hydrocarbon structure. A repeating unit with an acrylic acid or a methacrylic acid is particularly preferred.

Furthermore, the resin (A) may have a repeating unit having 1 to 3 groups represented by General Formula (F1). Thus, line edge roughness performance is further improved.

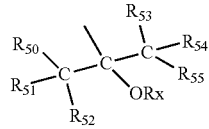

(F1)

In General Formula (F1), $R_{50}$ to $R_{55}$ each independently represent a hydrogen atom, a fluorine atom, or an alkyl group, provided that at least one of $R_{50}$, . . . , or $R_{55}$ represents a fluorine atom or an alkyl group resulting from substitution of at least one hydrogen atom with a fluorine atom.

Rx represents a hydrogen atom or an organic group (preferably an acid-decomposable protecting group, an alkyl group, a cycloalkyl group, an acyl group, or an alkoxycarbonyl group).

The alkyl group of each of $R_{50}$ to $R_{55}$ may be substituted with a halogen atom such as a fluorine atom, a cyano group, or the like, and preferred examples thereof include an alkyl group having 1 to 3 carbon atoms, for example, a methyl group and a trifluoromethyl group.

It is preferable that all of $R_{50}$ to $R_{55}$ are fluorine atoms.

As the organic group represented by Rx, an acid-decomposable protecting group, an alkyl group which may have a substituent, a cycloalkyl group, an acyl group, an alkylcarbonyl group, an alkoxycarbonyl group, an alkoxycarbonylmethyl group, an alkoxymethyl group, or a 1-alkoxyethyl group is preferable.

The repeating unit having a group represented by General Formula (F1) is preferably a repeating unit represented by General Formula (F2).

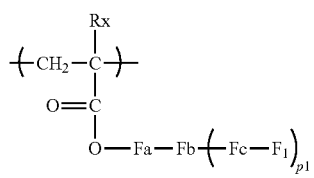

(F2)

In General Formula (F2),

Rx represents a hydrogen atom, a halogen atom, or an alkyl group having 1 to 4 carbon atoms. Preferred examples of the substituent which may be contained in the alkyl group of Rx include a hydroxyl group and a halogen atom.

Fa represents a single bond or a linear or branched alkylene group (preferably a single bond).

Fb represents a cyclic hydrocarbon group which is monocyclic or polycyclic.

Fc represents a single bond or a linear or branched alkylene group (preferably a single bond or a methylene group).

$F_1$ represents a group represented by General Formula (F1).

$p_1$ represents 1 to 3.

As the cyclic hydrocarbon group in Fb, a cyclopentylene group, a cyclohexylene group, or a norbornylene group is preferable.

Specific examples of the repeating unit having a group represented by General Formula (F1) are shown below, but the present invention is not limited thereto.

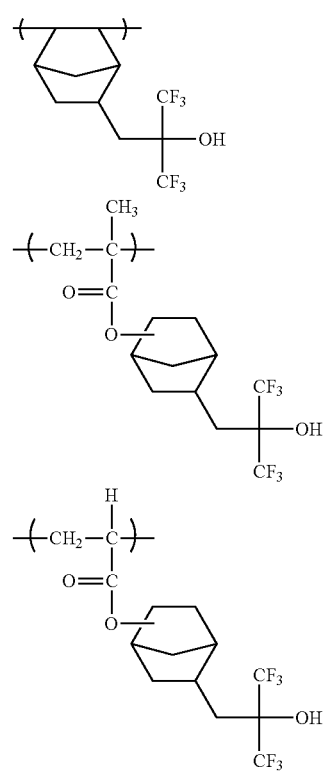

The resin (A) may also have a repeating unit which further has an alicyclic hydrocarbon structure and does not exhibit acid-decomposability. Thus, it is possible to reduce elution of the low molecular components from the resist film to the immersion liquid upon liquid immersion exposure. Examples of such a repeating unit include 1-adamantyl (meth)acrylate, tricyclodecanyl (meth)acrylate, and cyclohexyl (meth)acrylate.

The resin (A) may contain, in addition to the above-described repeating units, repeating units derived from various monomers for the purpose of controlling various characteristics. Examples of such a monomer include a compound having one addition-polymerizable unsaturated bond selected from acrylic acid esters, methacrylic acid esters, acrylamides, methacrylamides, allyl compounds, vinyl ethers, and vinyl esters.

In addition, addition-polymerizable unsaturated compounds which are copolymerizable with monomers corresponding to various repeating units above may be copolymerized.

In the resin (A), the molar ratio of the contents of the respective repeating units is appropriately set.

In the resin (A), the content of the repeating unit having an acid-decomposable group is preferably 10% to 60% by mole, more preferably 20% to 50% by mole, and still more preferably 25% to 40% by mole, with respect to all the repeating units.

In the resin (A), the content of the repeating unit having the partial structures represented by General Formulae (pI) to (pV) is preferably 20% to 70% by mole, more preferably 20% to 50% by mole, and still more preferably 25% to 40% by mole, in all the repeating units.

In the resin (A), the content of the repeating unit represented by General Formula (II-AB) is preferably 10% to 60% by mole, more preferably 15% to 55% by mole, and still more preferably 20% to 50% by mole, with respect to all the repeating units.

In the resin (A), the content of the repeating unit having a lactone ring is preferably 10% to 70% by mole, more preferably 20% to 60% by mole, and still more preferably 25% to 40% by mole, with respect to all the repeating units.

In the resin (A), the content of the repeating unit having an organic group with a polar group is preferably 1% to 40% by mole, more preferably 5% to 30% by mole, and still more preferably 5% to 20% by mole, with respect to all the repeating units.

Furthermore, the content of the repeating units derived from the monomers in the resin (A) can be appropriately set, but generally, it is preferably 99% by mole or less, more preferably 90% by mole or less, and still more preferably 80% by mole or less, with respect to the sum of the total moles of the repeating units having partial structures represented by General Formulae (pI) to (pV) and the repeating unit represented by General Formula (II-AB).

In a case where the resist composition is to be used for ArF exposure, from the viewpoint of the transparency to the ArF light, it is preferable that the resin (A) is free of an aromatic group.

As the resin (A), resins in which all of the repeating units are constituted with (meth)acrylate-based repeating units are preferable. In this case, any one of a resin in which all of the repeating units are methacrylate-based repeating units, a resin in which all of the repeating units are acrylate-based repeating units, and a resin in which all of the repeating units are mixtures of methacrylate-based repeating units/acrylate-based repeating units can be used, and the proportion of the acrylate-based repeating units is preferably 50% by mole or less with respect to all the repeating units.

The resin (A) is preferably a copolymer at least having three kinds of repeating units, that is, a (meth)acrylate-based repeating unit having a lactone ring, a (meth)acrylate-based repeating unit having an organic group substituted with at least any one of a hydroxyl group and a cyano group, and a (meth)acrylate-based repeating unit having an acid-decomposable group.

The resin (A) is preferably a ternary copolymerization polymer including 20% to 50% by mole of repeating units having partial structures represented by General Formulae (pI) to (pV), 20% to 50% by mole of repeating units having lactone structures, and 5% to 30% by mole of repeating units having alicyclic hydrocarbon structures substituted with polar groups, or a quaternary copolymerization polymer including the above repeating units and 0% to 20% by mole of other repeating units.

Preferred examples of the resin (A) include the resins described in paragraphs [0152] to [0158] of JP2008-309878A, but the present invention is not limited thereto.

The resin (A) can be synthesized by an ordinary method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethyl formamide and dimethyl acetamide; and solvents which dissolve the resist composition, such as propylene glycol monomethyl ether acetate, propylene glycol monomethyl ether, and cyclohexanone, which will be described later. It is more preferable to carry out polymerization using the same solvent as the solvent used in the resist composition. Thus, generation of the particles during storage can be suppressed.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferred examples of the initiators include azobisisobutyronitrile, azobisdimethylvaleronitrile, and dimethyl 2,2'-azobis(2-methyl propionate). The initiator is added or added in portionwise, depending on the purposes, and after completion of the reaction, the reaction mixture is poured into a solvent, and then a desired polymer is recovered by a method such as powder and solid recovery. The concentration of the reactant is 5% to 50% by mass, and preferably 10% to 30% by mass. The reaction temperature is usually 10° C. to 150° C., preferably 30° C. to 120° C., and more preferably 60° C. to 100° C.

For the purification, an ordinary method such as a liquid-liquid extraction method of applying water washing or combining it with an appropriate solvent to remove the residual monomers or oligomer components; a purification method in a solution state, such as ultrafiltration of extracting and removing only the polymers having a molecular weight no more than a specific molecular weight; a re-precipitation method of dropwise adding a resin solution into a poor solvent to solidify the resin in the poor solvent, thereby removing the residual monomers and the like; and a purification method in a solid state, such as washing of a resin slurry with a poor solvent after separation of the slurry by filtration can be applied.

The weight-average molecular weight of the resin (A) is a value in terms of polystyrene, measured by means of a gel permeation chromatography (GPC) method, and is preferably 1,000 to 200,000, more preferably 1,000 to 20,000, and still more preferably 1,000 to 15,000. By setting the weight-average molecular weight to 1,000 to 200,000, the heat resistance and the dry etching resistance can be prevented from being deteriorated, and the film forming properties can be prevented from being deteriorated due to deteriorated developability or increased viscosity.

The resin (A) having a dispersity (molecular weight distribution) in a range of usually 1 to 5, preferably 1 to 3, more preferably 1.2 to 3.0, and particularly preferably 1.2 to 2.0 is used. As the dispersity is smaller, the resolution and the resist shape are excellent, the side wall of the resist pattern is smooth, and the roughness is excellent.

Type of columns: TSK gel Multipore HXL-M (manufactured by TOSOH Corporation, 7.8 mmID×30.0 cm)
Developing solvent: Tetrahydrofuran (THF)
Column temperature: 40° C.•flow rate: 1 ml/min
Amount of sample to be injected: 10 μl
Device name: HLC-8120 (manufactured by TOSOH Corporation)

The blend amount of the resin (A) in the entire resist composition is preferably 50% to 99.9% by mass, and more preferably 60% to 99.0% by mass, with respect to the total solid content.

Furthermore, in the present invention, the resin (A) may be used alone or in combination of a plurality of kinds thereof.

It is preferable that the resin (A), and preferably the resist composition contains neither a fluorine atom nor a silicon atom, from the viewpoint of the compatibility with a topcoat composition.

(B) Compound that Generates Acid Upon Irradiation with Actinic Rays or Radiation The resist composition typically contains a compound that generates an acid upon irradiation with actinic rays or radiation (also referred to as a "photoacid generator" or a "component (B)").

The photoacid generator may be in a form of a low molecular compound or in a form introduced into a part of a polymer. Further, a combination of the form of a low molecular compound and the form introduced into a part of a polymer may also be used.

In a case where the photoacid generator is in the form introduced into a part of a polymer, it may be introduced into a part of the resin (A) or into a resin other than the resin (A).

In the present invention, it is preferable the photoacid generator is in the form of a low molecular compound.

The acid generator (B) is not particularly limited as long as it is a known acid generator, but a compound that generates at least one of an organic acid, for example, sulfonic acid, bis(alkylsulfonyl)imide, or tris(alkylsulfonyl)methide upon irradiation with actinic rays or radiation, preferably electron beams or extreme ultraviolet rays is preferable.

The molecular weight of the photoacid generator is preferably 800 or less, more preferably 700 or less, still more preferably 650 or less, and particularly preferably 600 or less.

As such a photoacid generator, a compound may be appropriately selected from known compounds capable of generating an acid upon irradiation with actinic rays or radiation which are used for a photoinitiator for cationic photopolymerization, a photoinitiator for radical photopolymerization, a photodecoloring agent for coloring agents, a photodiscoloring agent, a microresist, or the like, and a mixture thereof, and used.

Examples of the compound include a diazonium salt, a phosphonium salt, a sulfonium salt, an iodonium salt, imidosulfonate, oxime sulfonate, diazodisulfone, disulfone, and o-nitrobenzyl sulfonate.

In addition, as a compound in which a group or compound that generates an acid upon irradiation with actinic rays or radiation is introduced into the main or side chain of the polymer, for example, the compounds described in U.S. Pat. No. 3,849,137A, GE3914407A, JP1988-26653A (JP-S63-26653A), JP1980-164824A (JP-S55-164824A), JP1987-69263A (JP-S62-69263A), JP1988-146038A (JP-S63-146038A), JP1988-163452A (JP-S63-163452A), JP1987-153853A (JP-S62-153853A), JP1988-146029A (JP-S63-146029A), and the like can be used.

In addition, the compounds capable of generating an acid by light described in U.S. Pat. No. 3,779,778A, EP126712B, and the like can also be used.

The acid generator contained in the resist composition is preferably a compound that generates an acid having a cyclic structure upon irradiation with actinic rays or radiation. As the cyclic structure, a monocyclic or polycyclic alicyclic group is preferable, and a polycyclic alicyclic group is more preferable. It is preferable that carbonyl carbon is not included as a carbon atom constituting the ring skeleton of the alicyclic group.

Suitable examples of the acid generator contained in the resist composition include a compound (a specific acid generator) capable of generating an acid upon irradiation with actinic rays or radiation represented by General Formula (3).

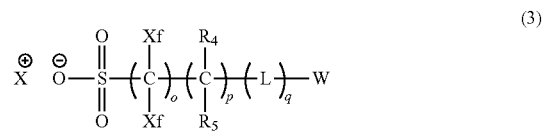

(Anion)

In General Formula (3),

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in a case where $R_4$'s and $R_5$'s are present in plural numbers, they may be the same as or different from each other.

L represents a divalent linking group, and in a case where L's are present in plural numbers, they may be the same as or different from each other.

W represents an organic group including a cyclic structure.

o represents an integer of 1 to 3. p represents an integer of 0 to 10. q represents an integer of 0 to 10.

Xf represents a fluorine atom or an alkyl group substituted with at least one fluorine atom. The number of carbon atoms in the alkyl group is preferably 1 to 10, and more preferably 1 to 4. Further, the alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. It is particularly preferable that both Xf's are fluorine atoms.

$R_4$ and $R_5$ each independently represent a hydrogen atom, a fluorine atom, an alkyl group, or an alkyl group substituted with at least one fluorine atom, and in a case where $R_4$'s and $R_5$'s are present in plural numbers, they may be the same as or different from each other.

The alkyl group as $R_4$ and $R_5$ may have a substituent, and preferably has 1 to 4 carbon atoms. $R_4$ and $R_5$ are each preferably a hydrogen atom.

Specific examples and suitable aspects of the alkyl group substituted with at least one fluorine atom are the same as the specific examples and suitable aspects of Xf in General Formula (3).

L represents a divalent linking group, and in a case where L's are present in plural numbers, they may be the same as or different from each other.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —SO$_2$—, —COO— alkylene group-, —OCO-alkylene group-, —CONH-alkylene group-, or —NHCO-alkylene group- is preferable, and —COO—, —OCO—, —CONH—, —SO$_2$—, —COO-alkylene group-, or —OCO-alkylene group- is more preferable.

W represents an organic group including a cyclic structure. Above all, it is preferably a cyclic organic group.

Examples of the cyclic organic group include an alicyclic group, an aryl group, and a heterocyclic group.

The alicyclic group may be monocyclic or polycyclic, and examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure having 7 or more carbon atoms, such as a norbornyl group, a tricyclodecanyl group, a tetracyclodecanyl group, a tetracyclododecanyl group, a diamantyl group, and an adamantyl group is preferable from the viewpoints of inhibiting diffusivity into the film during post exposure baking (PEB) process and improving Mask Error Enhancement Factor (MEEF).

The aryl group may be monocyclic or polycyclic. Examples of the aryl group include a phenyl group, a naphthyl group, a phenanthryl group, and an anthryl group. Among these, a naphthyl group showing a relatively low light absorbance at 193 nm is preferable.

The heterocyclic group may be monocyclic or polycyclic, but a polycyclic heterocyclic group can further suppress diffusion of the acid. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle having no aromaticity include a tetrahydropyran ring, a lactone ring, a sultone ring, and a decahydroisoquinoline ring. As a heterocycle in the heterocyclic group, a furan ring, a thiophene ring, a pyridine ring, or a decahydroisoquinoline ring is particularly preferable. Further, examples of the lactone ring and the sultone ring include the lactone structures and sultone structures exemplified in the above-mentioned resin.

The cyclic organic group may have a substituent. Examples of the substituent include, an alkyl group (which may be either linear or branched, and preferably has 1 to 12 carbon atoms), a cycloalkyl group (which may be any one of monocyclic, polycyclic, and Spiro rings, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

o represents an integer of 1 to 3. p represents an integer of 0 to 10. q represents an integer of 0 to 10.

In one aspect, it is preferable that in General Formula (3), o is an integer of 1 to 3, p is an integer of 1 to 10, and q is 0. Xf is preferably a fluorine atom, $R_4$ and $R_5$ are preferably both hydrogen atoms, and W is preferably a polycyclic hydrocarbon group. o is more preferably 1 or 2, and still more preferably 1. p is more preferably an integer of 1 to 3, still more preferably 1 or 2, and particularly preferably 1. W is more preferably a polycyclic cycloalkyl group, and still more preferably an adamantyl group or a diamantyl group.

(Cation)

In General Formula (3), X$^+$ represents a cation.

X$^+$ is not particularly limited as long as it is a cation, but suitable aspects thereof include cations (moieties other than Z$^-$) in General Formula (ZI), (ZII), or (ZIII) which will be described later.

(Suitable Aspects)

Suitable aspects of the specific acid generator include a compound represented by General Formula (ZI), (ZII), or (ZIII).

(ZI)

(ZII)

(ZIII)

In General Formula (ZI), $R_{201}$, $R_{202}$, and $R_{203}$ each independently represent an organic group.

The number of carbon atoms in the organic group as $R_{201}$, $R_{202}$, and $R_{203}$ is generally 1 to 30, and preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two of $R_{201}$ to $R_{203}$ include an alkylene group (for example, a butylene group and a pentylene group).

Z$^-$ represents an anion in General Formula (3), and specifically represents the following anion.

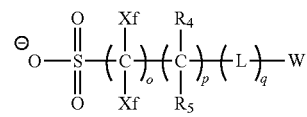

Examples of the organic group represented by $R_{201}$, $R_{202}$, and $R_{203}$ include groups corresponding to the compounds (ZI-1), (ZI-2), (ZI-3), and (ZI-4), which will be described later.

Incidentally, the specific acid generator may be a compound having a plurality of structures represented by General Formula (ZI). For example, it may be a compound having a structure in which at least one of $R_{201}$, ..., or $R_{203}$ in the compound represented by General Formula (ZI) is bonded to at least one of $R_{201}$, ..., or $R_{203}$ of another compound represented by General Formula (ZI) through a single bond or a linking group.

More preferred examples of the component (ZI) include the compounds (ZI-1), (ZI-2), (ZI-3), and (ZI-4) described below.

First, the compound (ZI-1) will be described.

The compound (ZI-1) is an arylsulfonium compound, that is, a compound having arylsulfonium as a cation, in which at least one of $R_{201}$, ..., or $R_{203}$ in General Formula (ZI) is an aryl group.

In the arylsulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, as desired, in the arylsulfonium compound, is preferably a linear or branched alkyl group having 1 to 15 carbon atoms or a cycloalkyl group having 3 to 15 carbon atoms, for example, a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as the substituent.

Next, the compound (ZI-2) will be described.

The compound (ZI-2) is a compound in which $R_{201}$ to $R_{203}$ in Formula (ZI) each independently represent an organic group not having an aromatic ring. Here, the aromatic ring also encompasses an aromatic ring containing a heteroatom.

The organic group not containing an aromatic ring as $R_{201}$ to $R_{203}$ has generally 1 to 30 carbon atoms, and preferably 1 to 20 carbon atoms.

$R_{201}$ to 8203 are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferred examples of the alkyl group and the cycloalkyl group of $R_{201}$ to $R_{203}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next, the compound (ZI-3) will be described.

The compound (ZI-3) is a compound represented by General Formula (ZI-3), which is a compound having a phenacylsulfonium salt structure.

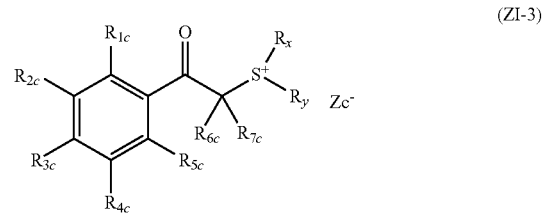

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Among any two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$, each may be bonded to each other to form a ring structure, and the ring structure may contain an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring formed of two or more of these rings. Examples of the ring structure include 3- to 10-membered rings, and the ring structures are preferably 4- to 8-membered ring, and more preferably 5- or 6-membered rings.

Examples of groups formed by the bonding of any two or more of $R_{1c}$ to $R_{5c}$, $R_{6c}$ and $R_{7c}$, and $R_x$ and $R_y$ include a butylene group and a pentylene group.

As groups formed by the bonding of $R_{5c}$ and $R_{6c}$, and $R_{5c}$ and $R_x$, a single bond or alkylene group is preferable, and examples of the alkylene group include a methylene group and an ethylene group.

Zc⁻ represents an anion in General Formula (3), and specifically, is the same as described above.

Specific examples of the alkoxy group in the alkoxycarbonyl group as $R_{1c}$ to $R_{5c}$ are the same as the specific examples of the alkoxy group as $R_{1c}$ to $R_{5c}$.

Specific examples of the alkyl group in the alkylcarbonyloxy group and the alkylthio group as $R_{1c}$ to $R_{5c}$ are the same as the specific examples of the alkyl group as $R_{1c}$ to $R_{5c}$.

Specific examples of the cycloalkyl group in the cycloalkylcarbonyloxy group as $R_{1c}$ to $R_{5c}$ are the same as the specific examples of the cycloalkyl group as $R_{1c}$ to $R_{5c}$.

Specific examples of the aryl group in the aryloxy group and the arylthio group as $R_{1c}$ to $R_{5c}$ are the same as the specific examples of the aryl group as $R_{1c}$ to $R_{5c}$.

Examples of the cation in the compound (ZI-2) or (ZI-3) include the cations described after paragraph [0036] of the specification of US2012/0076996A.

Next, the compound (ZI-4) will be described.

The compound (ZI-4) is represented by General Formula (ZI-4).

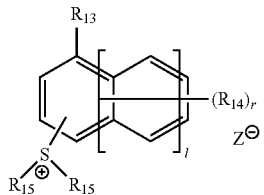

(ZI-4)

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

In a case where RN's are present in plural numbers, they each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to each other to form a ring, the ring skeleton may include a heteroatom such as an oxygen atom and a nitrogen atom. In one aspect, it is preferable that two $R_{15}$'s are alkylene groups, and are bonded to each other to form a ring structure.

l represents an integer of 0 to 2.

r represents an integer of 0 to 8.

$Z^-$ represents an anion in General Formula (3), and specifically, is as mentioned above.

In General Formula (ZI-4), as the alkyl group of each of $R_{13}$, $R_{14}$, and $R_{15}$, an alkyl which is linear or branched and has 1 to 10 carbon atoms is preferable, and a methyl group, an ethyl group, an n-butyl group, a t-butyl group, or the like is preferable.

Examples of the cation of the compound represented by General Formula (ZI-4) in the present invention include the cations described in paragraphs [0121], [0123], and [0124] of JP2010-256842A, paragraphs [0127], [0129], and [0130] of JP2011-76056A, and the like.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of each of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in $R_{24}$ to $R_{207}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

The aryl group, the alkyl group, or the cycloalkyl group of $R_{204}$ to $R_{207}$ may have a substituent. Examples of the substituent which the aryl group, the alkyl group, or the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion in General Formula (3), and specifically, is as described above.

The acid generators may be used alone or in combination of two or more kinds thereof.

The content of the acid generator (a total sum of contents in a case where the acid generators are present in a plurality of kinds) in the composition is preferably 0.1% to 30% by mass, more preferably 0.5% to 25% by mass, still more preferably 3% to 20% by mass, and particularly preferably 3% to 15% by mass, with respect to the total solid contents of the composition.

In a case where the composition includes the compound represented by General Formula (ZI-3) or (ZI-4), the content of the acid generator (a total sum of contents in a case where the acid generators are present in a plurality of kinds) included in the composition is preferably 5% to 35% by mass, more preferably 8% to 30% by mass, still more preferably 9% to 30% by mass, and particularly preferably 9% to 25% by mass, with respect to the total solid contents of the composition.

(C) Solvent

Examples of the solvent which can be used in a case where the respective components are dissolved to prepare a resist composition include organic solvents such as alkylene glycol monoalkyl ether carboxylate, alkylene glycol monoalkyl ether, alkyl lactate ester, alkyl alkoxypropionate, a cyclic lactone having 4 to 10 carbon atoms, a monoketone compound having 4 to 10 carbon atoms, which may have a ring, alkylene carbonate, alkyl alkoxyacetate, and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactate ester include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferred examples of the monoketone compound having 4 to 10 carbon atoms, which may contain a ring, include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent that can be preferably used include solvents having a boiling point of 130° C. or higher under the conditions of normal temperature and normal pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, propylene carbonate, butyl butanoate, isoamyl acetate, and methyl 2-hydroxyisobutyrate.

In the present invention, the solvents may be used alone or in combination of two or more kinds thereof.

In the present invention, a mixed solvent obtained by mixing a solvent containing a hydroxyl group in its structure with a solvent not containing a hydroxyl group in its structure may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, and among these, propylene glycol monomethyl ether and ethyl lactate are particularly preferable.

Examples of the solvent not containing a hydroxyl group include propylene glycol monomethyl ether acetate, ethylethoxypropionate, 2-heptanone, γ-butyrolactone, cyclohexanone, butyl acetate, N-methylpyrrolidone, N,N-dimethylacetamide, and dimethylsulfoxide, and among these, propylene glycol monomethyl ether acetate, ethylethoxypropionate, 2-heptanone, γ-butyrolactone, cyclohexanone, and butyl acetate are particularly preferable, and propylene glycol monomethyl ether acetate, ethylethoxypropionate, and 2-heptanone are most preferable.

The mixing ratio (mass ratio) of the solvent containing a hydroxyl group to the solvent not containing a hydroxyl group is 1/99 to 99/1, preferably 10/90 to 90/10, and more preferably 20/80 to 60/40. A mixed solvent including the solvent not containing a hydroxyl group in the amount of 50% by mass or more is particularly preferable from the viewpoint of coating evenness.

The solvent is preferably a mixed solvent of two or more kinds of solvents containing propylene glycol monomethyl ether acetate.

(D) Hydrophobic Resin

The resist composition may contain a hydrophobic resin (D). As the hydrophobic resin, the resin (X) as described later, which may be included in the topcoat composition, can be suitably used. A suitable aspect of the hydrophobic resin is the same as the resin (X) as described later. For example, the hydrophobic resin preferably contains at least one selected from the group consisting of a fluorine atom, a silicon atom, or a $CH_3$ partial structure contained in a side chain moiety of a resin. Further, the hydrophobic resin includes the repeating units containing fluorine atoms in the amount of preferably 0% to 20% by mole, more preferably 0% to 10% by mole, still more preferably 0% to 5% by mole, particularly preferably 0% to 3% by mole, and ideally 0% by mole, that is, containing no fluorine atom, with respect to all the repeating units. The hydrophobic resin preferably includes a repeating unit having at least one $CH_3$ partial structure in the side chain moiety, more preferably includes a repeating unit having at least two $CH_3$ partial structures in the side chain moiety, and still more preferably includes a repeating unit having at least three $CH_3$ partial structures in the side chain moiety. The hydrophobic resin is preferably a solid at normal temperature (25° C.). Incidentally, the glass transition temperature (Tg) is preferably 50° C. to 250° C., more preferably 70° C. to 250° C., still more preferably 80° C. to 250° C., particularly preferably 90° C. to 250° C., and most preferably 100° C. to 250° C. The hydrophobic resin preferably has a repeating unit having a monocyclic or polycyclic cycloalkyl group. The monocyclic or polycyclic cycloalkyl group may be included in any one of the main chain and the side chain of the repeating unit. The hydrophobic resin more preferably has a repeating unit having both of a monocyclic or polycyclic cycloalkyl group and a $CH_3$ partial structure, and still more preferably has a repeating unit having both of a monocyclic or polycyclic cycloalkyl group and a $CH_3$ partial structure in the side chain.

The weight-average molecular weight of the hydrophobic resin (D) in terms of standard polystyrene is preferably 1,000 to 100,000, more preferably 1,000 to 50,000, and still more preferably 2,000 to 15,000.

Furthermore, the hydrophobic resin (D) may be used alone or in combination of a plurality of kinds thereof.

The content of the hydrophobic resin (D) in the composition is generally 0.01% to 30% by mass, preferably 0.01% to 10% by mass, more preferably 0.05% to 8% by mass, and still more preferably 0.1% to 7% by mass, with respect to the total solid contents of the resist composition of the present invention.

(E) Basic Compound

The resist composition preferably contains a basic compound (E) in order to reduce a change in performance over time from exposure to heating.

Preferred examples of the basic compound include compounds having structures represented by Formulae (A) to (E).

(A)

-continued

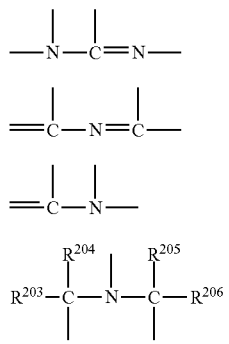

In General Formulae (A) to (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms), in which $R^{201}$ and $R^{202}$ may be bonded to each other to form a ring.

With respect to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

The alkyl group in General Formulae (A) to (E) is more preferably unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine.

Examples of the aniline derivative having a hydroxyl group and/or an ether bond include N,N-bis(hydroxyethyl)aniline.

Furthermore, as the basic compound, those described as a basic compound which may be contained in the composition (topcoat composition) for forming an upper layer film which will be described later can be suitably used.

These basic compounds may be used alone or in combination of two or more kinds thereof.

The amount of the basic compound to be used is usually 0.001% to 10% by mass, and preferably 0.01% to 5% by mass, with respect to the solid content of the resist composition.

The ratio between the photoacid generator to the basic compound to be used in the resist composition is preferably the photoacid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern with aging after exposure until the heat treatment. The photoacid generator/basic compound (molar ratio) is more preferably 5.0 to 200, and still more preferably 7.0 to 150.

(F) Surfactant

The resist composition preferably further contains a surfactant (F), and more preferably contains either one or two or more of fluorine- and/or silicon-based surfactants (a fluorine-based surfactant, a silicon-based surfactant, or a surfactant containing both a fluorine atom and a silicon atom).

By incorporating the surfactant (F) into the resist composition, it becomes possible to form a resist pattern which is decreased in adhesiveness and development defects with good sensitivity and resolution at the time of using an exposure light source of 250 nm or less, and particularly 220 nm or less.

Examples of the fluorine- and/or silicon-based surfactants include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), JP2002-277862A, U.S. Pat. Nos. 5,405,720A, 5,360,692A, 5,529,881A, 5,296,330A, 5,436,098A, 5,576,143A, 5,294,511A, and 5,824,451A, and the following commercially available surfactants may be used as they are.

Examples of the commercially available surfactants that can be used include fluorine-based surfactants or silicon-based surfactants such as EFTOP EF301 and EF303 (manufactured by Shin-Akita Kasei K. K.); FLORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.); TROYSOL S-366 (manufactured by Troy Chemical Industries); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); and FTX-204G, 208G, 218G, 230G, 204D, 208D, 212D, 218D, and 222D (manufactured by NEOS COMPANY LIMITED). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant using a polymer having a fluoroaliphatic group derived from a fluoroaliphatic compound which is produced by a telomerization method (also referred to as a telomer method) or an oligomerization method (also referred to as an oligomer method), can be used as the surfactant. The fluoroaliphatic compound can be synthesized in accordance with the method described in JP2002-90991A.

As the polymer having a fluoroaliphatic group, copolymer of monomers having fluoroaliphatic groups and (poly(oxyalkylene)) acrylate and/or (poly(oxyalkylene)) methacrylate are preferable, and they may be distributed at random or may be block copolymerized. Further, examples of the poly(oxyalkylene) group include a poly(oxyethylene) group, a poly(oxypropylene) group, and a poly(oxybutylene) group. Incidentally, the polymers may be units having alkylenes different in chain length in the same chain length, such as a poly(block combination of oxyethylene, oxypropylene, and oxybutylene), and poly(block combination of oxyethylene and oxypropylene). In addition, the copolymers of monomers having fluoroaliphatic groups and (poly(oxyalkylene)) acrylate (or methacrylate) may not be only binary copolymers but also ternary or higher copolymers obtained by copolymerization of monomers having different two or more kinds of fluoroaliphatic groups or different two or more kinds of (poly(oxyalkylene)) acrylates (or methacrylates) or the like at the same time.

Examples of the commercially available surfactant include MEGAFACE F178, F-470, F-473, F-475, F-476, and F-472 (manufactured by DIC Corp.); a copolymer of an acrylate (or methacrylate) having a $C_6F_{13}$ group with a (poly(oxyalkylene)) acrylate (or methacrylate); and a copolymer of an acrylate (or methacrylate) having a $C_3F_7$ group with a (poly(oxyethylene)) acrylate (or methacrylate) and a (poly(oxypropylene)) acrylate (or methacrylate).

Moreover, in the present invention, surfactants other than fluorine- and/or silicon-based surfactants can also be used. Specific examples thereof include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

These surfactants may be used alone or in combination of some kinds thereof.

The amount of the surfactant (F) to be used is preferably 0.01% to 10% by mass, and more preferably 0.1% to 5% by mass, with respect to the total amount (excluding the solvent) of the resist composition.

(G) Onium Carboxylate Salt

The resist composition may contain an onium carboxylate salt (G). Examples of the onium carboxylate salt include a sulfonium carboxylate salt, an iodonium carboxylate salt, and an ammonium carboxylate salt. In particular, as the onium carboxylate salt (G), an iodonium salt and a sulfonium salt are preferable. Further, it is preferable that the carboxylate residue of the onium carboxylate salt (G) does not contain an aromatic group and a carbon-carbon double bond. As an anionic moiety, a linear, branched, or monocyclic or polycyclic alkylcarboxylate anion having 1 to 30 carbon atoms is particularly preferable. Further, a carboxylate anion in which a part or all of the alkyl groups are substituted with fluorine is more preferable. An oxygen atom may be contained in the alkyl chain, by which the transparency to the light at 220 nm or less is ensured, thus, sensitivity and resolving power are enhanced, and density dependency and exposure margin are improved.

Examples of the fluorine-substituted carboxylate anion include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid.

These onium carboxylate salts (G) can be synthesized by reacting sulfonium hydroxide, iodonium hydroxide, or ammonium hydroxide and carboxylic acid with silver oxide in an appropriate solvent.

The content of the onium carboxylate salt (G) in the composition is generally 0.1% to 20% by mass, preferably 0.5% to 10% by mass, and more preferably 1% to 7% by mass, with respect to the total solid contents of the resist composition.

(H) Other Additives

The resist composition can further contain a dye, a plasticizer, a light sensitizer, a light absorbent, an alkali-soluble resin, a dissolution inhibitor, a compound that promotes solubility in a developer (for example, a phenol compound with a molecular weight of 1,000 or less, an alicyclic or aliphatic compound having a carboxyl group), and the like, as desired.

Such a phenol compound having a molecular weight of 1,000 or less may be easily synthesized by those skilled in the art with reference to the method described in, for example, JP1992-122938A (JP-H04-122938A), JP1990-28531A (JP-H02-28531A), U.S. Pat. No. 4,916,210A, EP219294B, and the like.

Specific examples of the alicyclic or aliphatic compound having a carboxyl group include, but are not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

[Composition (Topcoat Composition) for Forming Upper Layer Film]

Next, a composition (topcoat composition) for forming an upper layer film, for forming an upper layer film (topcoat), which is used in the pattern forming method of the present invention, will be described. Further, the present invention also relates to the composition for forming an upper layer film.

As mentioned above, by forming a topcoat containing a specific resin and a compound in the pattern forming method of the present invention, it is possible to improve CDU uniformity, EL, and DOF.

The topcoat composition used in the pattern forming method of the present invention is preferably a composition containing a resin, a compound, and a solvent, which will be described later, in order to form the composition uniformly on the resist film.

<Solvent>

In order to form a good pattern while not dissolving the resist film, it is preferable that the topcoat composition in the present invention contains a solvent in which the resist film is not dissolved, and it is more preferable that a solvent with components different from an organic developer is used.

Furthermore, from the viewpoint of the prevention of elution into an immersion liquid, low solubility in an immersion liquid is preferred, and low solubility in water is more preferable. In the present specification, the description of "having low solubility in an immersion liquid" represents insolubility in an immersion liquid. Similarly, "having low solubility in water" means insolubility in water. Further, from the viewpoints of volatility and coatability, the boiling point of the solvent is preferably 90° C. to 200° C.

The description of "having low solubility in an immersion liquid" indicates that in an example of the solubility in water, in a case where a topcoat composition is coated on a silicon wafer and dried to form a film, and then the film is immersed in pure water at 23° C. for 10 minutes, the decrease rate in the film thickness after drying is within 3% of the initial film thickness (typically 50 nm).

In the present invention, from the viewpoint of uniformly applying the topcoat, a solvent having a concentration of the solid contents of 0.01% to 20% by mass, more preferably 0.1% to 15% by mass, and most preferably 1% to 10% by mass is used.

The solvent that can be used is not particularly limited as long as it can dissolve the resin which will be described later and does not dissolve the resist film, but suitable examples thereof include an alcohol-based solvent, an ether-based solvent, an ester-based solvent, a fluorine-based solvent, and a hydrocarbon-based solvent, with a non-fluorinated alcohol-based solvent being more preferably used. Thus, the non-dissolving property for the resist film is further enhanced and in a case where the topcoat composition is coated on the resist film, a topcoat can be more uniformly formed without dissolving the resist film. The viscosity of the solvent is preferably 5 centipoises (cP) or less, more preferably 3 cP or less, still more preferably 2 cP or less, and particularly preferably 1 cP or less. Further, centipoises can be converted into pascal seconds according to the following formula: 1,000 cP=1 Pa·s.

From the viewpoint of coatability, the alcohol-based solvent is preferably a monohydric alcohol, and more preferably a monohydric alcohol having 4 to 8 carbon atoms. As the monohydric alcohol having 4 to 8 carbon atoms, a linear, branched, or cyclic alcohol may be used, but a linear or branched alcohol is preferable. As such an alcohol-based solvent, for example, alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; glycol ethers such as ethylene glycol monomethyl ether, propylene glycol monomethyl ether, diethylene glycol monomethyl ether, triethylene glycol monoethyl ether, and methoxymethylbutanol; or the like can be used. Among those, alcohol and glycol ether are preferable, and 1-butanol, 1-hexanol, 1-pentanol, 3-methyl-1-butanol, 4-methyl-1-pentanol, 4-methyl-2-pentanol, and propylene glycol monomethyl ether are more preferable.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among these, a fluorinated alcohol and a fluorinated hydrocarbon-based solvent can be suitably used.

Examples of the hydrocarbon-based solvent include aromatic hydrocarbon-based solvents such as toluene, xylene, and anisole; and aliphatic hydrocarbon-based solvents such as n-heptane, n-nonane, n-octane, n-decane, 2-methylheptane, 3-methylheptane, 3,3-dimethylhexane, 2,3,4-trimethylpentane, decane, and undecane.

Examples of the ether-based solvent include dioxane, tetrahydrofuran, and isoamyl ether, in addition to the glycol ether-based solvents. Among these ether-based solvents, the ether-based solvents having branched structures are preferable.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate. Among the ester-based solvents, the ester-based solvents having branched structures are preferable.

These solvents may be used alone or in mixture of a plurality thereof.

In a case of mixing a solvent other than the above-mentioned solvents, the mixing ratio is usually 0% to 30% by mass, preferably 0% to 20% by mass, and still more preferably 0% to 10% by mass, with respect to the total amount of the solvent of the topcoat composition. By mixing a solvent other than the above-mentioned solvents, the solubility for the resist film, the solubility of the resin in the topcoat composition, the elution characteristics from the resist film, or the like can be appropriately adjusted.

<Resin Having C Log P(Poly) of 3.0 or More>

The composition for forming an upper layer film contains a resin having a C log P(Poly) of 3.0 or more (also referred to as a resin (X)).

Here, the C log P(Poly) is a sum of productions of the value of C log P of each monomer corresponding to each repeating unit included in the resin with the molar fraction of each repeating unit. The expression, the monomer corresponding to the repeating unit, indicates that the repeating unit is obtained by the polymerization of the monomers. In a case of blending two or more kinds of resins having different values of C log(Poly), the value of C log(Poly) of each resin is converted into a mass average.

As the C log P of the monomer, a value calculated using Chem Draw Ultra 8.0 Apr. 23, 2003 (manufactured by Cambridge Corporation) is used.

By the following equation, the C log P(Poly) of the resin can be determined.

$$C \log P(\text{Poly}) = C \log P \text{ of monomer } A \times \text{Compositional ratio of repeating unit } A + C \log P \text{ of monomer } B \times \text{Compositional ratio of repeating unit } B + \ldots$$

In the equation, the resin is constituted with the repeating units A and B, and the monomers A and B correspond to the repeating units A and B, respectively.

The resin having a C log P(Poly) of 3.0 or more preferably has a C log P(Poly) of 3.8 or more, and more preferably has a C log P(Poly) of 4.0 or more. In addition, the C log P(Poly) of the resin is preferably 10 or less, and more preferably 7 or less.

The resin having a C log P(Poly) of 3.0 or more preferably contains a repeating unit obtained by the polymerization of monomers represented by General Formula (2).

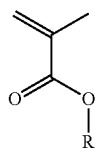

General Formula (2)

In General Formula (2), R represents an alkyl group having 5 to 20 carbon atoms, a cycloalkyl group having 5 to 20 carbon atoms, or an aryl group.

The alkyl group, the cycloalkyl group, or the aryl group represented by R may have a substituent, and examples of the substituent include an alkyl group, a fluorine atom, a silicon atom, and a cyano group.

The resin having a C log P(Poly) of 3.0 or more preferably contains at least one repeating unit having 4 methyl groups.

Hereinafter, specific examples of the monomer corresponding to the repeating unit included in the resin having a C log P(Poly) of 3.0 or more are shown below, but are not limited thereto. Since the resin only needs to have a C log P(Poly) of 3.0 or more, it is not necessary for the C log P's of the monomers corresponding to all of the repeating units to be 3.0 or more. That is, the resin may include the repeating unit obtained by the polymerization of the monomers having C log P of less than 3.0.

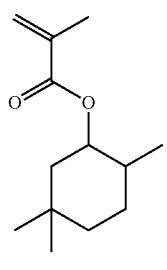

XM-1

ClogP; 4.70

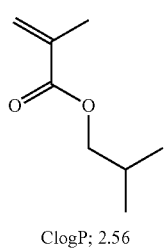

XM-2

ClogP; 2.56

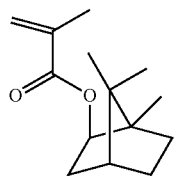

XM-3

ClogP; 4.97

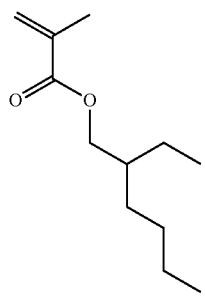

XM-4

ClogP; 4.68

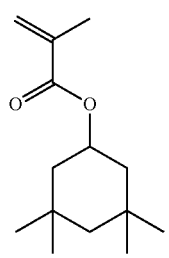

XM-5

ClogP; 5.21

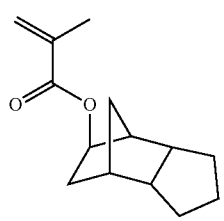

XM-6

ClogP; 4.29

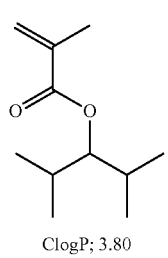

XM-7

ClogP; 3.80

-continued
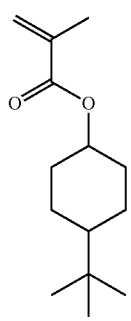
ClogP; 4.98
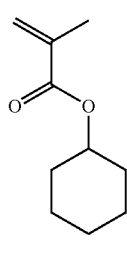
ClogP; 3.14
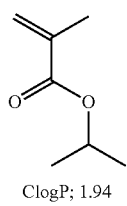
ClogP; 1.94
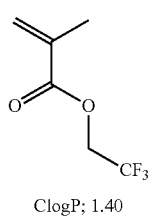
ClogP; 1.40
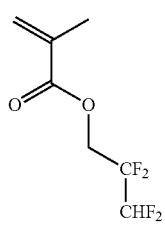
ClogP; 2.20
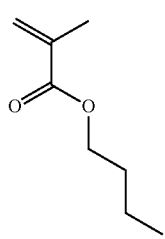
ClogP; 2.69
Next, specific examples of the combination and the compositional ratio (molar fraction) of the monomers used in the resin having a C log P(Poly) of 3.0 or more are shown below, but are not limited thereto.
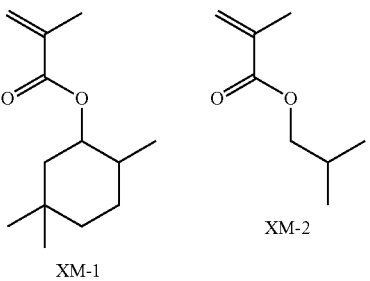
(X-1)
XM-1   XM-2
80:20
ClogP(Poly);4.3
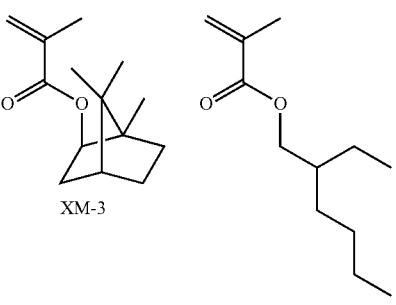
(X-2)
XM-3   XM-4
90:10
ClogP(Poly);4.9
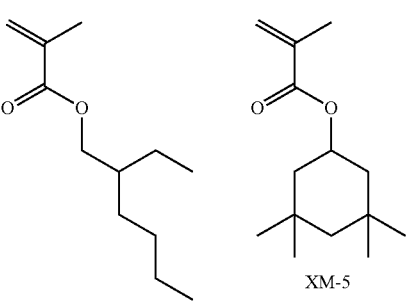
(X-3)
XM-4   XM-5
30:70
ClogP(Poly);5.1
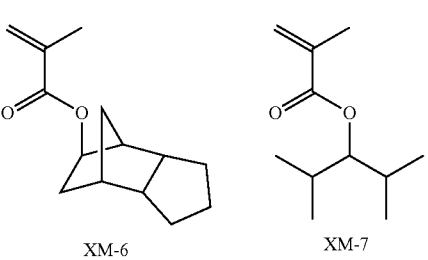
(X-4)
XM-6   XM-7
60:40
ClogP(Poly);4.1

-continued
(X-5)
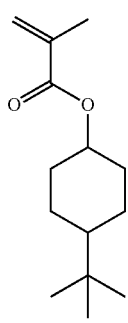
XM-8
100
ClogP(Poly);5.0
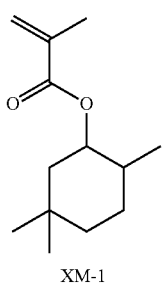 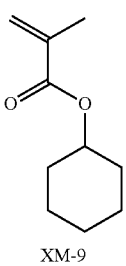
XM-1　　　　XM-9
80:20
ClogP(Poly);4.4
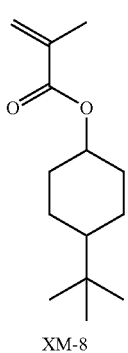 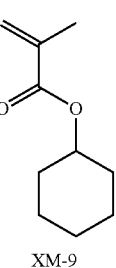
XM-8　　　XM-9
40:60
ClogP(Poly);3.9
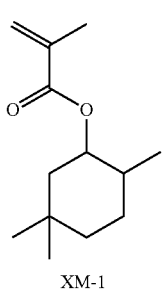 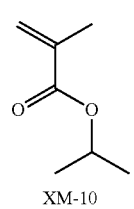
XM-1　　XM-9　　XM-10
50:30:20
ClogP(Poly);3.7
-continued
(X-5)
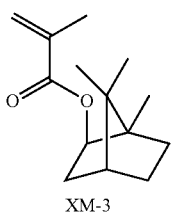 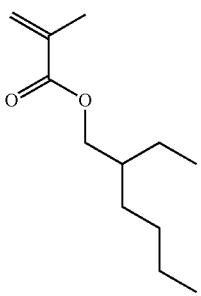 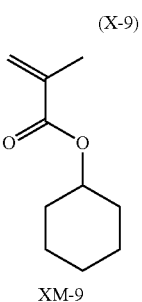
XM-3　　XM-4　　XM-9
40:30:30
ClogP(Poly);4.3
(X-6)
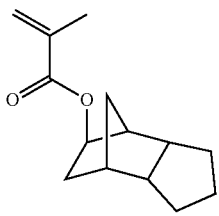 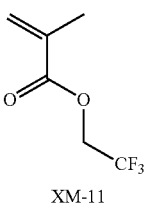
XM-6　　XM-11
90:10
ClogP(Poly);4.0
(X-7)
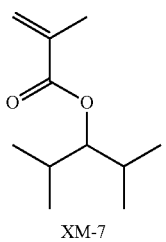 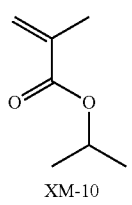 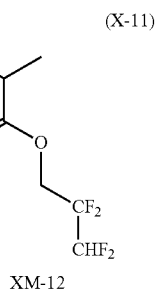
XM-7　　XM-10　　XM-12
65:30:5
ClogP(Poly);3.2
(X-8)
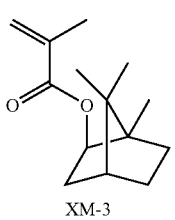 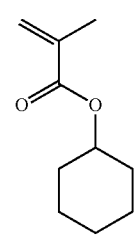 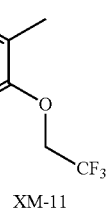
XM-3　　XM-9　　XM-11
40:20:40
ClogP(Poly);3.2

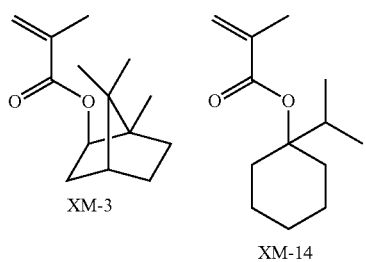

XM-3

XM-14

80:20
ClogP(Poly);4.9

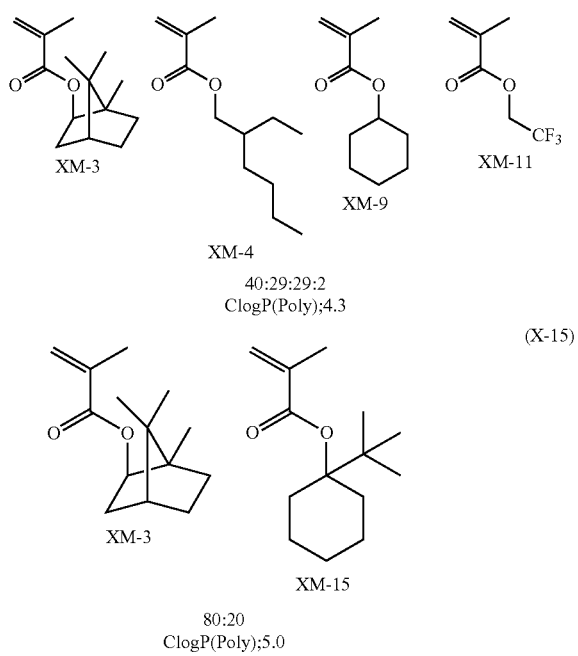

XM-3

XM-4

XM-9

XM-11

40:29:29:2
ClogP(Poly);4.3

XM-3

XM-15

80:20
ClogP(Poly);5.0

The resin having a C log P(Poly) of 3.0 or more may be a resin having a repeating unit having an acid-decomposable group. The acid-decomposable group is the same as those as mentioned above.

The resin having a C log P(Poly) of 3.0 or more is preferably dissolved in a solvent in the composition for forming an upper layer film.

The resin having a C log P(Poly) of 3.0 or more shows a weight-average molecular weight of 3,000 to 200,000, and the weight-average molecular weight is preferably 5,000 to 100,000, more preferably 5,500 to 50,000, and still more preferably 6,000 to 20,000.

The weight-average molecular weight of the resin having a C log P(Poly) of 3.0 or more is measured as a value in terms of polystyrene by means of a gel permeation chromatography (GPC) method.

The conditions for GPC are as follows.
Type of columns: TSK gel Multipore HXL-M (manufactured by TOSOH Corporation, 7.8 mmID×30.0 cm)
Developing solvent: Tetrahydrofuran (THF)
Column temperature: 40° C.
Flow rate: 1 ml/min•Amount of sample to be injected: 10 μl
Device name: HLC-8120 (manufactured by TOSOH Corporation)

Various commercially available products may be used as the resin in the composition for forming an upper layer film in the present invention, or the resin may be synthesized by a conventional method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethyl formamide and dimethyl acetamide; and solvents which dissolve the resist composition of the present invention, such as propylene glycol monomethyl ether acetate, propylene glycol monomethyl ether, and cyclohexanone.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferable examples of the initiators include azobisisobutyronitrile, azobisdimethylvaleronitrile, and dimethyl 2,2'-azobis(2-methyl propionate). If necessary, a chain transfer agent can also be used. The concentration of the reactant is usually 5% to 50% by mass, preferably 20% to 50% by mass, and more preferably 30% to 50% by mass. The reaction temperature is usually 10° C. to 150° C., preferably 30° C. to 120° C., and more preferably 60° C. to 100° C.

After the completion of the reaction, cooling is carried out to room temperature, and purification is carried out. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a re-precipitation method in which a residual monomer or the like is removed by adding a resin solution dropwise to a poor solvent to coagulate the resin in the poor solvent, or a purification method in a solid state in which filtered resin slurry is washed with a poor solvent can be applied to the purification. For example, by bringing into contact with a solvent (poor solvent), which poorly dissolves or does not dissolve the resin, corresponding to 10 times or less the volume amount of the reaction solution, or preferably 5 times to 10 times the volume amount of the reaction solution, the resin is solidified and precipitated.

The solvent to be used in the precipitation or reprecipitation procedure from the polymer solution (precipitation or reprecipitation solvent) may be an arbitrary one so long as it is a poor solvent to the polymer. Depending on the kind of the polymer, it may be appropriately selected from, for example, a hydrocarbon (for example, an aliphatic hydrocarbon such as pentane, hexane, heptane, and octane; an alicyclic hydrocarbon such as cyclohexane and methylcyclohexane; and an aromatic hydrocarbon such as benzene, toluene, and xylene), a halogenated hydrocarbon (for example, a halogenated aliphatic hydrocarbon such as methylene chloride, chloroform, and carbon tetrachloride; and a halogenated aromatic hydrocarbon such as chlorobenzene and dichlorobenzene), a nitro compound (for example, nitromethane and nitroethane), a nitrile (for example, acetonitrile and benzonitrile), an ether (for example, a chain ether such as diethyl ether, diisopropyl ether, and dimethoxyethane; and a cyclic ether such as tetrahydrofuran and dioxane), a ketone (for example, acetone, methyl ethyl ketone, and diisobutyl ketone), an ester (for example, ethyl acetate and butyl acetate), a carbonate (for example, dimethyl carbonate, diethyl carbonate, ethylene carbonate, and propylene carbonate), an alcohol (for example, methanol, ethanol, propanol, isopropyl alcohol, and butanol), a carboxylic acid (acetic acid and the like), water, and a mixed solvent containing these solvents. Among these, the precipitation or reprecipitation solvent is preferably a solvent containing at least an alcohol (particularly methanol and the like) or water. In such a solvent containing at least a hydrocarbon, the ratio of the alcohol (particularly, methanol and the like) to other solvents (for example, an ester such as ethyl acetate, and ethers such as tetrahydrofuran) is approximately, for example, the former/the latter (volume ratio; 25° C.) ranging from 10/90 to 99/1, preferably the former/the latter (volume ratio; 25° C.) ranging from 30/70 to 98/2, more preferably the former/the latter (volume ratio; 25° C.) ranging from 50/50 to 97/3.

The amount of the precipitation or reprecipitation solvent to be used may be appropriately selected by taking into consideration efficiency, yield, or the like. In general, it is used in an amount of from 100 to 10,000 parts by mass, preferably from 200 to 2,000 parts by mass, and more preferably from 300 to 1,000 parts by mass, with respect to 100 parts by mass of the polymer solution.

In a case of feeding the polymer solution into a precipitation or reprecipitation solvent (poor solvent), the nozzle pore diameter is preferably 4 mmϕ or less (for example, 0.2 to 4 mmϕ) and the feeding rate (dropwise addition rate) of the polymer solution into the poor solvent is, for example, in terms of a linear velocity, approximately 0.1 to 10 m/sec, and preferably 0.3 to 5 m/sec.

The precipitation or reprecipitation procedure is preferably carried out under stirring. Examples of the stirring blade which can be used for the stirring include a disc turbine, a fan turbine (including a paddle), a curved vane turbine, an arrow feather turbine, a Pfaudler type, a bull margin type, an angled vane fan turbine, a propeller, a multistage type, an anchor type (or horseshoe type), a gate type, a double ribbon type, and a screw type. It is preferable that the stirring is further carried out for 10 minutes or more, in particular, 20 minutes or more, after the completion of feeding of the polymer solution. In a case where the stirring time is too short, the monomer content in the polymer particles may not be sufficiently reduced in some cases. Further, the mixing and stirring of the polymer solution and the poor solvent may also be carried out by using a line mixer instead of the stirring blade.

Although the temperature in a case of the precipitation or reprecipitation can be appropriately selected by taking into consideration efficiency or performance, the temperature is usually approximately 0° C. to 50° C., preferably in the vicinity of room temperature (for example, approximately 20° C. to 35° C.). The precipitation or reprecipitation procedure may be carried out by using a commonly employed mixing vessel such as stirring tank according to a known method such as a batch system and a continuous system.

The precipitated or reprecipitated particulate polymer is usually subjected to commonly employed solid-liquid separation such as filtration and centrifugation and then dried before using. The filtration is carried out by using a solvent-resistant filter material preferably under elevated pressure. The drying is carried out under normal pressure or reduced pressure (preferably under reduced pressure) at a temperature of approximately 30° C. to 100° C., and preferably approximately 30° C. to 50° C.

Furthermore, after the resin is once precipitated and separated, it may be redissolved in a solvent and then brought into contact with a solvent in which the resin is sparingly soluble or insoluble.

That is, the method may include, after the completion of a radical polymerization reaction, precipitating a resin by bringing the polymer into contact with a solvent in which the polymer is sparingly soluble or insoluble (step I), separating the resin from the solution (step II), dissolving the resin in a solvent again to prepare a resin solution A (step III), then precipitating a resin solid by bringing the resin solution A into contact with a solvent in which the resin is sparingly soluble or insoluble and which is in a volume amount of less than 10 times (preferably a volume amount of 5 times or less) the resin solution A (step IV), and separating the precipitated resin (step V).

As the solvent used in a case of the preparation of the resin solution A, the same solvent as the solvent for dissolving the monomer in a case of the polymerization reaction may be used, and the solvent may be the same as or different from each other from the solvent used in a case of the polymerization reaction.

The resin having a C log P(Poly) of 3.0 or more may be used alone or in combination of a plurality of kinds thereof.

The blend amount of the resin having a C log P(Poly) of 3.0 or more in the entire topcoat composition is preferably 50% to 99.9% by mass, more preferably 70% to 99.7% by mass, and still more preferably 80% to 99.5% by mass, with respect to the total solid contents.

The concentration of the solid contents of the topcoat composition is preferably 0.1% to 10.0% by mass, more preferably 0.5% to 8.0% by mass, and still more preferably 1.0% to 5.0% by mass.

The topcoat composition further contains at least one compound selected from the group consisting of (A1) to (A4) below.

(A1) A basic compound or a base generator (A2) A compound containing a bond or group selected from the group consisting of an ether bond, a thioether bond, a hydroxyl group, a thiol group, a carbonyl bond, and an ester bond (A3) An ionic compound (A4) A compound having a radical trapping group The molecular weight of at least one compound selected from the group consisting of (A1) to (A4) is preferably 100 to 3,000.

<(A1) Basic Compound or Base Generator>

It is preferable that the topcoat composition further contains at least one of a basic compound or a base generator (hereinafter also collectively referred to as an "additive" or a "compound (A1)" in some cases).

(Basic Compound)

The basic compound which can be contained in the topcoat composition is preferably an organic basic compound, and more preferably a nitrogen-containing basic compound. For example, the basic compounds described as the basic compound which may be contained in the resist composition of the present invention can be used, and specific suitable examples thereof include the compounds having the structures represented by Formulae (A) to (E).

In addition, for example, the compounds which are classified into (1) to (7) below can be used.

(1) Compound Represented by General Formula (BS-1)

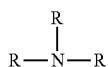
(BS-1)

In General Formula (BS-1),

R's each independently represent a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but is normally 1 to 20, and preferably 1 to 12.

The number of carbon atoms in the cycloalkyl group as R is not particularly limited, but is normally 3 to 20, and preferably 5 to 15.

The number of carbon atoms in the aryl group as R is not particularly limited, but is normally 6 to 20, and preferably 6 to 10. Specific examples thereof include a phenyl group and a naphthyl group.

The number of carbon atoms in the aralkyl group as R is not particularly limited, but is normally 7 to 20, and preferably 7 to 11. Specifically, examples thereof include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxyl group, a carboxy group, an alkoxy group, an aryloxy group, an alkylcarbonyloxy group, and an alkyloxycarbonyl group.

Furthermore, it is preferable that at least two of R's in the compound represented by General Formula (BS-1) are organic groups.

Specific examples of the compound represented by General Formula (BS-1) include tri-n-butylamine, tri-isopropylamine, tri-n-pentylamine, tri-n-octylamine, tri-n-decylamine, triisodecylamine, dicyc lohexylmethylamine, tetradecylamine, pentadecylamine, hexadecylamine, octadecylamine, didecylamine, methyl octadecylamine, dimethylundecylamine, N,N-dimethyldodecylamine, methyl dioctadecylamine, N,N-dibutylaniline, N,N-dihexylaniline, 2,6-diisopropylaniline, and 2,4,6-tri(t-butyl)aniline.

In addition, as the preferable basic compound represented by General Formula (BS-1), an alkyl group in which at least one R is substituted with a hydroxyl group is exemplified. Specific examples thereof include triethanolamine and N,N-dihydroxyethylaniline.

Moreover, the alkyl group as R may have an oxygen atom in the alkyl chain. That is, an oxyalkylene chain may be formed. As the oxyalkylene chain, —$CH_2CH_2O$— is preferable. Specific examples thereof include tris(methoxyethoxyethyl)amine and a compound disclosed after line 60 of column 3 in the specification of U.S. Pat. No. 6,040,112A.

Examples of the basic compound represented by General Formula (BS-1) include the following ones.

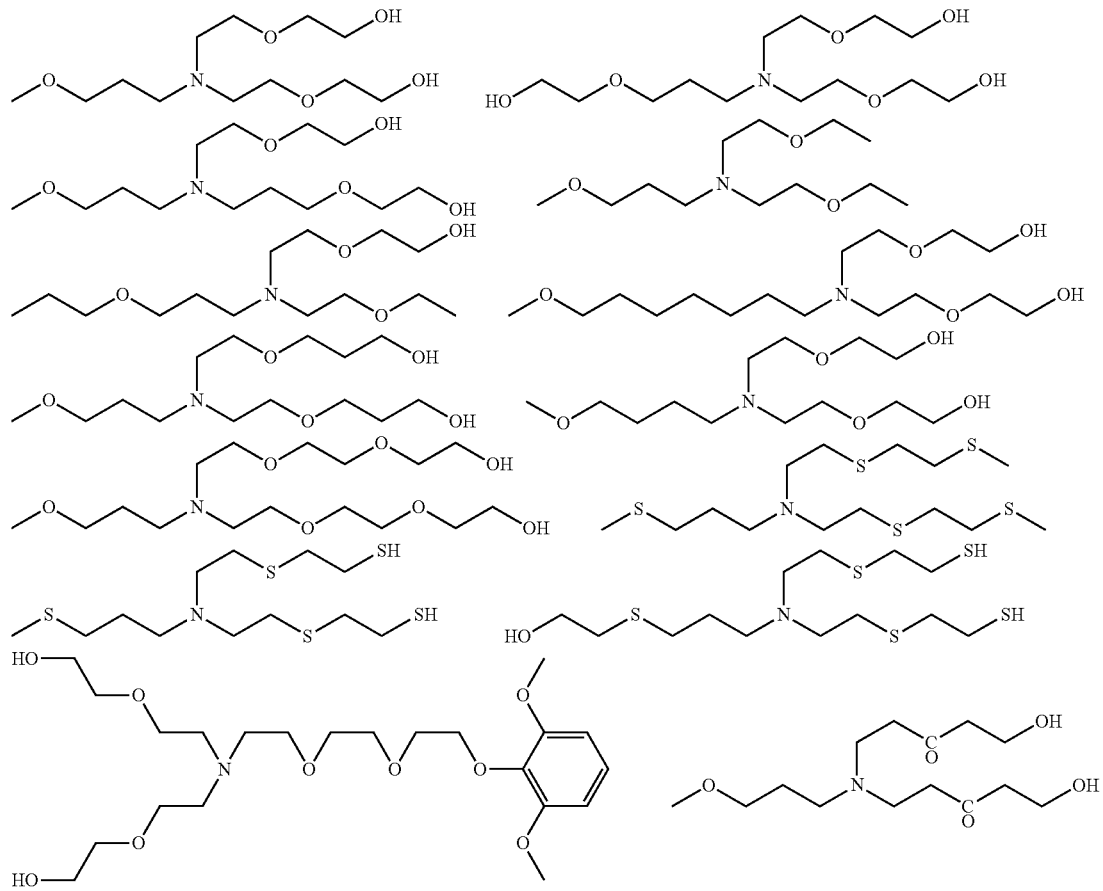

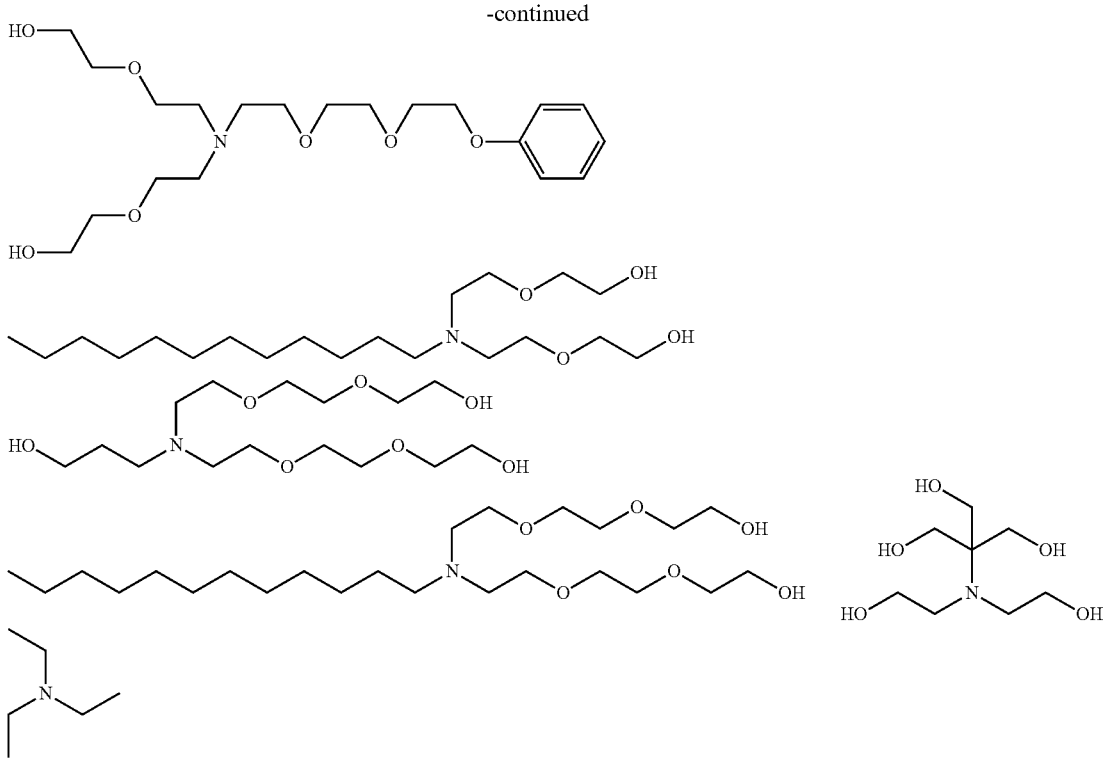

(2) Compound Having Nitrogen-Containing Heterocyclic Structure

The nitrogen-containing heterocycle may have aromatic properties, or may not have aromatic properties. The nitrogen-containing heterocycle may have a plurality of nitrogen atoms. Furthermore, the nitrogen-containing heterocycle may contain heteroatoms other than the nitrogen atom. Specific examples thereof include a compound having an imidazole structure (2-phenylbenzimidazole, 2,4,5-triphenylimidazole, and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

Furthermore, a compound having two or more ring structures is suitably used. Specific examples thereof include 1,5-diazabicyclo[4.3.0]non-5-ene and 1,8-diazabicyclo[5.4.0]undec-7-ene.

(3) Amine Compound Having Phenoxy Group

An amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, and an aryloxy group.

This compound more preferably has at least one oxyalkylene chain between the phenoxy group and the nitrogen atom. The number of oxyalkylene chains in one molecule is preferably 3 to 9, and more preferably 4 to 6. Among the oxyalkylene chains, —CH$_2$CH$_2$O— is particularly preferable.

Specific examples thereof include 2-[2-{2-(2,2-dimethoxyphenoxyethoxy)ethyl}-bis-(2-methoxyethyl)]amine and the compounds (C1-1) to (C3-3) exemplified in paragraph [0066] in the specification of US2007/0224539A1.

An amine compound having a phenoxy group is obtained by, for example, heating a mixture of a primary or secondary amine having a phenoxy group and an haloalkyl ether to be reacted, by adding an aqueous solution of a strong base such as sodium hydroxide, potassium hydroxide, and tetraalkylammonium thereto, and by extracting the resultant product with an organic solvent such as ethyl acetate and chloroform. In addition, an amine compound having a phenoxy group can also be obtained by heating a mixture of a primary or secondary amine and an haloalkyl ether having a phenoxy group at the terminal to be reacted, by adding an aqueous solution of a strong base such as sodium hydroxide, potassium hydroxide, and tetraalkylammonium thereto, and by extracting the resultant product with an organic solvent such as ethyl acetate and chloroform.

(4) Ammonium Salt

An ammonium salt can also be appropriately used as the basic compound. Examples of the anion of the ammonium salt include halide, sulfonate, borate, and phosphate. Among these, halide and sulfonate are particularly preferable.

As the halide, chloride, bromide, and iodide are particularly preferable.

As the sulfonate, an organic sulfonate having 1 to 20 carbon atoms is particularly preferable. Examples of the organic sulfonate include alkyl sulfonate and aryl sulfonate having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, or a cyclohexyl group is preferable. Examples of other substituents include an alkoxy group having 1 to 6 carbon atoms, a halogen atom, a cyano group, a nitro group, an acyl group, and an acyloxy group.

The ammonium salt may be a hydroxide or a carboxylate. In this case, the ammonium salt is particularly preferably tetraalkylammonium hydroxide (tetraalkylammonium hydroxide such as tetramethylammonium hydroxide, tetraethylammonium hydroxide, and tetra-(n-butyl)ammonium hydroxide) having 1 to 8 carbon atoms.

Preferred examples of the basic compound include guanidine, aminopyridine, aminoalkylpyridine, aminopyrrolidine, indazole, imidazole, pyrazole, pyrazine, pyrimidine, purine, imidazoline, pyrazoline, piperazine, am inomorpholine, and aminoalkylmorpholine. These may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred examples of the basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-am inoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

(5) Compound (PA) That Has Proton-Accepting Functional Group and Generates Compound in Which Proton-Accepting Properties Are Reduced or Lost, or Which Is Changed from Having Proton Accepting Properties to Be Acidic, by Being Decomposed upon Irradiation with Actinic Rays or Radiation The composition according to the present invention may further include, as a basic compound, a compound [hereinafter also referred to as a compound (PA)] that has a proton-accepting functional group and generates a compound in which proton-accepting properties are reduced or lost, or which is changed from having proton accepting properties to be acidic, by decomposing upon irradiation with actinic rays or radiation.

The proton-accepting functional group refers to a functional group having a group or electron which is capable of electrostatically interacting with a proton, and for example, means a functional group with a macrocyclic structure, such as a cyclic polyether; or a functional group containing a nitrogen atom having an unshared electron pair not contributing to it-conjugation. The nitrogen atom having an unshared electron pair not contributing to rt-conjugation is, for example, a nitrogen atom having a partial structure represented by the following general formula.

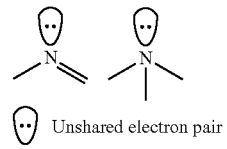

(⋅⋅) Unshared electron pair

Preferred examples of the partial structure of the proton-accepting functional group include crown ether, azacrown ether, primary to tertiary amines, pyridine, imidazole, and pyrazine structures.

The compound (PA) decomposes upon irradiation with actinic rays or radiation to generate a compound exhibiting deterioration in proton-accepting properties, no proton-accepting properties, or a change from the proton-accepting properties to acid properties. Here, exhibiting deterioration in proton-accepting properties, no proton-accepting properties, or a change from the proton-accepting properties to acid properties means a change of proton-accepting properties due to the proton being added to the proton-accepting functional group, and specifically a decrease in the equilibrium constant at chemical equilibrium in a case where a proton adduct is generated from the compound (PA) having the proton-accepting functional group and the proton.

The proton-accepting properties can be confirmed by carrying out pH measurement. In the present invention, the acid dissociation constant pKa of the compound generated by the decomposition of the compound (PA) upon irradiation with actinic rays or radiation preferably satisfies pKa<−1, more preferably −13<pKa<−1, and still more preferably −13<pKa<−3.

In the present invention, the acid dissociation constant pKa indicates an acid dissociation constant pKa in an aqueous solution, and is described, for example, in Chemical Handbook (II) (Revised 4$^{th}$ Edition, 1993, compiled by the Chemical Society of Japan, Maruzen Inc.), and a lower value thereof indicates higher acid strength. Specifically, the acid dissociation constant pKa in an aqueous solution may be measured by using an infinite-dilution aqueous solution and measuring the acid dissociation constant at 25° C., or a value based on the Hammett substituent constants and the database of publicly known literature value data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by General Formula (PA-1), for example, as the proton adduct generated by decomposition upon irradiation with actinic rays or radiation. The compound represented by General Formula (PA-1) is a compound exhibiting deterioration in proton-accepting properties, no proton-accepting properties, or a change from the proton-accepting properties to acid properties since the compound has a proton-accepting functional group as well as an acidic group, as compared with the compound (PA).

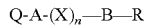 (PA-1)

In General Formula (PA-1),

Q represents —SO$_3$H, —CO$_2$H, or —X$_1$NHX$_2$Rf, in which Rf represents an alkyl group, a cycloalkyl group, or an aryl group, and X$_1$ and X$_2$ each independently represent —SO$_2$— or —CO—.

A represents a single bond or a divalent linking group.

X represents —SO$_2$— or —CO—.

n is 0 or 1.

B represents a single bond, an oxygen atom, or —N(Rx)Ry-, in which Rx represents a hydrogen atom or a monovalent organic group, and Ry represents a single bond or a divalent organic group, provided that Rx may be bonded to Ry to form a ring or may be bonded to R to form a ring.

R represents a monovalent organic group having a proton-accepting functional group.

General Formula (PA-1) will be described in more detail.

The divalent linking group in A is preferably a divalent linking group having 2 to 12 carbon atoms, such as and examples thereof include an alkylene group and a phenylene group. The divalent linking group is more preferably an alkylene group having at least one fluorine atom, preferably having 2 to 6 carbon atoms, and more preferably having 2 to 4 carbon atoms. The alkylene chain may contain a linking group such as an oxygen atom and a sulfur atom. In particular, the alkylene group is preferably an alkylene group in which 30% to 100% by number of the hydrogen atoms are substituted with fluorine atoms, and more preferably the carbon atom bonded to the Q site has a fluorine atom. The alkylene group is still more preferably a perfluoroalkylene group, and even still more preferably a perfluoroethylene group, a perfluoropropylene group, or a perfluorobutylene group.

The monovalent organic group in Rx is preferably an organic group having 1 to 30 carbon atoms, and examples thereof include an alkyl group, a cycloalkyl group, an aryl group, an aralkyl group, and an alkenyl group. These groups may further have a substituent.

The alkyl group in Rx may have a substituent, is preferably a linear and branched alkyl group having 1 to 20 carbon atoms, and may have an oxygen atom, a sulfur atom, or a nitrogen atom in the alkyl chain.

Preferred examples of the divalent organic group in Ry include an alkylene group.

Other examples include a ring structure which may be formed by the mutual bonding of Rx and Ry include 5- to 10-membered rings, and particularly preferably 6-membered rings, each of which contains a nitrogen atom.

Furthermore, examples of the alkyl group having a substituent include a group formed by substituting a cycloalkyl group on a linear or branched alkyl group (for example, an adamantylmethyl group, an adamantylethyl group, a cyclohexylethyl group, and a camphor residue).

The cycloalkyl group in Rx may have a substituent, is preferably a cycloalkyl group having 3 to 20 carbon atoms, and may have an oxygen atom in the ring.

The aryl group in Rx may have a substituent, is preferably an aryl group having 6 to 14 carbon atoms.

The aralkyl group in Rx may have a substituent, is preferably an aralkyl group having 7 to 20 carbon atoms.

The alkenyl group in Rx may have a substituent and examples of the alkenyl group include a group having a double bond at an arbitrary position of the alkyl group mentioned as Rx.

The proton-accepting functional group in R is the same as described above, and examples thereof include groups having nitrogen-containing heterocyclic aromatic structures or the like, such as azacrown ether, primary to tertiary amines, pyridine, and imidazole.

As the organic group having such a structure, ones having 4 to 30 carbon atoms are preferable, and examples thereof include an alkyl group, a cycloalkyl group, an aryl group, an aralkyl group, and an alkenyl group.

The alkyl group, the cycloalkyl group, the aryl group, the aralkyl group, and the alkenyl group in the alkyl group, the cycloalkyl group, the aryl group, the aralkyl group, and the alkenyl group, each including a proton-accepting functional group or an ammonium group in R are the same as the alkyl group, the cycloalkyl group, the aryl group, the aralkyl group, and the alkenyl group, respectively, mentioned as Rx.

Examples of the substituent which may be contained in each of the groups include a halogen atom, a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). With regard to the cyclic structure and the aminoacyl group in the aryl group, the cycloalkyl group, or the like, examples of the substituent further include an alkyl group (preferably having 1 to 20 carbon atoms).

In a case where B is —N(Rx)Ry-, it is preferable that R and Rx are bonded to each other to form a ring. The formation of a ring structure improves the stability and enhances the storage stability of a composition using the same. The number of carbon atoms which form a ring is preferably 4 to 20, the ring may be monocyclic or polycyclic, and an oxygen atom, and a sulfur atom, or a nitrogen atom may be contained in the ring.

Examples of the monocyclic structure include a 4-membered ring, a 5-membered ring, a 6-membered ring, a 7-membered ring, and a 8-membered ring, each containing a nitrogen atom, or the like. Examples of the polycyclic structure include structures formed by a combination of two or three, or more monocyclic structures. The monocyclic structure or the polycyclic structure may have a substituent, and as the substituent, for example, a halogen atom, a hydroxyl group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), an aminoacyl group (preferably having 2 to 20 carbon atoms), or the like is preferable. With regard to the cyclic structure in the aryl group, the cycloalkyl group, or the like, examples of the substituent include an alkyl group (preferably having 1 to 15 carbon atoms). With regard to the aminoacyl group, examples of the substituent further include an alkyl group (preferably having 1 to 15 carbon atoms).

Rf in —X$_1$NHX$_2$Rf represented by Q is preferably an alkyl group having 1 to 6 carbon atoms, which may have a fluorine atom, and more preferably a perfluoroalkyl group having 1 to 6 carbon atoms. Further, it is preferable that at least one of $X_1$ or $X_2$ is —$SO_2$—, with a case where both $X_1$ and $X_2$ are —$SO_2$— being more preferable.

The compound represented by General Formula (PA-1) in which the Q site is sulfonic acid can be synthesized by a common sulfonamidation reaction. For example, the compound can be synthesized by a method in which one sulfonyl halide moiety of a bissulfonyl halide compound is selectively reacted with an amine compound to form a sulfonamide bond, and then the another sulfonyl halide moiety thereof is hydrolyzed, or a method in which a cyclic sulfonic acid anhydride is reacted with an amine compound to cause ring opening.

The compound (PA) is preferably an ionic compound. The proton-accepting functional group may be contained in an anion moiety or a cation moiety, and it is preferable that the functional group is contained in an anion moiety.

Preferred examples of the compound (PA) include compounds represented by General Formulae (4) to (6).

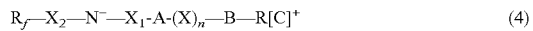    (4)

    (5)

    (6)

In General Formulae (4) to (6), A, X, n, B, R, $R_f$, $X_1$, and $X_2$ each have the same definitions as in General Formula (PA-1).

$C^+$ represents a counter cation.

As the counter cation, an onium cation is preferable. More specifically, in the photoacid generator, preferred examples thereof include a sulfonium cation (arylsulfonium compound) described as $S^+(R_{201})(R_{202})(R_{203})$ in General Formula (ZI) and those described in General Formula (ZII).

Specific examples of the compound (PA) include, but are not limited to, the compounds described in paragraphs [0743] to [0750] of JP2013-83966A.

Furthermore, in the present invention, compounds (PA) other than a compound that generates the compound represented by General Formula (PA-1) can also be appropriately selected. For example, a compound containing a proton acceptor moiety at its cationic moiety may be used as an ionic compound. More specific examples thereof include a compound represented by General Formula (7).

    (7)

In the formula, A represents a sulfur atom or an iodine atom.

m represents 1 or 2 and n represents 1 or 2, provided that m+n=3 in a case where A is a sulfur atom and that m+n=2 in a case where A is an iodine atom.

R represents an aryl group.

$R_N$ represents an aryl group substituted with the proton-accepting functional group.

$X^-$ represents a counter anion.

Specific examples of $X^-$ include the same ones as $X^-$ in General Formula (ZI) as described above.

Specific preferred examples of the aryl group of R and $R_N$ include a phenyl group.

Specific examples of the proton-accepting functional group, contained in $R_N$, are the same as the proton-accepting functional groups described above in Formula (PA-1).

In the composition of the present invention, the blend ratio of the compound (PA) in the entire composition is preferably 0.1% to 10% by mass, and more preferably 1% to 8% by mass in the total solid content.

(6) Guanidine Compound

The composition of the present invention may include, as a basic compound, a compound [hereinafter also referred to as a compound (PA)] that has a proton-accepting functional group and decomposes upon irradiation with actinic rays or radiation to generate a compound in which proton-accepting properties are reduced or lost, or which is changed from being proton-accepting properties to be acidic.

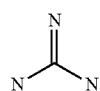

The guanidine compound exhibits strong basicity since the positive charge of the conjugate acid is dispersed and stabilized by three nitrogen atoms.

For the basicity of the guanidine compound (A) of the present invention, the pKa of a conjugate acid is preferably 6.0 or more, more preferably 7.0 to 20.0 since neutralization reactivity with an acid is high and the roughness properties are excellent, and still more preferably 8.0 to 16.0.

Such strong basicity can suppress the diffusibility of an acid and contributes to formation of an excellent pattern shape.

In the present invention, the log P is a logarithmic value of an n-octanol/water distribution coefficient (P), and with respect to a wide range of compounds, it is an effective parameter that can characterize the hydrophilicity/hydrophobicity. In general, the distribution coefficient is determined not by experiment but by calculation, and in the present invention, the distribution coefficient is a value calculated by a CS Chem Draw Ultra Ver. 8.0 software package (Crippen's fragmentation method).

In addition, the log P of the guanidine compound (A) is preferably 10 or less. In a case where the log P is the above value or less, the guanidine compound (A) can be uniformly contained in a resist film.

The log P of the guanidine compound (A) in the present invention is preferably in a range of 2 to 10, more preferably in a range of 3 to 8, and particularly preferably in a range of 4 to 8.

Furthermore, it is preferable that the guanidine compound (A) in the present invention has no nitrogen atom other than the guanidine structure.

Specific examples of the guanidine compound include the compounds described in paragraphs [0765] to [0768] of JP2013-83966A, but are not limited thereto.

(7) Low Molecular Compound Having Nitrogen Atom and Group that Leaves by Action of Acid The composition of the present invention can include a low molecular compound (hereinafter referred to as a "low molecular compound (D)" or a "compound (D)") which has a nitrogen atom, and a group that leaves by the action of an acid. The low molecular compound (D) preferably has basicity after the group that leaves by the action of an acid leaves therefrom.

The group that leaves by the action of an acid is not particularly limited, but an acetal group, a carbonate group, a carbamate group, a tertiary ester group, a tertiary hydroxyl group, or a hemiaminal ether group is preferable, and a carbamate group or a hemiaminal ether group is particularly preferable.

The molecular weight of the low molecular compound (D) having a group that leaves by the action of an acid is preferably 100 to 1,000, more preferably 100 to 700, and particularly preferably 100 to 500.

As the compound (D), an amine derivative having a group that leaves by the action of an acid on a nitrogen atom is preferable.

The compound (D) may also have a carbamate group having a protecting group on a nitrogen atom. The protecting group constituting the carbamate group can be represented by General Formula (d-1).

$$\text{(d-1)}$$

In General Formula (d-1),

R''s each independently represent a hydrogen atom, a linear or branched alkyl group, a cycloalkyl group, an aryl group, an aralkyl group, or an alkoxyalkyl group. R''s may be bonded to each other to form a ring.

R' is preferably a linear or branched alkyl group, a cycloalkyl group, or an aryl group, and more preferably a linear or branched alkyl group or a cycloalkyl group.

Specific structures of such a group are shown below.

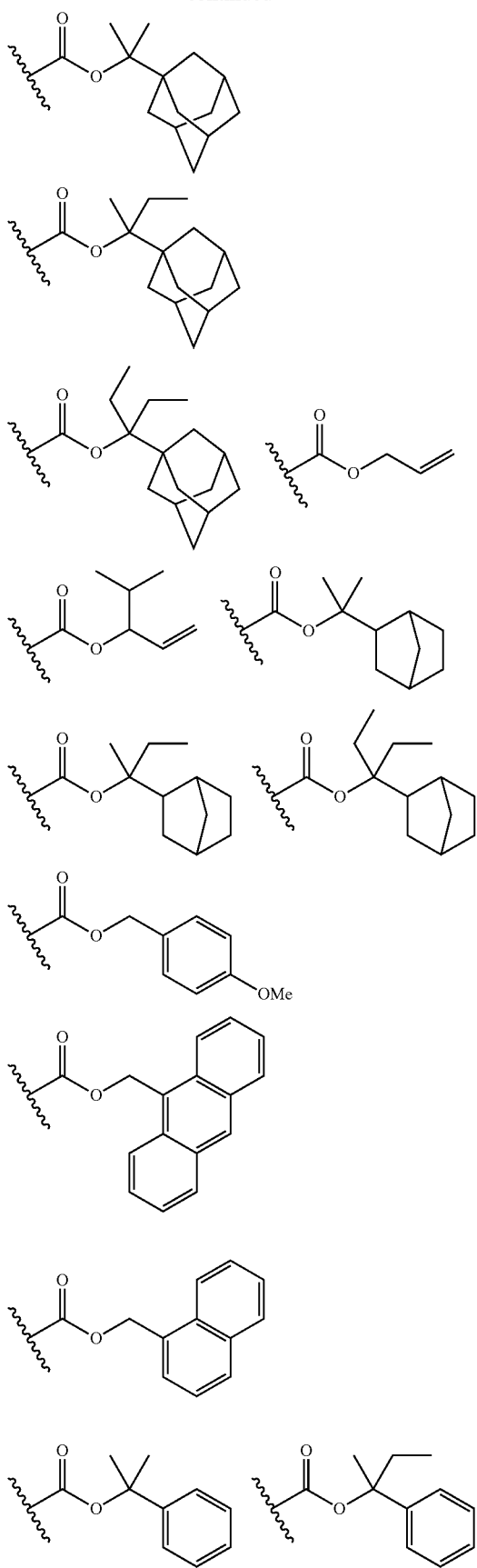
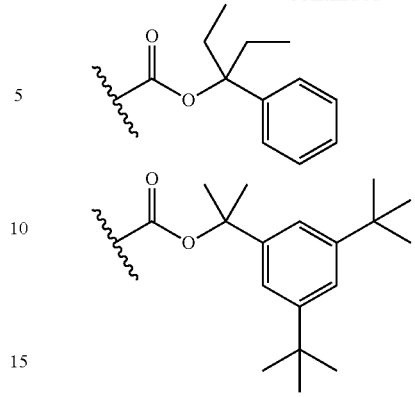

The compound (D) may also be constituted with arbitrarily combining a basic compound which will be described later with the structure represented by General Formula (d-1).

The compound (D) is particularly preferably a compound having a structure represented by General Formula (J).

Incidentally, the compound (D) may be a compound corresponding to the basic compound described above as long as it is a low molecular compound having a group that leaves by the action of an acid.

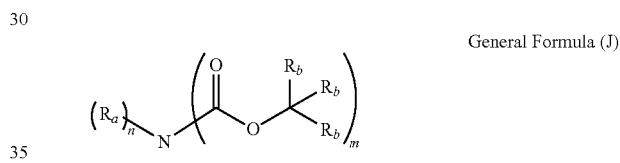

General Formula (J)

In General Formula (J), $R_a$ represents a hydrogen atom, an alkyl group, a cycloalkyl group, an aryl group, or an aralkyl group. Further, with n=2, two $R_a$'s may be the same as or different from each other, and two $R_a$'s may be bonded to each other to form a divalent heterocyclic hydrocarbon group (preferably having 20 or less carbon atoms) or a derivative thereof.

$R_b$'s each independently represent a hydrogen atom, an alkyl group, a cycloalkyl group, an aryl group, an aralkyl group, or an alkoxyalkyl group, provided that in a case where one or more $R_b$ in —C($R_b$)($R_b$)($R_b$) are hydrogen atoms, at least one of the remaining $R_b$'s is a cyclopropyl group, a 1-alkoxyalkyl group, or an aryl group.

At least two $R_b$'s may be bonded to each other to form an alicyclic hydrocarbon group, an aromatic hydrocarbon group, a heterocyclic hydrocarbon group, or a derivative thereof.

n represents an integer of 0 to 2, and m represents an integer of 1 to 3, with n+m=3.

In General Formula (J), the alkyl group, the cycloalkyl group, the aryl group, and the aralkyl group represented by $R_a$ and $R_b$ may be substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by $R_b$.

Examples of the alkyl group, the cycloalkyl group, the aryl group, and the aralkyl group (each of the alkyl group, the cycloalkyl group, the aryl group, and the aralkyl group may be substituted with the functional group, an alkoxy group, or a halogen atom) of $R_a$ and/or $R_b$ include:

a group derived from a linear or branched alkane, such as methane, ethane, propane, butane, pentane, hexane, heptane, octane, nonane, decane, undecane, and dodecane, or a group in which the group derived from an alkane is substituted with one or more kinds of or one or more groups of cycloalkyl groups such as a cyclobutyl group, a cyclopentyl group, and a cyclohexyl group;

a group derived from a cycloalkane, such as cyclobutane, cyclopentane, cyclohexane, cycloheptane, cyclooctane, norbornane, adamantane, and noradamantane, or a group in which the group derived from a cycloalkane is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from an aromatic compound, such as benzene, naphthalene, and anthracene, or a group in which the group derived from an aromatic compound is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from a heterocyclic compound, such as pyrrolidine, piperidine, morpholine, tetrahydrofuran, tetrahydropyran, indole, indoline, quinoline, perhydroquinoline, indazole, and benzimidazole, or a group in which the group derived from a heterocyclic compound is substituted with one or more kinds of or one or more groups of linear or branched alkyl groups or aromatic compound-derived groups; a group in which the group derived from a linear or branched alkane or the group derived from a cycloalkane is substituted with one or more kinds of or one or more groups of aromatic compound-derived groups such as a phenyl group, a naphthyl group, and an anthracenyl group; and a group in which the substituent above is substituted with a functional group such as a hydroxyl group, a cyano group, an amino group, a pyrrolidino group, a piperidino group, a morpholino group, and an oxo group.

Examples of the divalent heterocyclic hydrocarbon group (preferably having 1 to 20 carbon atoms) formed by the mutual bonding of Ra's, or a derivative thereof include a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1 S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, and 1,5,9-triazacyclododecane, and a group in which the group derived from a heterocyclic compound is substituted with one or more kinds of or one or more groups of a linear or branched alkane-derived group, a cycloalkane-derived group, an aromatic compound-derived group, a heterocyclic compound-derived group, and a functional group such as a hydroxyl group, a cyano group, an amino group, a pyrrolidino group, a piperidino group, a morpholino group, and an oxo group.

Specific examples of the particularly preferred compound (D) in the present invention include the compounds described in paragraphs [0786] to [0788] of JP2013-83966A, but the present invention is not limited thereto.

The compound represented by General Formula (J) can be synthesized in accordance with JP2007-298569A, JP2009-199021A, or the like.

In the present invention, the low molecular compound (D) may be used alone or as a mixture of two or more kinds thereof.

Other examples of the low molecular compound which can be used include the compounds synthesized in Examples of JP2002-363146A and the compounds described in paragraph 0108 of JP2007-298569A.

A photosensitive basic compound may also be used as the basic compound. As the photosensitive basic compound, for example, the compounds described in JP2003-524799A, J. Photopolym. Sci. & Tech., Vol. 8, pp. 543 to 553 (1995), or the like can be used.

As the basic compound, a compound called a so-called photodisintegrating base may also be used. Examples of the photodisintegrating base include an onium salt of carboxylic acid, and an onium salt of sulfonic acid having the α-position which is not fluorinated. Specific examples of the photodisintegrating base include those in paragraph 0145 of WO2014/133048A1, JP2008-158339A, and JP399146B.

[Content of Basic Compound]

The content of the basic compound in the topcoat composition is preferably 0.01% to 20% by mass, more preferably 0.1% to 10% by mass, and still more preferably 1% to 5% by mass, with respect to the solid content of the topcoat composition.

(Base Generator)

Examples of the base generator (photobase generator) which can be included in the topcoat composition include the compounds described in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-HI0-83079A), and EP622682B.

Furthermore, the compounds described in JP2010-243773A are also appropriately used.

Specific suitable examples of the photobase generator include 2-nitrobenzyl carbamate, 2,5-dinitrobenzylcyclohexyl carbamate, N-cyclohexyl-4-methylphenylsulfonamide, and 1,1-dimethyl-2-phenylethyl-N-isopropyl carbamate, but are not limited thereto.

(Content of Base Generator)

The content of the base generator in the topcoat composition is preferably 0.01% to 20% by mass, more preferably 0.1% to 10% by mass, and still more preferably 1% to 5% by mass, with respect to the solid contents of the topcoat composition.

<(A2) Compound Containing Bond or Group Selected from Group Consisting of Ether Bond, Thioether Bond, Hydroxyl Group, Thiol Group, Carbonyl Bond, and Ester Bond>

A compound (hereinafter also referred to as a "compound (A2)") including at least one group or bond selected from the group consisting of an ether bond, a thioether bond, a hydroxyl group, a thiol group, a carbonyl bond, and an ester bond will be described below.

As described above, the compound (A2) is a compound including at least one group or bond selected from the group consisting of an ether bond, a thioether bond, a hydroxyl group, a thiol group, a carbonyl bond, and an ester bond. Since the oxygen atoms or sulfur atoms included in these groups or bonds have unshared electron pairs, acids can be trapped by the interaction with the acids diffused from the actinic ray-sensitive or radiation-sensitive film.

In one aspect of the present invention, the compound (A2) preferably has two or more groups or bonds selected from the group, more preferably has 3 or more groups or bonds selected from the group, and still more preferably 4 or more groups or bonds selected from the group. In this case, groups or bonds selected from ether bonds, thioether bonds, hydroxyl groups, thiol groups, carbonyl bonds, and ester bonds included in plural numbers in the compound (A2) may be the same as or different from each other.

In one aspect of the present invention, the compound (A2) preferably has a molecular weight of 3,000 or less, more preferably has a molecular weight of 2,500 or less, still more preferably has a molecular weight of 2,000 or less, and particularly preferably has a molecular weight of 1,500 or less.

Furthermore, in one aspect of the present invention, the number of carbon atoms included in the compound (A2) is preferably 8 or more, more preferably 9 or more, and still more preferably 10 or more.

Moreover, in one aspect of the present invention, the number of carbon atoms included in the compound (A2) is preferably 30 or less, more preferably 20 or less, and still more preferably 15 or less.

Furthermore, in one aspect of the present invention, the compound (A2) is preferably a compound having a boiling point of 200° C. or higher, more preferably a compound having a boiling point of 220° C. or higher, and still more preferably a compound having a boiling point of 240° C. or higher.

Moreover, in one aspect of the present invention, the compound (A2) is preferably a compound having an ether bond, preferably a compound having 2 or more ether bonds, more preferably a compound having 3 or more ether bonds, and still more preferably a compound having 4 or more ether bonds.

In one aspect of the present invention, the compound (A2) is more preferably a compound including a repeating unit containing an oxyalkylene structure represented by General Formula (1).

(1)

In the formula, $R_{11}$ represents an alkylene group which may have a substituent, n represents an integer of 2 or more, and

* represents a bonding arm.

The number of carbon atoms of the alkylene group represented by $R_{11}$ in General Formula (1) is not particularly limited, but is preferably 1 to 15, more preferably 1 to 5, still more preferably 2 or 3, and particularly preferably 2. In a case where this alkylene group has a substituent, the substituent is not particularly limited, but is preferably, for example, an alkyl group (preferably having 1 to 10 carbon atoms).

n is preferably an integer of 2 to 20, among which an integer of 10 or less is more preferable due to an increase in DOF.

The average value of n's is preferably 20 or less, more preferably 2 to 10, still more preferably 2 to 8, and particularly preferably 4 to 6 due to an increase in DOF. Here, "the average value of n's" means the value of n determined in a case where the weight-average molecular weight of the compound (A2) is measured by GPC, and the obtained weight-average molecular weight is allowed to match the general formula. In a case where n is not an integer, it is a value rounded off to the nearest integer of the specified numerical value.

$R_{11}$'s which are present in plural numbers may be the same as or different from each other.

Furthermore, a compound having a partial structure represented by General Formula (1) is preferably a compound represented by General Formula (1-1) due to an increase in DOF.

(1-1)

In the formula, the definition, specific examples, and suitable aspects of $R_{11}$ are the same as those of $R_{11}$ in General Formula (1) as described above, respectively.

$R_{12}$ and $R_{13}$ each independently represent a hydrogen atom or an alkyl group. The number of carbon atoms of the alkyl group is not particularly limited, but is preferably 1 to 15. $R_{12}$ and $R_{13}$ may be bonded to each other to form a ring.

m represents an integer of 1 or more. m is preferably an integer of 1 to 20, and above all, is more preferably an integer of 10 or less due to an increase in DOF.

The average value of m's is preferably 20 or less, more preferably 1 to 10, still more preferably 1 to 8, and particularly preferably 4 to 6 due to an increase in DOF. Here, "the average value of m's" has the same definition as the "average value of n's" as described above.

In a case where m is 2 or more, $R_{11}$'s which are present in plural numbers may be the same as or different from each other.

In one aspect of the present invention, the compound having a partial structure represented by General Formula (1) is preferably alkylene glycol including at least two ether bonds.

The compound (A2) may be used as a commercially available product or may be synthesized according to a known method.

Specific examples of the compound (A2) are shown below, but the present invention is not limited thereto.

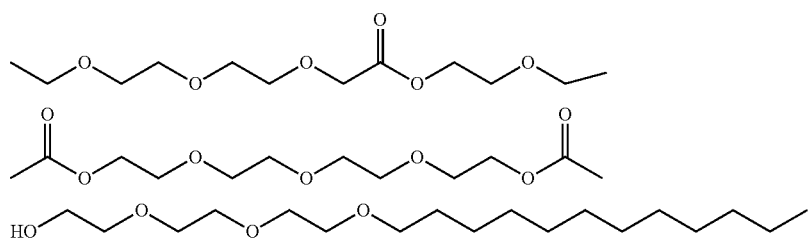

-continued
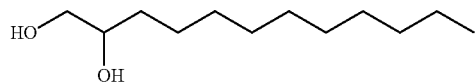
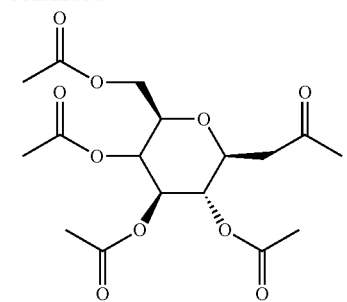
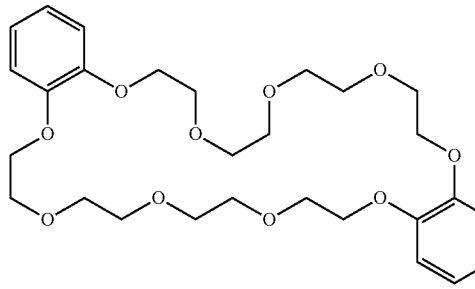
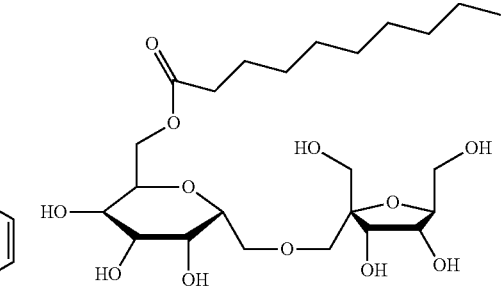
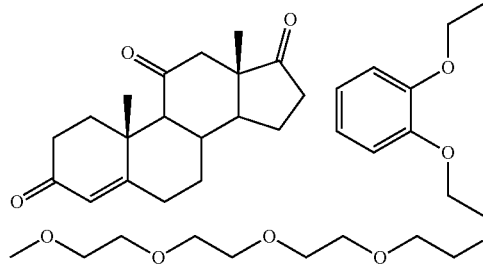
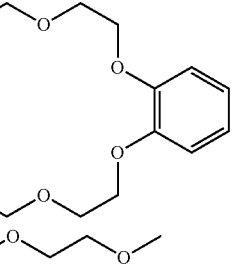
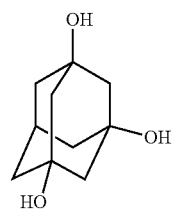
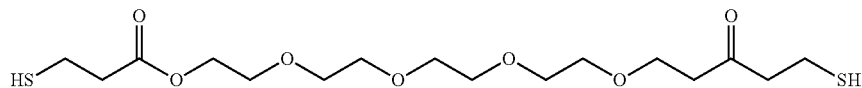
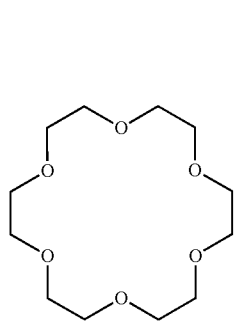
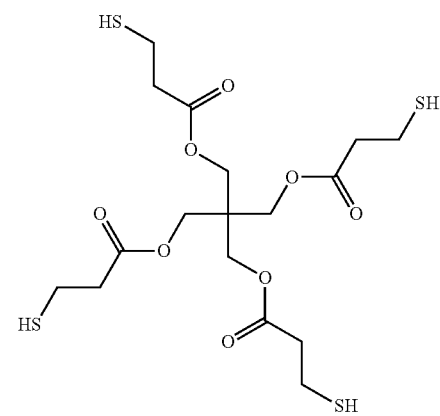
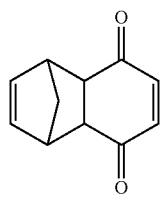
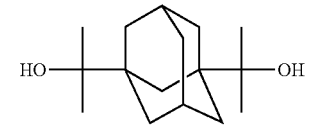
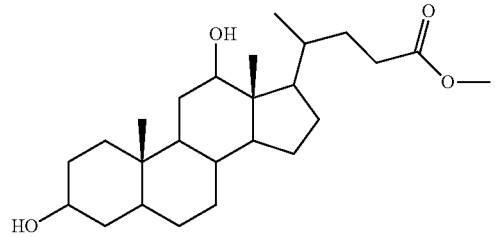

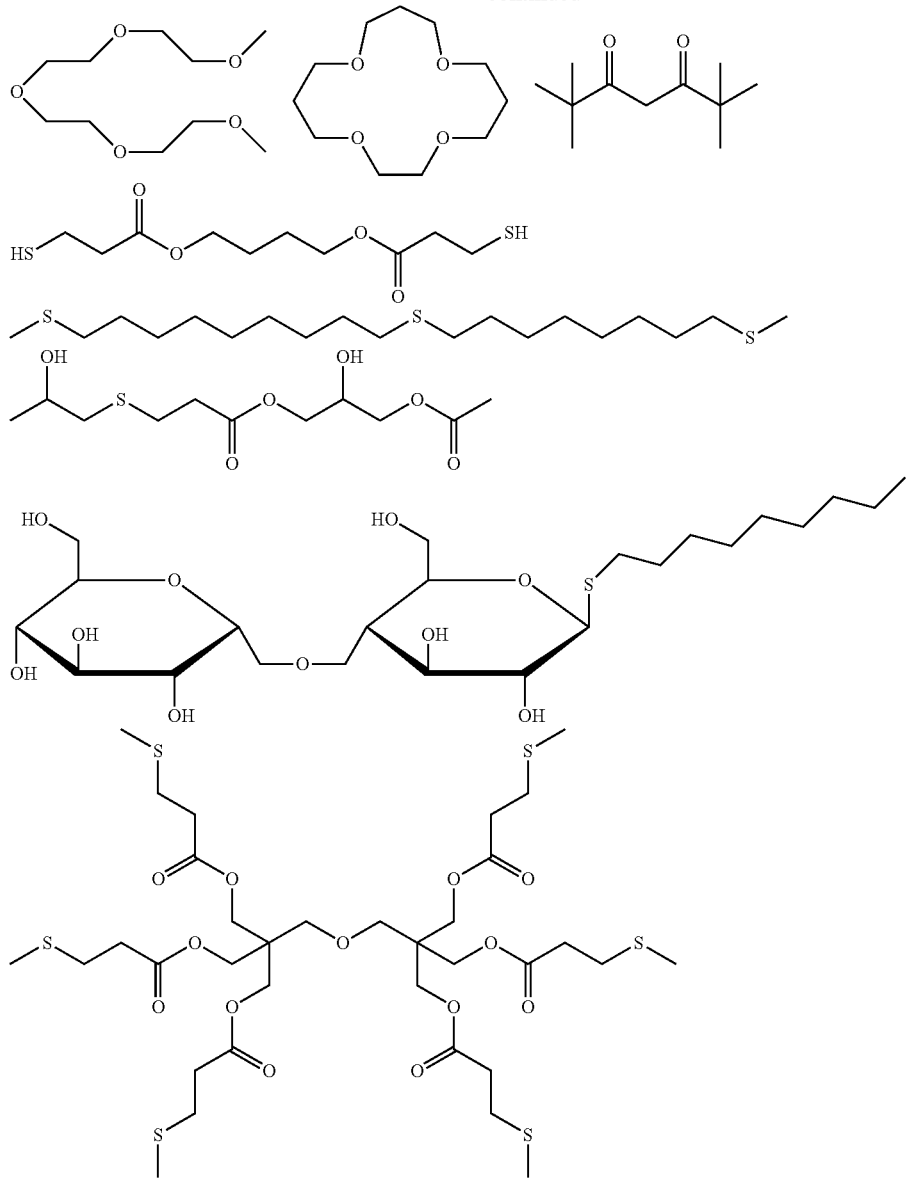

The content of the compound (A2) is preferably 0.1% to 30% by mass, more preferably 1% to 25% by mass, still more preferably 2% to 20% by mass, and particularly preferably 3% to 18% by mass, with respect to the total solid contents in the upper layer film.

<(A3) Ionic Compound>

The topcoat composition may contain an ionic compound serving as a weak acid relative to the acid generator. As the ionic compound, an onium salt is preferable. In a case where an acid generated from the acid generator upon irradiation with actinic rays or radiation collides with an onium salt having an unreacted weak anion, a weak acid is discharged by salt exchange, thereby generating an onium salt having a strong acid anion. In this process, a strong acid is exchanged with a weak acid having a lower catalytic ability, and as a result, the acid is inactivated in appearance, whereby control of acid diffusion can be performed.

The onium salt which serves as a weak acid relative to the acid generator is preferably a compound represented by each of General Formulae (d1-1) to (d1-3).

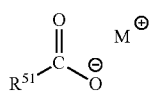 (d1-1)

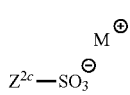 (d1-2)

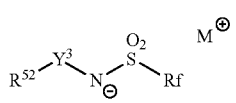 (d1-3)

In the formulae, $R^{51}$ is a hydrocarbon group which may have a substituent, $Z^{2c}$ is a hydrocarbon group having 1 to 30 carbon atoms (provided that carbon adjacent to S is not substituted with a fluorine atom) which may have a substituent, $R^{52}$ is an organic group, $Y^3$ is a linear, branched, or cyclic alkylene group or arylene group, Rf is a hydrocarbon group containing a fluorine atom, and $M^+$'s are each independently a sulfonium or iodonium cation.

Preferred examples of the sulfonium cation or iodonium cation represented by $M^+$ include the sulfonium cations exemplified in General Formula (ZI) and the iodonium cations exemplified in General Formula (ZII).

Preferred examples of the anionic moiety of the compound represented by General Formula (d1-1) include the structures exemplified in paragraph [0198] of JP2012-242799A.

Preferred examples of the anionic moiety of the compound represented by General Formula (d1-2) include the structures exemplified in paragraph [0201] of JP2012-242799A.

Preferred examples of the anionic moiety of the compound represented by General Formula (d1-3) include the structures exemplified in paragraphs [0209] and [0210] of JP2012-242799A.

The onium salt which serves as a weak acid relative to the acid generator has a (C) cation site and an anion site in the same molecule, and may also be a compound in which the cation site and the anion site are linked via a covalent bond (hereinafter also referred to as a "compound (CA)").

The compound (CA) is preferably a compound represented by any one of General Formulae (C-1) to (C-3).

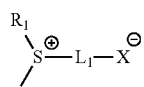
(C-1)

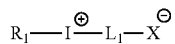
(C-2)

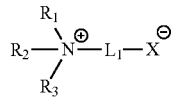
(C-3)

In General Formulae (C-1) to (C-3), $R_1$, $R_2$, and $R_3$ each represent a substituent having 1 or more carbon atoms.

$L_1$ represents a divalent linking group which links a cation site and an anion site, or a single bond.

—$X^-$ represents an anion site selected from —COO—, —SO$_3$—, —SO$_2$—, and —N—$R_4$. $R_4$ represents a monovalent substituent having a carbonyl group: —C(=O)—, a sulfonyl group: —S(=O)$_2$—, or a sulfinyl group: —S(=O)— at a site linking to an adjacent N atom.

$R_1$, $R_2$, $R_3$, $R_4$, and $L_1$ may be bonded to each other to form a ring structure. Further, in (C-3), two of $R_1$ to $R_3$ may be combined with each other to form a double bond together with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, with an alkyl group, a cycloalkyl group, or an aryl group being preferable.

Examples of $L_1$ as the divalent linking group include a linear or branched alkylene group, a cycloalkylene group, an arylene group, a carbonyl group, an ether bond, an ester bond, an amide bond, a urethane bond, a urea bond, and a group formed by combination of two or more thereof. $L_1$ is more preferably an alkylene group, an arylene group, an ether bond, an ester bond, or a group formed by combination of two or more thereof.

Preferred examples of the compound represented by General Formula (C-1) include the compounds exemplified in paragraphs [0037] to [0039] of JP2013-6827A and paragraphs [0027] to [0029] of JP2013-8020A.

Preferred examples of the compound represented by General Formula (C-2) include the compounds exemplified in paragraphs [0012] and [0013] of JP2012-189977A.

Preferred examples of the compound represented by General Formula (C-3) include the compounds exemplified in paragraphs [0029] to [0031] of JP2012-252124A.

(Content of Onium Salt)

The content of the (A3) ionic compound (preferably the onium salt) in the topcoat composition is preferably 0.5% by mass or more, more preferably 1% by mass or more, and still more preferably 2.5% by mass or more, with respect to the solid content of the topcoat composition.

On the other hand, the upper limit of the content of the (A3) ionic compound (preferably the onium salt) is preferably 25% by mass or less, more preferably 20% by mass or less, and still more preferably 10% by mass or less, and particularly preferably 8% by mass or less, with respect to the solid content of the topcoat composition.

<(A4) Compound Having Radical Trapping Group>

The (A4) compound having a radical trapping group is also referred to as a compound (A4).

The radical trapping group is a group that traps an active radical to stop a radical reaction. Examples of such a radical trapping group include a group that reacts with a radical and is converted to a stable free radical, and a group having a stable free radical. Specific suitable examples of the radical trapping group not having basicity include at least one group selected from the group consisting of a hindered phenol group, a hydroquinone group, an N-oxyl-free radical group, a nitroso group, and a nitrone group.

The number of the radical trapping groups contained in the compound (A4) is not particularly limited, but in a case where the compound (A4) is a compound other than the polymer compound, the number of radical trapping groups within one molecule is preferably 1 to 10, more preferably 1 to 5, and still more preferably 1 to 3.

On the other hand, in a case where the compound (A4) is a polymer compound having a repeating unit, the repeating unit having radical trapping groups preferably has 1 to 5 radical trapping groups, and more preferably has 1 to 3 radical trapping groups. Further, the compositional ratio of the repeating units having a radical trapping group in the polymer compound is preferably 1% to 100% by mole, more preferably 10% to 100% by mole, and still more preferably 30% to 100% by mole.

As the compound A having a radical trapping group, a compound having a nitrogen-oxygen bond is preferable for a reason that the effect of the present invention is more excellent, and a compound represented by any one of General Formulae (1) to (3) is more preferable for a reason that the effect of the present invention is more excellent.

Moreover, a compound represented by General Formula (1) corresponds to a compound having an N-oxyl-free radical group, a compound represented by General Formula (2) corresponds to a compound having a nitroso group, and a compound represented by General Formula (3) corresponds to a compound having a nitrone group.

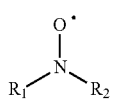  (1)

  (2)

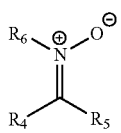  (3)

In General Formulae (1) to (3), $R_1$ to $R_6$ each independently represent an alkyl group, a cycloalkyl group, or an aryl group. In Formula (1), $R_1$ and $R_2$ may be bonded to each other to form a ring, and in Formula (3), at least two of $R_4, \ldots,$ or $R_6$ may be bonded to each other to form a ring.

The alkyl group, the cycloalkyl group, and the aryl group, represented by each of $R_1$ to $R_6$, the ring formed by the mutual bonding of $R_1$ and $R_2$, and the ring formed by the mutual bonding of at least two of $R_4, \ldots,$ or $R_6$ may have a substituent.

Examples of the alkyl group represented by each of $R_1$ to $R_6$ include a linear or branched alkyl group having 1 to 10 carbon atoms, and specific examples thereof include a methyl group, an ethyl group, an n-propyl group, an i-propyl group, an n-butyl group, a 2-methylpropyl group, a 1-methylpropyl group, a t-butyl group, an n-pentyl group, a neopentyl group, and an n-hexyl group, and among these, a methyl group, an ethyl group, an n-butyl group, or a t-butyl group is preferable.

Examples of the cycloalkyl group represented by each of $R_1$ to $R_6$ include cycloalkyl groups having 3 to 15 carbon atoms, and specific suitable examples thereof include a cyclopropyl group, a cyclobutyl group, a cyclopentyl group, a cyclohexyl group, a cycloheptyl group, a cyclooctyl group, a norbornyl group, and an adamantyl group.

Examples of the aryl group represented by each of $R_1$ to $R_6$ include aryl groups having 6 to 14 carbon atoms, and specific suitable examples thereof include a phenyl group, a tolyl group, and a naphthyl group.

The ring which may be formed by $R_1$ and $R_2$, and the ring which may be formed by $R_4$ to $R_6$ are each preferably a 5- to 10-membered ring, and more preferably a 5- or 6-membered ring.

Examples of the substituent which can be contained in the alkyl group, the cycloalkyl group, and the aryl group represented by each of $R_1$ to $R_6$, the ring formed by the bonding of $R_1$ and $R_2$, and the ring which may be formed by the bonding of at least two of $R_4, \ldots,$ or $R_6$ include a halogen atom (for example, a fluorine atom), a hydroxyl group, a carboxyl group, a cyano group, a nitro group, an amino group, oxy group, an alkoxy group, an alkoxyalkyl group, an alkoxycarbonyl group, an alkoxycarbonyloxy group, an acylamide group (RCONH—: R is a substituted or unsubstituted alkyl group or a phenyl group), —SO$_2$Na, and —P(=O)(OC$_2$H$_5$)$_2$.

Examples of the substituent which can be contained in the cycloalkyl group and the aryl group represented by each of $R_1$ to $R_6$ further include an alkyl group.

Furthermore, the compound represented by any one of General Formulae (1) to (3) may be in a form of a resin, and in this case, at least one of $R_1, \ldots,$ or $R_6$ may be bonded to the main chain or the side chain of the resin.

Specific examples of the compound having a radical trapping group are shown below, but the present invention is not limited thereto.

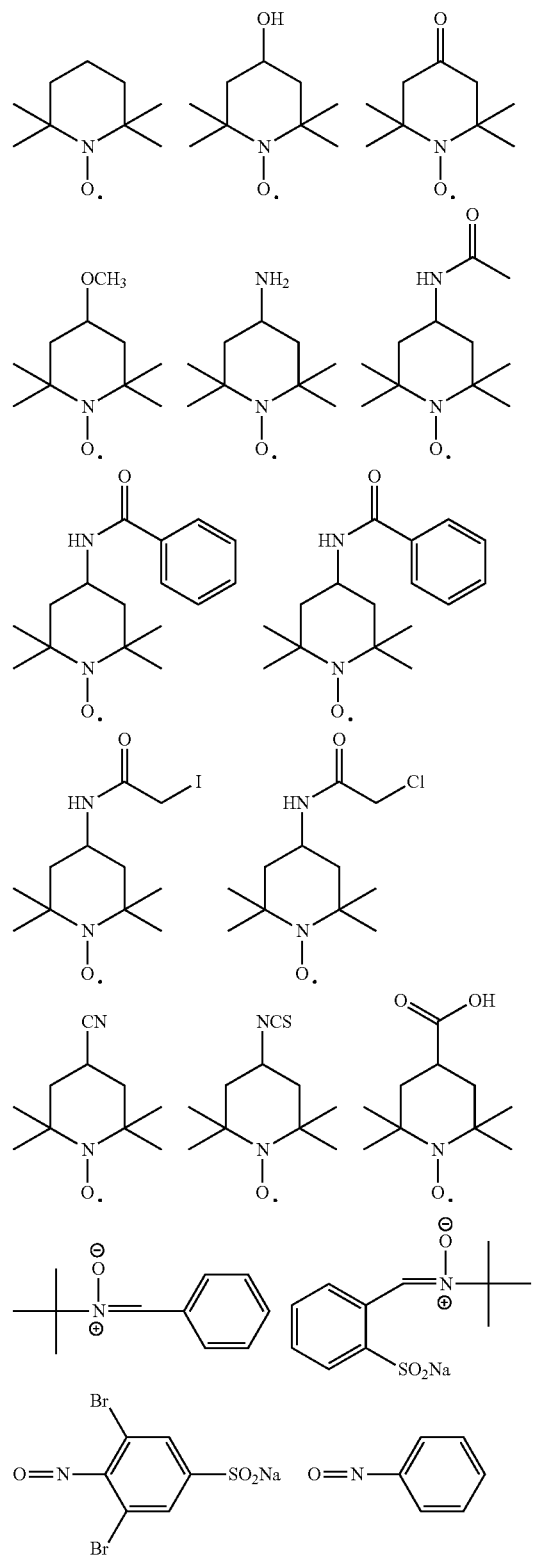

-continued

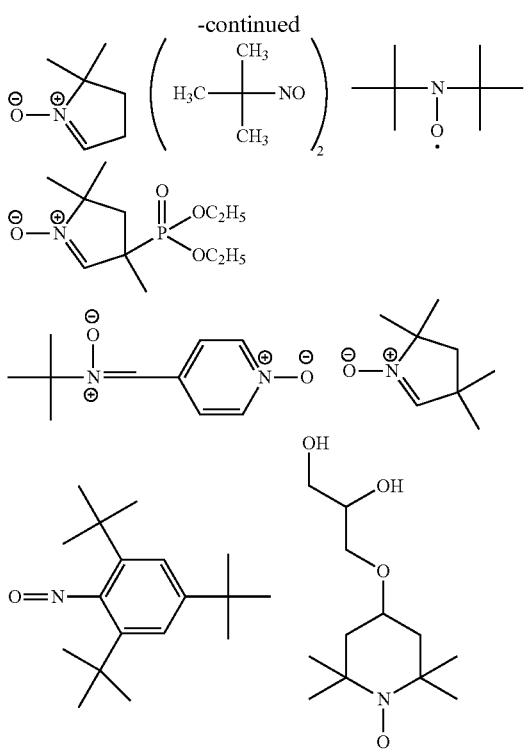

Furthermore, as mentioned above, the compound (A4) may be a polymer compound having a repeating unit. Specific examples of the repeating unit contained in the compound (A4) which is a polymer compound are shown below, but the present invention is not limited thereto.

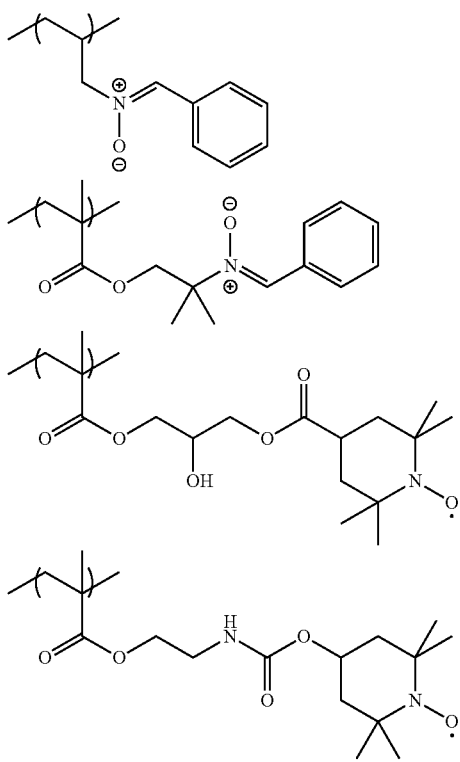

The molecular weight of the compound (low molecular compound) having a radical trapping group is not particularly limited, but is preferably 100 to 5,000, more preferably 100 to 2,000, and still more preferably 100 to 1,000.

Furthermore, in a case where the compound having a radical trapping group is a polymer compound having a repeating unit, the weight-average molecular weight is preferably 5,000 to 20,000, and more preferably 5,000 to 10,000.

As the compound having a radical trapping group, a compound that is a commercially available product may be used, and a compound synthesized by a known method may be used. Further, the compound (A4) may be synthesized by the reaction of a commercially available low molecular compound having a radical trapping group with a polymer compound having a reactive group such as an epoxy group, a halogenated alkyl group, an acid halide group, a carboxyl group, and an isocyanate group.

The content of the compound having a radical trapping group is usually 0.001% to 10% by mass, and preferably 0.01% to 5% by mass, with respect to the total solid contents of the topcoat composition of the present invention.

The topcoat composition may include a plurality of one kind of compounds selected from the group consisting of (A1) to (A4). The topcoat composition may include, for example, two or more kinds of different compounds (A1).

Moreover, the topcoat composition may contain two or more kinds of compounds selected from the group consisting of (A1) to (A4). The topcoat composition may include, for example, both the compound (A1) and the compound (A2).

In a case where the topcoat composition includes a plurality of the compounds selected from the group consisting of (A1) to (A4), the total content of the compounds is usually 0.001% to 20% by mass, preferably 0.01% to 10% by mass, and still preferably 1% to 8% by mass, with respect to the total solid content of the topcoat composition of the present invention.

<Surfactant>

The topcoat composition of the present invention may further include a surfactant.

The surfactant is not particularly limited, and any of an anionic surfactant, a cationic surfactant, and a nonionic surfactant can be used as long as it can uniformly form a film of the topcoat composition, and also be dissolved in the solvent of the topcoat composition.

The amount of surfactant to be added is preferably 0.001% to 20% by mass, and more preferably 0.01% to 10% by mass.

The surfactant may be used alone or in combination of two or more kinds thereof.

As the surfactant, for example, one selected from an alkyl cation-based surfactant, an amide-type quaternary cation-based surfactant, an ester type quaternary cation-based surfactant, an amine oxide-based surfactant, a betaine-based surfactant, an alkoxylate-based surfactant, a fatty acid ester-based surfactant, an amide-based surfactant, an alcohol-based surfactant, an ethylenediamine-based surfactant, and a fluorine- and/or silicon-based surfactant (a fluorine-based surfactant, a silicon-based surfactant, or a surfactant having both of a fluorine atom and a silicon atom) can be appropriately used.

Specific examples of the surfactant include polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and surfactants such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; and commercially available surfactants mentioned later.

Examples of the commercially available surfactants that can be used include fluorine-based surfactants or silicon-based surfactants such as EFTOP EF301 and EF303 (manufactured by Shin-Akita Kasei K. K.); FLUORAD FC430, 431, and 4430 (manufactured by Sumitomo 3M Limited); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.); TROYSOL S-366 (manufactured by Troy Chemical Industries); GF-300 and GF-150 (manufactured by Toagosei Chemical Industry Co., Ltd.); SURFLON S-393 (manufactured by AGC Seimi Chemical Co., Ltd.); EFTOP EF121, EF122A, EF122B, RF122C, EF125M, EF135M, EF351, 352, EF801, EF802, and EF601 (manufactured by JEMCO Inc.); PF636, PF656, PF6320, and PF6520 (manufactured by OMNOVA Solutions Inc.); and FTX-204D, 208G, 218G, 230G, 204D, 208D, 212D, 218, and 222D (manufactured by NEOS Co., Ltd.). In addition, Polysiloxane Polymer KP-341 (manufactured by Shin-Etsu Chemical Co., Ltd.) can also be used as the silicon-based surfactant.

<Method for Preparing Topcoat Composition>

The topcoat composition is preferably formed by dissolving the above-mentioned respective components in a solvent, and filtering the solution through a filter. The filter is preferably a polytetrafluoroethylene-, polyethylene-, or nylon-made filter having a pore size of 0.1 µm or less, more preferably 0.05 µm or less, and still more preferably 0.03 µm or less. Further, two or more kinds of filters are connected in series or in parallel, and used. Incidentally, the composition may be filtered a plurality of times, and a step of filtering plural times may be a circulatory filtration step. Incidentally, the composition may also be subjected to a deaeration treatment or the like before and after the filtration through the filter. It is preferable that the topcoat composition of the present invention does not include impurities such as a metal. The content of the metal components included in these materials is preferably 10 ppm or less, more preferably 5 ppm or less, and still more preferably 1 ppm or less, but the material substantially not having metal components (at a detection limit of a determination device or less) is particularly preferable.

[Resist Pattern]

The present invention also relates to a resist pattern formed by the pattern forming method of the present invention as mentioned above.

[Method for Manufacturing Electronic Device, and Electronic Device]

The present invention also relates to a method for manufacturing an electronic device, including the pattern forming method of the present invention as mentioned above, and an electronic device manufactured by this manufacturing method.

The electronic device of the present invention is suitably mounted in electrical or electronic equipment (household electronic appliance, office automation (OA)•media-related equipment, optical equipment, telecommunication equipment, and the like).

EXAMPLES

Hereinafter, the present invention will be described with reference to Examples, but the present invention is not limited thereto.

[Preparation of Composition for Forming Resist Film]

A resin, an acid generator, and a basic compound shown in Table 1 were dissolved at the composition shown in Table 1 in a solvent to prepare a solution at a concentration of solid contents of 3.5% by mass with respect to each of the components, and this solution was filtered through a polyethylene filter having a pore size of 0.04 µm to prepare a composition for forming a negative tone resist film. In addition, the resins (1) to (12) in the composition for forming a resist film are formed with the repeating units and compositions shown in Table 2.

[Preparation of Topcoat Composition]

The resin (X) formed from the monomers of the types shown in Table 3 and the compounds (A1) to (A4) shown in Table 4 were dissolved in a solvent shown in Table 4 to prepare a solution, and this solution was filtered through a filter having a pore size of 0.04 µm to prepare a composition for forming an upper layer film. Further, the C log P(Poly), the weight-average molecular weight (Mw), and the molecular weight distribution (Mw/Mn) of the obtained resin, and the compositional ratios (% by mole) of each repeating unit included in a resin are shown in Table 3.

(Formation of Semi-Dense Hole Pattern)

An organic antireflection film ARC29SR (manufactured by Brewer Science, Inc.) was applied onto a silicon wafer, and baking was carried out at 205° C. for 60 seconds to form an organic antireflection film having a film thickness of 86 nm. A resist composition was applied thereonto, and baking (PB: Prebake) was carried out at 100° C. over 60 seconds to form a resist film having a film thickness shown in Table 5. The composition for forming an upper layer film shown in Table 5 was applied onto the resist film, and then prebaking was carried out at 120° C. over 60 seconds to form an upper layer film having a film thickness shown in Table 5. In addition, in Examples 5, 6, 15, 16, 22, 24, 35, 36, and 42, a pre-wetting solvent shown in Table 5 was applied onto the resist film, the composition for forming an upper layer film was then applied thereonto, and prebaking was carried out at 120° C. over 60 seconds to form an upper layer film having a film thickness shown in Table 5.

The obtained wafer was subjected to pattern exposure via a halftone mask with a hole diameter of 50 nm and pitches between the holes of 250 nm, using an ArF excimer laser liquid immersion scanner (manufactured by ASML; XT1700i, NA1.20, C-Quad, outer sigma 0.900, inner sigma 0.790, and Y deflection). Ultrapure water was used as the immersion liquid. Thereafter, heating (Post Exposure Bake: PEB) was carried out at 90° C. for 60 seconds. Then, in Examples 1 to 40, development was carried out by paddling for 30 seconds using an organic developer described in Table 5, rinsing was carried out by paddling for 30 seconds using the rinsing liquid described in Table 5 (however, in Example 15, the rinsing step was not carried out). In Examples 41 and 42, the upper layer film was peeled with an organic solvent (release solution before development) shown in Table 5, development was carried out by paddling with butyl acetate for 30 seconds, and rinsing was carried out for 30 seconds with a rinsing liquid shown in Table 5. Subsequently, a hole pattern having a hole diameter of 50 nm and pitches between the holes of 250 nm was obtained by rotating the wafer at a rotation speed of 2,000 rpm for 30 seconds.

(Formation of Dense Hole Pattern)

In the same manner as for the formation of the semi-dense hole pattern, a film having an organic antireflection film, a resist film, and an upper layer film sequentially applied thereon was formed on a silicon wafer.

The obtained wafer was subjected to pattern exposure via a halftone mask with a hole diameter of 50 nm and pitches between the holes of 110 nm, using an ArF excimer laser liquid immersion scanner (manufactured by ASML; XT1700i, NA1.20, Dipole, outer sigma 0.800, inner sigma 0.564, and Y deflection). Ultrapure water was used as the immersion liquid. Thereafter, heating (Post Exposure Bake: PEB) was carried out at 105° C. for 60 seconds. Then, in Examples 1 to 40, development was carried out by paddling for 30 seconds using an organic developer described in Table 5, and rinsing was carried out by paddling for 30 seconds using the rinsing liquid described in Table 5 (however, in Example 15, the rinsing step was not carried out). In Examples 41 and 42, the upper layer film was peeled with an organic solvent (release solution before development) shown in Table 5, development was carried out by paddling with butyl acetate for 30 seconds, and rinsing was carried out for 30 seconds with a rinsing liquid shown in Table 5. Subsequently, a hole pattern having a hole diameter of 50 nm and pitches between the holes of 110 nm was obtained by rotating the wafer at a rotation speed of 2,000 rpm for 30 seconds.

<Test on Image Performance>

The following image performance test was carried out on a sample having the obtained hole pattern.

[Exposure Latitude (EL)]

In the formation of the above-mentioned dense hole pattern, the hole size was observed using a critical dimension scanning electron microscope (SEM), (S-9380II, manufactured by Hitachi, Ltd.), and the optimal exposure dose at which a hole pattern having an average hole diameter of 50 nm was resolved was defined as a sensitivity (Eopt) (mJ/cm$^2$). Then, the exposure dose in a case where the space portion became ±10% of 50 nm (that is, 45 nm and 55 nm) which was a desired value was determined, based on the determined optimal exposure dose (Eopt). Then, an exposure latitude (EL, unit: %) defined by the following equation was calculated. As the value of EL is higher, the change in performance due to a change in the exposure dose is smaller, which is thus good.

[EL (%)]=[(Exposure dose in a case where hole diameter becomes 45 nm)−(Exposure dose in a case where hole diameter becomes 55 nm)]/Eopt×100

[Depth of Focus (DOF)]

In the formation of the above-mentioned semi-dense hole pattern, first, exposure and development were carried out by changing the conditions of the exposure focus at an interval of 20 nm in the focus direction at an exposure dose for forming a hole pattern having a hole diameter of 44 nm and pitches between the holes of 250 nm, using the conditions for development and exposure in the formation of a hole pattern. Thereafter, the hole diameter (CD) of each of the obtained patterns was measured using a line-width critical dimension scanning electron microscope SEM (S-9380, Hitachi, Ltd.), and a focus corresponding to the minimum value or the maximum value in a curve obtained by plotting the respective CDs was defined as the best focus. In a case where the focus was changed around the center of the best focus, a variation width of the focus tolerating a hole diameter of 44 nm±10% was calculated, which was defined as a depth of focus (DOF) (nm).

[Evaluation of Critical Dimension Uniformity (CDU)]

The above-mentioned dense hole pattern in each of Examples and Comparative Examples was observed using a critical dimension scanning electron microscope (SEM), (S-938011, manufactured by Hitachi, Ltd.), the diameters of 90 hole patterns were measured, and 3a was calculated from the standard deviation thereof for the measurement. A smaller value thereof indicates better performance.

TABLE 1

| | Resin | | Acid generator | | Basic compound | | Solvent | | | | | |
|---|---|---|---|---|---|---|---|---|---|---|---|---|
| | | (parts by mass) | | (parts by mass) | | (parts by mass) | | (parts by mass) | | (parts by mass) | | (parts by mass) |
| Resist-1 | Resin (1) | 86.5 | PAG-1 | 12.0 | D-1 | 1.5 | SL-1 | 70 | SL-2 | 30 | | |
| Resist-2 | Resin (2) | 88.7 | PAG-2 | 10.0 | D-1 | 1.3 | SL-1 | 95 | SL-4 | 5 | | |
| Resist-3 | Resin (3) | 86.0 | PAG-3 | 9.5 | D-1 | 4.5 | SL-1 | 60 | SL-2 | 40 | | |
| Resist-4 | Resin (4) | 82.7 | PAG-4 | 15.5 | D-3 | 1.8 | SL-1 | 60 | SL-3 | 40 | | |
| Resist-5 | Resin (5) | 90.7 | PAG-5 | 8.5 | D-4 | 0.8 | SL-1 | 90 | SL-3 | 10 | | |
| Resist-6 | Resin (6) | 88.2 | PAG-6 | 10.5 | D-5 | 1.3 | SL-2 | 100 | | | | |
| Resist-7 | Resin (7) | 87.8 | PAG-1 | 11.0 | D-6 | 1.2 | SL-1 | 90 | SL-2 | 5 | SL-4 | 5 |
| Resist-8 | Resin (8) | 83.5 | PAG-1 | 10.5 | D-2 | 6.0 | SL-1 | 80 | SL-2 | 20 | | |
| Resist-9 | Resin (9) | 87.5 | PAG-1/PAG-5 | 4.0/5.0 | D-1 | 3.5 | SL-1 | 75 | SL-2 | 25 | | |
| Resist-10 | Resin (10) | 84.5 | PAG-3 | 14.5 | D-1 | 1.0 | SL-1 | 70 | SL2 | 20 | SL-4 | 10 |
| Resist-11 | Resin (11) | 88.1 | PAG-1 | 12.5 | D-5 | 1.4 | SL-1 | 100 | | | | |
| Resist-12 | Resin (1)/Resin (12) | 43.1/40.0 | PAG-3 | 16.0 | D-1 | 0.9 | SL-1 | 80 | SL-3 | 20 | | |
| Resist-13 | Resin (1) | 89.0 | PAG-1 | 10.0 | D-5 | 1.0 | SL-1 | 70 | SL-2 | 30 | | |

TABLE 2

| | Repeating unit | | | | Compositional ratio (molar ratio) | | | | Molecular weight (Mw) | Dispersity ratio (Mw/Mn) |
|---|---|---|---|---|---|---|---|---|---|---|
| Resin (1) | LM-1 | PM-1 | PM-9 | — | 40 | 50 | 10 | — | 9,500 | 1.62 |
| Resin (2) | LM-2 | PM-12 | PM-13 | — | 40 | 40 | 20 | — | 17,000 | 1.70 |
| Resin (3) | LM-3 | IM-2 | PM-2 | — | 45 | 5 | 50 | — | 11,000 | 1.63 |

TABLE 2-continued
|  | Repeating unit | | | | Compositional ratio (molar ratio) | | | | Molecular weight (Mw) | Dispersity ratio (Mw/Mn) |
|---|---|---|---|---|---|---|---|---|---|---|
| Resin (4) | LM-4 | PM-10 | — | — | 40 | 60 | — | — | 15,000 | 1.66 |
| Resin (5) | LM-5 | PM-3 | PM-4 | IM-1 | 40 | 40 | 10 | 10 | 10,500 | 1.62 |
| Resin (6) | LM-6 | PM-10 | IM-4 | — | 40 | 50 | 10 | — | 15,500 | 1.68 |
| Resin (7) | LM-7 | PM-15 | — | — | 40 | 60 | — | — | 11,000 | 1.65 |
| Resin (8) | LM-2 | PM-3 | PM-10 | — | 40 | 40 | 20 | — | 10,000 | 1.64 |
| Resin (9) | LM-2 | PM-12 | PM-15 | — | 40 | 50 | 10 | — | 9,000 | 1.60 |
| Resin (10) | LM-2 | PM-5 | PM-11 | — | 40 | 40 | 20 | — | 10,000 | 1.61 |
| Resin (11) | LM-2 | PM-6 | PM-7 | IM-3 | 40 | 40 | 10 | 10 | 8,500 | 1.60 |
| Resin (12) | LM-2 | PM-8 | PM-14 | — | 40 | 40 | 20 | — | 9,500 | 1.61 |
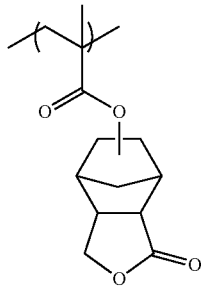
LM-1
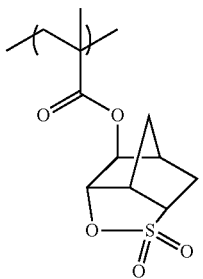
LM-5
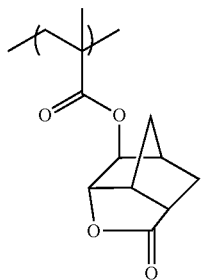
LM-2
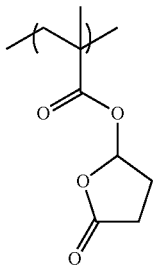
LM-6
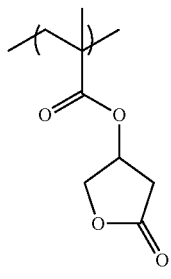
LM-3
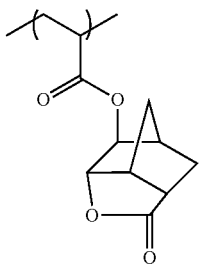
LM-7
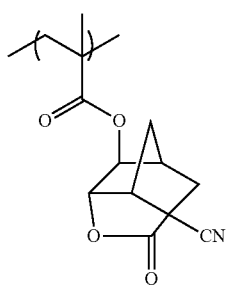
LM-4
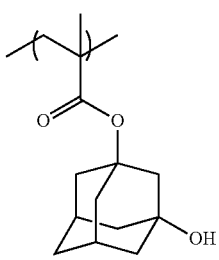
IM-1

IM-2 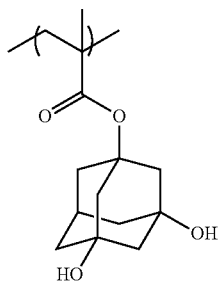
IM-3 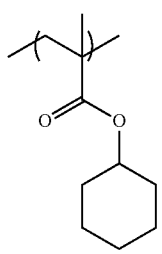
IM-4 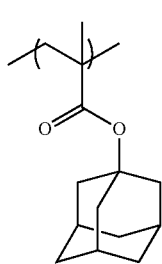
PM-1 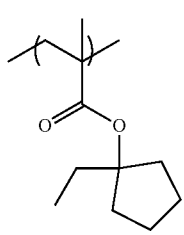
PM-2 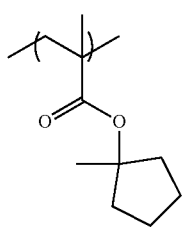
PM-3 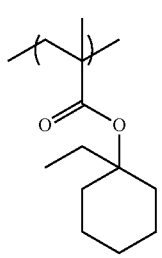
PM-4 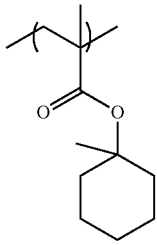
PM-5 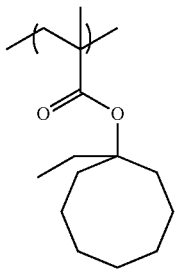
PM-6 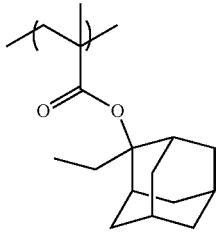
PM-7 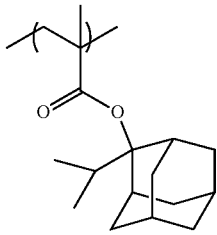
PM-8 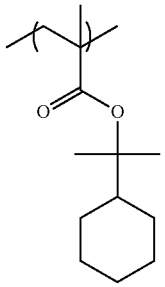
PM-9 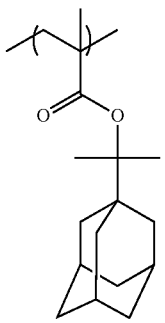

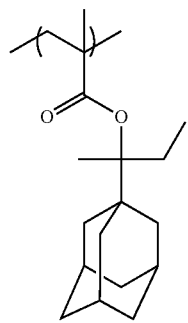
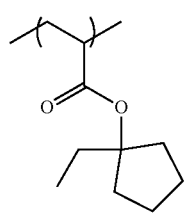
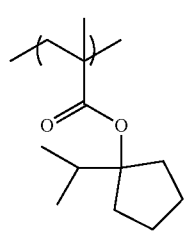
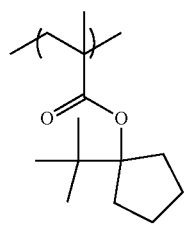
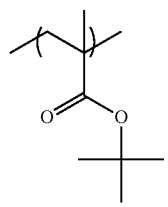
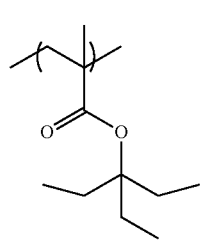
PM-10
PM-11
PM-12
PM-13
PM-14
PM-15
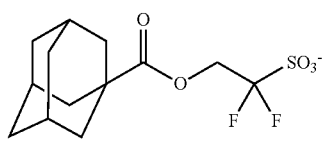
PAG-1
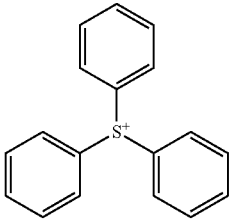
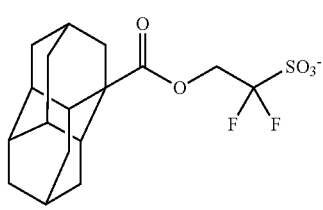
PAG-2
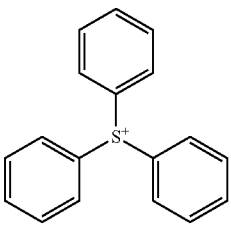
PAG-3
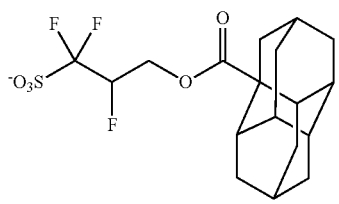
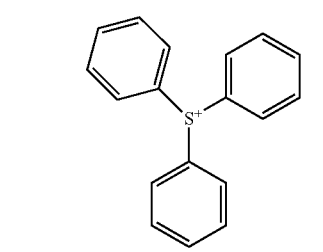
PAG-4

PAG-5
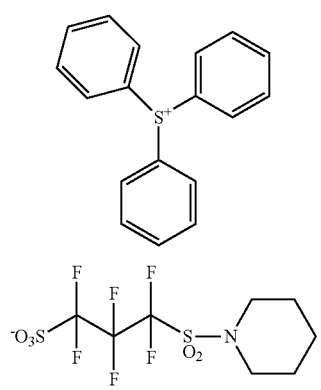
PAG-6
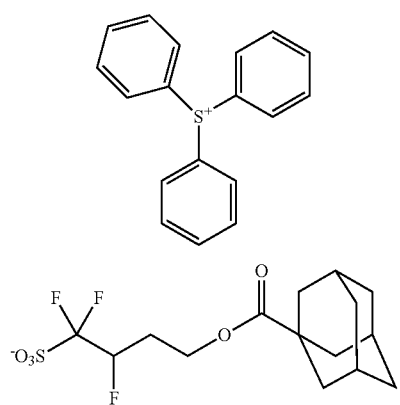
As the basic compounds in Table 1, D-1 to D-6 shown below were used.
D-1
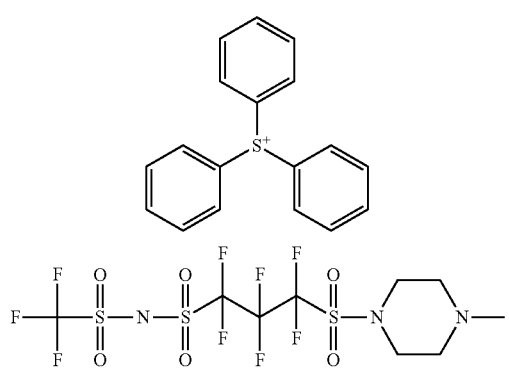
D-2
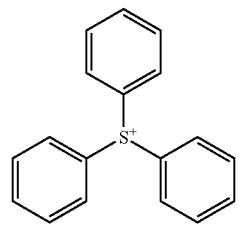
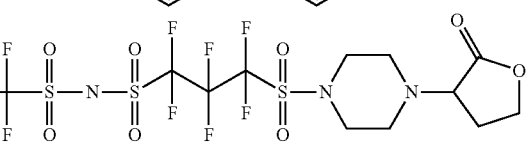
D-3
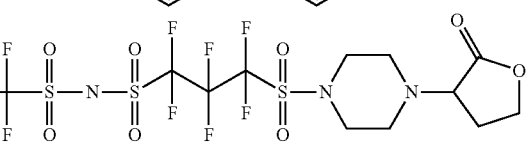
D-4
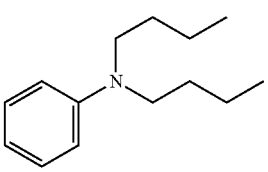
D-5
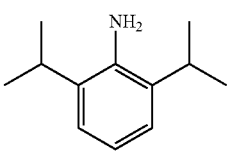
D-6
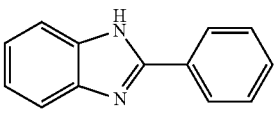
As the solvent in Table 1, SL-1 to SL-4 shown below were used.
SL-1: Propylene glycol monomethyl ether acetate (PGMEA)
SL-2: Cyclohexanone
SL-3: Propylene glycol monomethyl ether (PGME)
SL-4: γ-Butyrolactone

TABLE 3

| | XM-1 | XM-2 | XM-3 | XM-4 | XM-5 | XM-6 | XM-7 | XM-8 | XM-9 | XM-10 | XM-11 | XM-12 |
|---|---|---|---|---|---|---|---|---|---|---|---|---|
| Monomer ClogP | 4.70 | 2.56 | 4.97 | 4.68 | 5.21 | 4.29 | 3.80 | 4.98 | 3.14 | 1.94 | 1.40 | 2.20 |
| Resin (X) | Compositional ratio (% by mole) | | | | | | | | | | | |
| X-1 | 80 | 20 | | | | | | | | | | |
| X-2 | | | 90 | 10 | | | | | | | | |
| X-3 | | | | 30 | 70 | | | | | | | |
| X-4 | | | | | | 60 | 40 | | | | | |
| X-5 | | | | | | | | 100 | | | | |
| X-6 | 80 | | | | | | | | 20 | | | |
| X-7 | | | | | | | | 40 | 60 | | | |
| X-8 | 50 | | | | | | | | 30 | 20 | | |
| X-9 | | | 40 | 30 | | | | | 30 | | | |
| X-10 | | | | | | 90 | | | | | 10 | |
| X-11 | | | | | | | 65 | | | 30 | | 5 |
| X-12 | | | 40 | | | | | | 20 | | 40 | |
| X-13 | | | 40 | 29 | | | | | 29 | | 2 | |
| X-14 | | | 80 | | | | | | | | | |
| X-15 | | | 80 | | | | | | | | | |
| XC-1 | | 100 | | | | | | | | | | |
| XC-2 | | 50 | | | | | | | | | | |
| XC-3 | | 60 | | | | | | | | | 20 | |

TABLE 3-continued

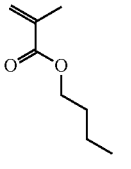

| | XM-13 | XM-14 | XM-15 |
|---|---|---|---|
| Monomer ClogP | 2.69 | 4.58 | 4.98 |

| Resin X | Compositional ratio (% by mole) | | | ClogP (Poly) | Mw | Mw/Mn |
|---|---|---|---|---|---|---|
| X-1 | | | | 4.3 | 8,000 | 1.62 |
| X-2 | | | | 4.9 | 16,000 | 1.71 |
| X-3 | | | | 5.1 | 10,000 | 1.68 |
| X-4 | | | | 4.1 | 9,500 | 1.65 |
| X-5 | | | | 5.0 | 12,000 | 1.68 |
| X-6 | | | | 4.4 | 14,500 | 1.63 |
| X-7 | | | | 3.9 | 9,000 | 1.75 |
| X-8 | | | | 3.7 | 10,000 | 1.73 |
| X-9 | | | | 4.3 | 8,000 | 1.69 |
| X-10 | | | | 4.0 | 14,500 | 1.63 |
| X-11 | | | | 3.2 | 27,000 | 2.05 |
| X-12 | | | | 3.2 | 9,600 | 1.68 |
| X-13 | | | | 4.3 | 8,000 | 1.70 |
| X-14 | | 20 | | 4.9 | 9,000 | 1.69 |
| X-15 | | | 20 | 5.0 | 8,500 | 1.63 |
| XC-1 | | | | 2.6 | 8,600 | 1.61 |
| XC-2 | 50 | | | 2.6 | 8,800 | 1.60 |
| XC-3 | 20 | | | 2.4 | 9,500 | 1.67 |

TABLE 4

| Composition for forming upper layer film | Resin (X) | % by mass in composition | Compounds (A1) to (A4) (content/% by mass in solid contents) | | Solvent (% by mass) |
|---|---|---|---|---|---|
| T-1 | X-1 | 3.0% | A-1-1 | 2.0% | 4-Methyl-2-pentanol |
| T-2 | X-2 | 2.0% | A-1-1 | 2.0% | Isobutyl isobutyrate |
| T-3 | X-3 | 2.3% | A-1-1 | 2.0% | 3-Octanol |
| T-4 | X-4 | 1.0% | A-1-1 | 2.0% | Isoamyl ether |
| T-5 | X-5 | 2.0% | A-1-1 | 2.0% | 3-Methyl-1-butanol |
| T-6 | X-6 | 1.7% | A-1-1 | 2.0% | 4-Octanol |
| T-7 | X-7 | 2.3% | A-1-1 | 2.0% | Isoamyl ether |
| T-8 | X-8 | 1.7% | A-1-1 | 2.0% | 4-Methyl-2-pentanol |
| T-9 | X-9 | 3.3% | A-4-1 | 2.0% | Isoamyl ether |
| T-10 | X-10 | 3.0% | A-4-2 | 2.0% | 3-Methyl-1-butanol |
| T-11 | X-11 | 2.0% | A-4-3 | 2.0% | 4-Methyl-2-pentanol |
| T-12 | X-12 | 2.3% | A-1-1 | 2.0% | Isoamyl ether/4-methyl-2-pentanol (80%/20%) |
| T-13 | X-13 | 2.3% | A-1-1 | 2.0% | 4-Methyl-2-pentanol |
| T-14 | X-14 | 1.0% | A-1-1 | 2.0% | Isoamyl ether |
| T-15 | X-15 | 2.0% | A-1-1 | 2.0% | Isoamyl ether |
| T-18 | XC-1 | 1.7% | — | — | Isoamyl ether |
| T-19 | XC-2 | 2.3% | — | — | 4-Methyl-2-pentanol |
| T-20 | XC-3 | 1.7% | — | — | 4-Methyl-2-pentanol |
| T-21 | X-3 | 3.3% | — | — | 4-Methyl-2-pentanol |
| T-22 | X-3 | 3.0% | A-1-1 | 2.0% | 4-Methyl-2-pentanol |
| T-23 | X-1/X-3 | 2.0%/1.0% | A-1-2 | 2.0% | 4-Methyl-2-pentanol |
| T-24 | X-3 | 2.3% | A-1-3 | 2.0% | 4-Methyl-2-pentanol |
| T-25 | X-3 | 1.0% | A-1-4 | 1.0% | 4-Methyl-2-pentanol |
| T-26 | X-3 | 2.0% | A-1-5 | 1.5% | 4-Methyl-2-pentanol |
| T-27 | X-3 | 1.7% | A-2-1 | 2.0% | 4-Methyl-2-pentanol |
| T-28 | X-3 | 2.3% | A-2-2 | 1.0% | 4-Methyl-2-pentanol |
| T-29 | X-3 | 1.7% | A-2-3 | 1.5% | 4-Methyl-2-pentanol |
| T-30 | X-3 | 3.0% | A-2-4/A-4-1 | 2.0%/2.0% | 4-Methyl-2-pentanol/decane (90%/10%) |
| T-31 | X-3 | 3.0% | A-2-4 | 2.5% | 4-Methyl-2-pentanol |
| T-32 | X-3 | 3.0% | A-2-4 | 3.0% | 4-Methyl-2-pentanol |
| T-33 | X-3 | 3.0% | A-2-4 | 6.0% | 4-Methyl-2-pentanol |
| T-34 | X-3 | 3.0% | A-2-4/A-1-6 | 12.0%/0.5% | 4-Methyl-2-pentanol |

TABLE 4-continued

| Composition for forming upper layer film | Resin (X) | % by mass in composition | Compounds (A1) to (A4) (content/% by mass in solid contents) | | Solvent (% by mass) |
|---|---|---|---|---|---|
| T-35 | X-3 | 3.0% | A-2-4 | 18.0% | 4-Methyl-2-pentanol |
| T-36 | X-3 | 3.0% | A-2-4 | 22.0% | 4-Methyl-2-pentanol |
| T-37 | X-3 | 3.0% | A-2-5 | 2.0% | 4-Methyl-2-pentanol |
| T-38 | X-3 | 3.0% | A-2-6 | 1.0% | 4-Methyl-2-pentanol |
| T-39 | X-3 | 3.0% | A-2-7 | 1.5% | 4-Methyl-2-pentanol |
| T-40 | X-3 | 3.0% | A-2-8 | 2.0% | 4-Methyl-2-pentanol |
| T-41 | X-3 | 3.0% | A-3-1 | 2.5% | 4-Methyl-2-pentanol |
| T-42 | X-3 | 3.0% | A-3-2 | 2.0% | 4-Methyl-2-pentanol |
| T-43 | X-3 | 3.0% | A-3-3 | 2.5% | 4-Methyl-2-pentanol |

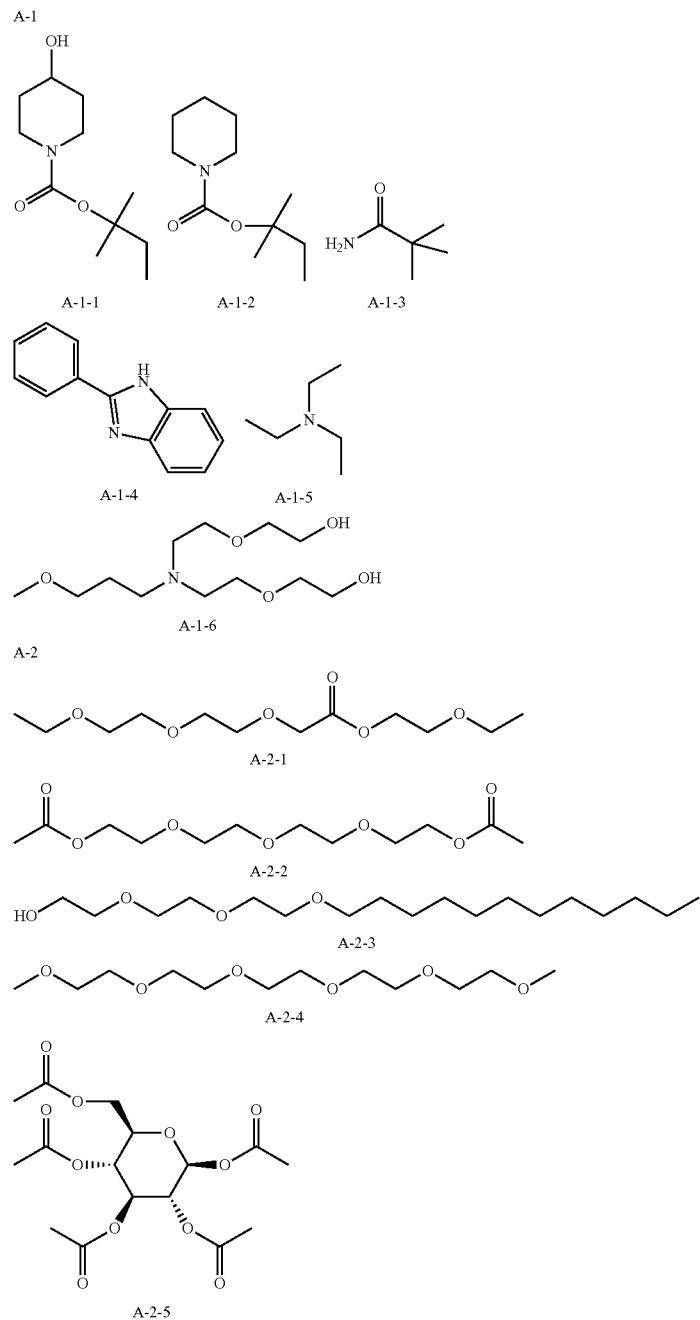

TABLE 4-continued

| Composition for forming upper layer film | Resin (X) | | Compounds (A1) to (A4) | |
|---|---|---|---|---|
| | Resin (X) | % by mass in composition (content/% by mass in solid contents) | | Solvent (% by mass) |

A-2-6: 18-crown-6 ether

A-2-7: HS-CH2CH2-C(=O)-O-CH2CH2-O-CH2CH2-O-CH2CH2-O-CH2CH2-O-CH2-C(=O)-CH2CH2-SH

A-2-8: CH3-S-(CH2)8-S-(CH2)8-S-CH3

A-3

A-3-1: triphenylsulfonium benzoate

A-3-2: triphenylsulfonium hexanesulfonate

A-3-3: bis(4-tert-butylphenyl)iodonium salicylate

A-4

A-4-1: 4-carboxy-2,2,6,6-tetramethylpiperidine-1-oxyl

A-4-2: 4-acetamido-2,2,6,6-tetramethylpiperidine-1-oxyl

TABLE 4-continued
| Composition for forming upper layer film | Resin (X) | | Compounds (A1) to (A4) |
|---|---|---|---|
| | Resin (X) | % by mass in composition (content/% by mass in solid contents) | Solvent (% by mass) |
A-4-3
X-1
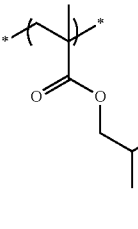
X-2
X-3
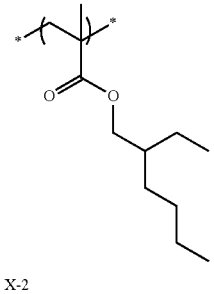
X-4

TABLE 4-continued

| Composition for forming upper layer film | Resin (X) | | Compounds (A1) to (A4) | |
|---|---|---|---|---|
| | Resin (X) | % by mass in composition (content/% by mass in solid contents) | | Solvent (% by mass) |

X-5

X-6

X-7

X-8

X-9

TABLE 4-continued
| Composition for forming upper layer film | Resin (X) | | Compounds (A1) to (A4) | |
|---|---|---|---|---|
| | Resin (X) | % by mass in composition (content/% by mass in solid contents) | Solvent (% by mass) | |
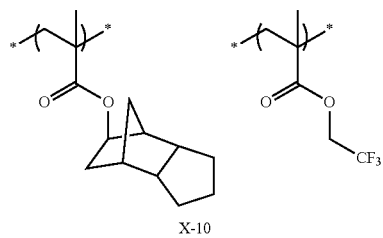
X-10
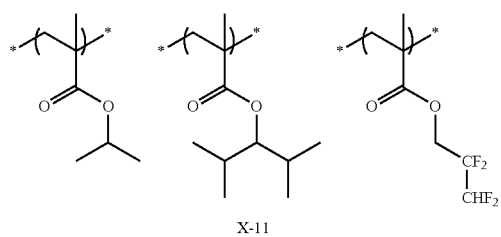
X-11
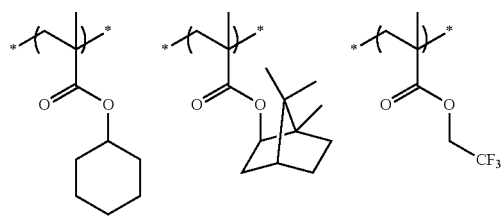
X-12
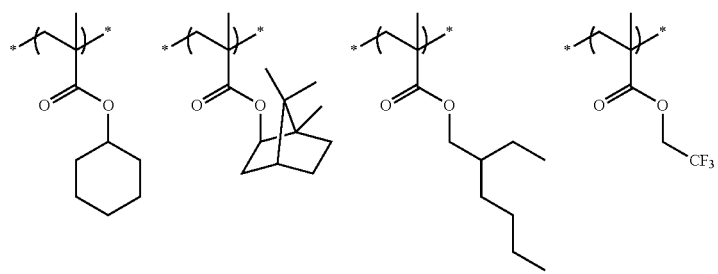
X-13
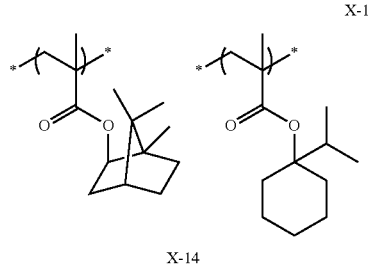
X-14
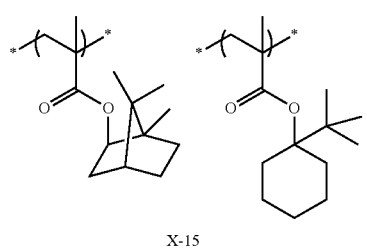
X-15

TABLE 4-continued

Composition for forming upper layer film | Resin (X) | Compounds (A1) to (A4)
Resin (X) % by mass in composition (content/% by mass in solid contents)   Solvent (% by mass)

XC-1

XC-2

XC-3

TABLE 5

| | Resist composition | Resist thin film | Pre-wetting solvent (mass ratio) | Composition for forming upper layer film | Film thickness of upper layer film (nm) | Peeling solvent before development | Type of developer (mass ratio) | Type of rinsing liquid (mass ratio) | EL (%) | DOF (nm) | CDU (nm) |
|---|---|---|---|---|---|---|---|---|---|---|---|
| Example 1 | Resist-1 | 90 nm | — | T-1 | 90 | — | SA-1 | SB-1 | 20.2 | 120 | 4.4 |
| Example 2 | Resist-2 | 90 nm | — | T-2 | 60 | — | SA-1 | SB-1 | 20.6 | 120 | 4.4 |
| Example 3 | Resist-3 | 90 nm | — | T-3 | 70 | — | SA-1 | SB-1 | 20.8 | 120 | 4.4 |
| Example 4 | Resist-4 | 90 nm | — | T-4 | 30 | — | SA-1 | SB-1 | 20.5 | 120 | 4.3 |
| Example 5 | Resist-5 | 85 nm | 3-Methyl-1-butanol | T-5 | 60 | — | SA-1 | SB-1 | 20.7 | 120 | 4.4 |
| Example 6 | Resist-6 | 90 nm | 4-Octanol | T-6 | 50 | — | SA-1 | SB-1 | 20.9 | 120 | 4.3 |
| Example 7 | Resist-7 | 70 nm | — | T-7 | 70 | — | SA-1 | SB-1 | 18.5 | 100 | 4.4 |
| Example 8 | Resist-8 | 90 nm | — | T-8 | 50 | — | SA-1 | SB-1 | 17.5 | 100 | 4.4 |
| Example 9 | Resist-9 | 90 nm | — | T-9 | 100 | — | SA-1 | SB-1 | 20.6 | 120 | 4.3 |
| Example 10 | Resist-10 | 90 nm | — | T-10 | 90 | — | SA-1 | SB-1 | 19.5 | 110 | 4.3 |
| Example 11 | Resist-11 | 85 nm | — | T-11 | 60 | — | SA-1 | SB-1 | 17.2 | 80 | 4.4 |
| Example 12 | Resist-12 | 90 nm | — | T-12 | 70 | — | SA-1 | SB-4 | 16.8 | 80 | 4.3 |
| Example 13 | Resist-13 | 90 nm | — | T-13 | 70 | — | SA-1 | SB-1 | 20.6 | 120 | 4.2 |
| Comparative Example 1 | Resist-11 | 90 nm | — | T-18 | 30 | — | SA-1 | SB-1 | 15.3 | 60 | 4.5 |
| Comparative Example 2 | Resist-5 | 90 nm | — | T-19 | 60 | — | SA-1 | SB-1 | 14.6 | 60 | 4.6 |
| Comparative Example 3 | Resist-5 | 90 nm | — | T-20 | 50 | — | SA-1 | SB-1 | 15.2 | 60 | 4.6 |
| Comparative Example 4 | Resist-5 | 85 nm | — | T-21 | 70 | — | SA-1 | SB-1 | 15.8 | 60 | 4.5 |
| Example 14 | Resist-5 | 70 nm | — | T-22 | 50 | — | SA-1 | SB-1 | 20.8 | 120 | 4.3 |
| Example 15 | Resist-5 | 85 nm | — | T-23 | 100 | — | SA-1 | SB-2 | 20.5 | 120 | 4.4 |
| Example 16 | Resist-5 | 100 nm | 4-Methyl-2-pentanol/4-Octanol (70/30) | T-24 | 90 | — | SA-1/SA-3 (80/20) | — | 20.7 | 120 | 4.4 |
| Example 17 | Resist-5 | 90 nm | Isoamyl ether | T-25 | 60 | — | SA-2 | SB-1 | 20.9 | 120 | 4.3 |
| Example 18 | Resist-5 | 90 nm | — | T-26 | 70 | — | SA-1 | SB-1 | 20.2 | 120 | 4.4 |
| Example 19 | Resist-5 | 90 nm | — | T-27 | 30 | — | SA-1 | SB-1 | 20.6 | 120 | 4.1 |

TABLE 5-continued

| | Resist composition | Resist thin film | Pre-wetting solvent (mass ratio) | Composition for forming upper layer film | Film thickness of upper layer film (nm) | Peeling solvent before development | Type of developer (mass ratio) | Type of rinsing liquid (mass ratio) | EL (%) | DOF (nm) | CDU (nm) |
|---|---|---|---|---|---|---|---|---|---|---|---|
| Example 20 | Resist-5 | 90 nm | — | T-28 | 60 | — | SA-2 | SB-1 | 20.8 | 120 | 4.0 |
| Example 21 | Resist-5 | 90 nm | — | T-29 | 50 | — | SA-1 | SB-1 | 20.5 | 120 | 4.1 |
| Example 22 | Resist-5 | 90 nm | — | T-30 | 70 | — | SA-1 | SB-1 | 20.7 | 120 | 4.1 |
| Example 23 | Resist-5 | 90 nm | 4-Methyl-2-pentanol | T-31 | 50 | — | SA-1 | SB-2 | 20.9 | 120 | 4.1 |
| Example 24 | Resist-5 | 90 nm | — | T-32 | 90 | — | SA-1 | SB-1 | 20.7 | 120 | 4.0 |
| Example 25 | Resist-5 | 90 nm | 4-Methyl-2-pentanol/isoamyl ether (50/50) | T-33 | 90 | — | SA-3 | SB-4/SB-5/SB-6 (95/1.5/3.5) | 20.9 | 120 | 4.1 |
| Example 26 | Resist-5 | 90 nm | — | T-34 | 90 | — | SA-1 | SB-1 | 20.2 | 120 | 4.0 |
| Example 27 | Resist-5 | 90 nm | — | T-35 | 90 | — | SA-1 | SB-1 | 20.6 | 120 | 4.1 |
| Example 28 | Resist-5 | 90 nm | — | T-36 | 90 | — | SA-1 | SB-1 | 20.8 | 120 | 4.1 |
| Example 29 | Resist-5 | 90 nm | — | T-37 | 90 | — | SA-1 | SB-1 | 20.7 | 120 | 4.1 |
| Example 30 | Resist-5 | 85 nm | — | T-38 | 90 | — | SA-1 | SB-1 | 20.9 | 120 | 4.0 |
| Example 31 | Resist-5 | 90 nm | — | T-39 | 90 | — | SA-1 | SB-1 | 20.2 | 120 | 4.1 |
| Example 32 | Resist-5 | 90 nm | — | T-40 | 90 | — | SA-1 | SB-1 | 20.6 | 120 | 4.0 |
| Example 33 | Resist-5 | 90 nm | — | T-41 | 90 | — | SA-1 | SB-1 | 20.8 | 120 | 4.3 |
| Example 34 | Resist-5 | 90 nm | — | T-42 | 90 | — | SA-1 | SB-2 | 20.2 | 120 | 4.4 |
| Example 35 | Resist-5 | 85 nm | — | T-43 | 90 | — | SA-1 | SB-1 | 20.2 | 120 | 4.4 |
| Example 36 | Resist-5 | 85 nm | 4-Octanol/isoamyl ether (50/50) | T-34 | 90 | — | SA-1 | SB-2/SB-4 (50/50) | 21.1 | 120 | 4.0 |
| Example 37 | Resist-5 | 85 nm | 4-Methyl-2-pentanol | T-34 | 90 | — | SA-1 | SB-1 | 21.9 | 120 | 4.0 |
| Example 38 | Resist-5 | 85 nm | — | T-34 | 90 | — | SA-1 | SB-1 | 22.5 | 120 | 4.0 |
| Example 39 | Resist-5 | 85 nm | — | T-34 | 90 | — | SA-1 | SB-1 | 21.6 | 120 | 4.0 |
| Example 40 | Resist-5 | 85 nm | — | T-34 | 90 | — | SA-1 | SB-1 | 21.1 | 120 | 4.0 |
| Example 41 | Resist-5 | 85 nm | — | T-34 | 90 | — | SA-1 | SB-1 | 20.1 | 120 | 4.0 |
| Example 42 | Resist-5 | 90 nm | — | T-31 | 50 | Isoamyl ether | SA-1 | SB-3 | 20.7 | 120 | 4.0 |
| Example 43 | Resist-5 | 90 nm | 4-Methyl-2-pentanol | T-32 | 90 | 4-Methyl-2-pentanol | SA-1 | SB-3 | 20.9 | 120 | 4.1 |

SA-1: Butyl acetate
SA-2: 2-Heptanone
SA-3: Butyl propionate
SA-4: Aqueous tetramethylammonium hydroxide solution (2.38%-by-mass aqueous solution)
SB-1: 4-Methyl-2-heptanol
SB-2: n-Decane
SB-3: Water
SB-4: Butyl acetate
SB-5: Propylene glycol monomethyl ether acetate (PGMEA)
SB-6: Propylene glycol monomethyl ether (PGME)

As apparent from the results shown in Table 5, the patterns formed by the pattern forming method of the present invention (Examples 1 to 43) were excellent in CDU uniformity, and also excellent in both DOF and EL.

According to the present invention, it is possible to provide a pattern forming method excellent in all performance of CDU uniformity, DOF, and EL, particularly in the formation of an ultrafine pattern (for example, a pattern with a hole diameter of 50 nm or less), a resist pattern formed by the pattern forming method, a method for manufacturing an electronic device, including the pattern forming method, an electronic device manufactured by the method for manufacturing an electronic device, and a composition for forming an upper layer film, which can be used for the pattern forming method.

While the present invention has been described in detail and with reference to specific embodiments thereof, it will be apparent to one skilled in the art that various changes and modifications can be made therein without departing from the spirit and scope of the invention.

The present application is based on Japanese Patent Application (Patent Application No. 2015-110362) filed on May 29, 2015, the contents of which are incorporated herein by reference.

What is claimed is:

1. A pattern forming method comprising:
   (a) a step of forming a resist film on a substrate;
   (b) a step of applying a composition for forming an upper layer film onto the resist film to form an upper layer film;
   (c) a step of exposing the resist film; and
   (d) a step of developing the exposed resist film with a developer including an organic solvent,
   wherein the composition for forming an upper layer film contains a resin having a C log P(Poly) of 4.0 or more and at least one compound selected from the group consisting of (A1), (A2), (A3), and (A4),
   wherein (A1) is a basic compound or a base generator,
   (A2) is a compound selected from the group consisting of a compound containing an ether bond, a compound containing a thioether bond, a compound containing a hydroxyl group, a compound containing a thiol group, a compound containing a carbonyl bond, and a compound containing an ester bond,
   (A3) is an ionic compound, and
   (A4) is a compound having a radical trapping group.

2. The pattern forming method according to claim 1, wherein the step (b) includes heating the composition for forming an upper layer film applied onto the resist film at 100° C. or higher.

3. The pattern forming method according to claim 1, wherein the resin having a C log P(Poly) of 4.0 or more contains a repeating unit obtained by the polymerization of monomers represented by General Formula (2),

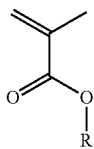

General Formula (2)

in General Formula (2), R represents an alkyl group having 5 to 20 carbon atoms, a cycloalkyl group having 5 to 20 carbon atoms, or an aryl group.

4. The pattern forming method according to claim 1, wherein the resin having a C log P(Poly) of 4.0 or more contains at least one repeating unit having 4 methyl groups.

5. The pattern forming method according to claim 1, wherein the molecular weight of at least one compound selected from the group consisting of (A1), (A2), (A3), and (A4) above is 100 to 3,000.

6. A resist pattern formed by the pattern forming method according to claim 1.

7. A method for manufacturing an electronic device, comprising the pattern forming method according to claim 1.

8. A composition for forming an upper layer film, wherein the composition for forming an upper layer film contains a resin having a C log P(Poly) of 4.0 or more and at least one compound selected from the group consisting of (A1), (A2), (A3), and (A4), wherein (A1) is a basic compound or a base generator, (A2) is a compound selected from the group consisting of a compound containing an ether bond, a compound containing a thioether bond, a compound containing a hydroxyl group, a compound containing a thiol group, a compound containing a carbonyl bond, and a compound containing an ester bond, (A3) is an ionic compound, and (A4) is a compound having a radical trapping group.

9. A pattern forming method comprising:
(a) a step of forming a resist film on a substrate;
(b) a step of applying a composition for forming an upper layer film onto the resist film to form an upper layer film;
(c) a step of exposing the resist film; and
(d) a step of developing the exposed resist film with a developer including an organic solvent,
wherein the composition for forming an upper layer film contains a resin having a C log P(Poly) of 3.0 or more and at least one compound selected from the group consisting of (A2), (A3), and (A4), wherein (A2) is a compound selected from the group consisting of a compound represented by formula (A-2-1), a compound represented by formula (A-2-2), a compound represented by formula (A-2-3), a compound represented by formula (A-2-4), a compound represented by formula (A-2-5), a compound represented by formula (A-2-6), a compound represented by formula (A-2-7), and a compound represented by formula (A-2-8),

A-2

A-2-1

A-2-2

A-2-3

A-2-4
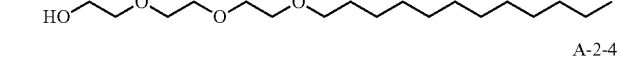

A-2-5

A-2-6
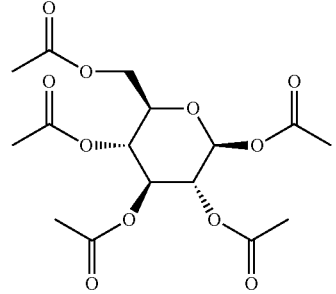

A-2-7
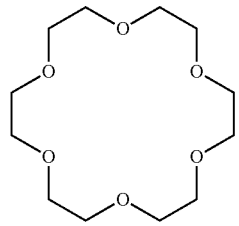

A-2-8

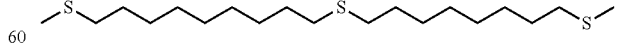

(A3) is an ionic compound selected from the group consisting of a compound represented by formula (A-3-1), a compound represented by formula (A-3-2), and a compound represented by formula (A-3-3), and

A-3

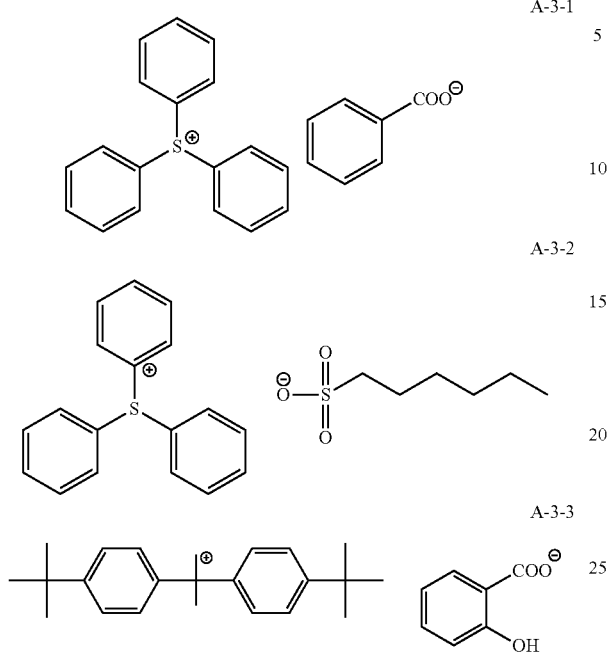

(A4) is a compound having a radical trapping group.

10. A pattern forming method comprising:
(a) a step of forming a resist film on a substrate;
(b) a step of applying a composition for forming an upper layer film onto the resist film to form an upper layer film;
(c) a step of exposing the resist film; and
(d) a step of developing the exposed resist film with a developer including an organic solvent,
wherein the composition for forming an upper layer film contains a resin having a ClogP(Poly) of 3.0 or more, at least one compound represented by (A4), and optionally at least one compound selected from the group consisting of (A1), (A2), and (A3),
wherein (A1) is a basic compound or a base generator,
(A2) is a compound selected from the group consisting of a compound containing an ether bond, a compound containing a thioether bond, a compound containing a hydroxyl group, a compound containing a thiol group, a compound containing a carbonyl bond, and a compound containing an ester bond,
(A3) is an ionic compound, and
(A4) is a compound having a radical trapping group.

11. A composition for forming an upper layer film,
wherein the composition for forming an upper layer film contains a resin having a C log P(Poly) of 3.0 or more and at least one compound selected from the group consisting of (A2), (A3), and (A4),
wherein (A2) is a compound selected from the group consisting of a compound represented by formula (A-2-1), a compound represented by formula (A-2-2), a compound represented by formula (A-2-3), a compound represented by formula (A-2-4), a compound represented by formula (A-2-5), a compound represented by formula (A-2-6), a compound represented by formula (A-2-7), and a compound represented by formula (A-2-8),

A-2

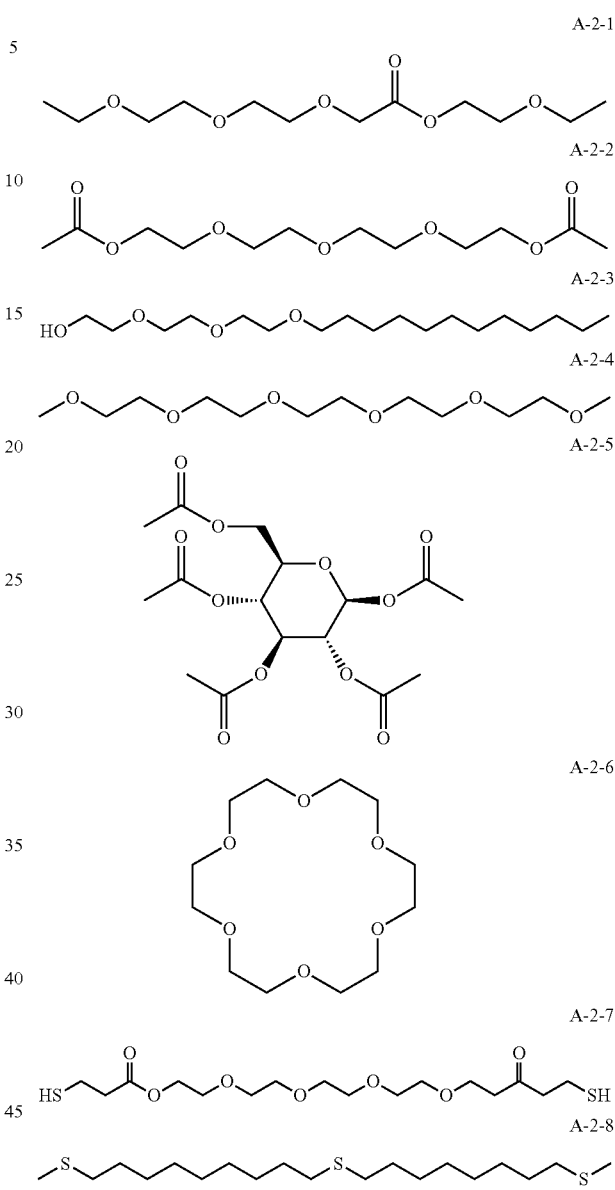

(A3) is an ionic compound selected from the group consisting of a compound represented by formula (A-3-1), a compound represented by formula (A-3-2), and a compound represented by formula (A-3-3), and

A-3

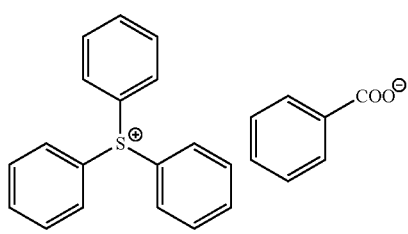

-continued

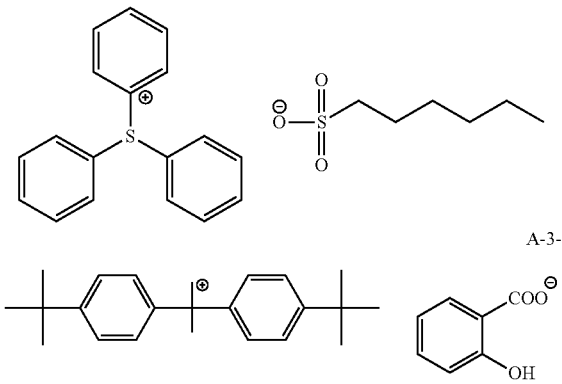

A-3-2

A-3-3

(A4) is a compound having a radical trapping group.

12. A composition for forming an upper layer film,
wherein the composition for forming an upper layer film contains a resin having a C log P(Poly) of 3.0 or more, at least one compound represented by (A4), and optionally at least one compound selected from the group consisting of (A1), (A2), and (A3), wherein (A1) is a basic compound or a base generator, (A2) is a compound selected from the group consisting of a compound containing an ether bond, a compound containing a thioether bond, a compound containing a hydroxyl group, a compound containing a thiol group, a compound containing a carbonyl bond, and a compound containing an ester bond, (A3) is an ionic compound, and (A4) is a compound having a radical trapping group.

* * * * *